US010505520B2

(12) United States Patent
Kato et al.

(10) Patent No.: US 10,505,520 B2
(45) Date of Patent: *Dec. 10, 2019

(54) NONVOLATILE LATCH CIRCUIT AND LOGIC CIRCUIT, AND SEMICONDUCTOR DEVICE USING THE SAME

(71) Applicant: Semiconductor Energy Laboratory Co., Ltd., Atsugi-shi, Kanagawa-ken (JP)

(72) Inventors: Kiyoshi Kato, Kanagawa (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/098,391

(22) Filed: Apr. 14, 2016

(65) Prior Publication Data

US 2016/0226471 A1    Aug. 4, 2016

Related U.S. Application Data

(63) Continuation of application No. 14/510,310, filed on Oct. 9, 2014, now Pat. No. 9,350,334, which is a
(Continued)

(30) Foreign Application Priority Data

Nov. 20, 2009  (JP) ................................ 2009-265738

(51) Int. Cl.
*H03K 3/289* (2006.01)
*H03K 3/356* (2006.01)
(Continued)

(52) U.S. Cl.
CPC ......... *H03K 3/356104* (2013.01); *G11C 7/04* (2013.01); *G11C 14/0063* (2013.01);
(Continued)

(58) Field of Classification Search
None
See application file for complete search history.

(56) References Cited

U.S. PATENT DOCUMENTS

| 4,510,584 A | 4/1985 | Dias et al. |
| 4,656,607 A | 4/1987 | Hagiwara et al. |
(Continued)

FOREIGN PATENT DOCUMENTS

| CN | 001158496 A | 9/1997 |
| CN | 001351349 A | 5/2002 |
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Long Nguyen
(74) *Attorney, Agent, or Firm* — Fish & Richardson P.C.

(57) ABSTRACT

To provide a novel nonvolatile latch circuit and a semiconductor device using the nonvolatile latch circuit, a nonvolatile latch circuit includes a latch portion having a loop structure where an output of a first element is electrically connected to an input of a second element, and an output of the second element is electrically connected to an input of the first element; and a data holding portion for holding data of the latch portion. In the data holding portion, a transistor using an oxide semiconductor as a semiconductor material for forming a channel formation region is used as a switch-
(Continued)

ing element. In addition, an inverter electrically connected to a source electrode or a drain electrode of the transistor is included. With the transistor, data held in the latch portion can be written into a gate capacitor of the inverter or a capacitor which is separately provided.

20 Claims, 25 Drawing Sheets

Related U.S. Application Data continuation of application No. 13/854,176, filed on Apr. 1, 2013, now Pat. No. 8,860,485, which is a continuation of application No. 12/946,122, filed on Nov. 15, 2010, now Pat. No. 8,410,838.

(51) Int. Cl.
| | | |
|---|---|---|
| G11C 7/04 | (2006.01) | |
| G11C 14/00 | (2006.01) | |
| H01L 27/105 | (2006.01) | |
| H01L 27/12 | (2006.01) | |
| H03K 3/037 | (2006.01) | |
| H03K 3/286 | (2006.01) | |
| G11C 16/04 | (2006.01) | |
| H01L 21/02 | (2006.01) | |
| H01L 21/28 | (2006.01) | |
| H01L 29/66 | (2006.01) | |

(52) U.S. Cl.
CPC ........ *H01L 27/105* (2013.01); *H01L 27/1203* (2013.01); *H01L 27/1225* (2013.01); *H03K 3/0375* (2013.01); *H03K 3/286* (2013.01); *H03K 3/356* (2013.01); *H03K 3/356121* (2013.01); *H03K 3/356173* (2013.01); *G11C 16/045* (2013.01); *G11C 2211/4016* (2013.01); *H01L 21/02554* (2013.01); *H01L 21/02565* (2013.01); *H01L 21/02631* (2013.01); *H01L 21/28202* (2013.01); *H01L 21/28211* (2013.01); *H01L 29/6659* (2013.01)

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,022,764 | A | 2/2000 | Park et al. |
| 6,127,702 | A | 10/2000 | Yamazaki et al. |
| 6,294,274 | B1 | 9/2001 | Kawazoe et al. |
| 6,492,854 | B1 | 12/2002 | Ku |
| 6,563,174 | B2 | 5/2003 | Kawasaki et al. |
| 6,570,801 | B2 | 5/2003 | Yoshida et al. |
| 6,576,943 | B1 | 6/2003 | Ishitt et al. |
| 6,654,273 | B2 | 11/2003 | Miwa et al. |
| 6,727,522 | B1 | 4/2004 | Kawasaki et al. |
| 6,809,952 | B2 | 10/2004 | Masui |
| 6,845,032 | B2 | 1/2005 | Toyoda et al. |
| 6,876,023 | B2 | 4/2005 | Ishitt et al. |
| 6,944,045 | B2 | 9/2005 | Fujimori |
| 6,972,986 | B2 | 12/2005 | Peng et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,064,973 | B2 | 6/2006 | Peng et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,427,776 | B2 | 9/2008 | Hoffman et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,521,715 | B2 | 4/2009 | Jang et al. |
| 7,598,520 | B2 | 10/2009 | Hirao et al. |
| 7,612,594 | B2 | 11/2009 | Fukuoka |
| 7,616,040 | B2 | 11/2009 | Motomura |
| 7,674,650 | B2 | 3/2010 | Akimoto et al. |
| 7,732,819 | B2 | 6/2010 | Akimoto et al. |
| 7,791,074 | B2 | 9/2010 | Iwasaki |
| 7,816,716 | B2 | 10/2010 | Tanabe |
| 7,816,721 | B2 | 10/2010 | Yamazaki et al. |
| 7,847,287 | B2 | 12/2010 | Kim et al. |
| 7,863,607 | B2 | 1/2011 | Lee et al. |
| 7,863,611 | B2 | 1/2011 | Abe et al. |
| 7,935,582 | B2 | 5/2011 | Iwasaki |
| 7,940,085 | B2 | 5/2011 | Kim et al. |
| 7,956,361 | B2 | 6/2011 | Iwasaki |
| 7,977,169 | B2 | 7/2011 | Hirao et al. |
| 7,993,964 | B2 | 8/2011 | Hirao et al. |
| 8,085,076 | B2 * | 12/2011 | Djaja .............. H03K 3/012 327/199 |
| 8,153,031 | B2 | 4/2012 | Yano et al. |
| 8,154,024 | B2 | 4/2012 | Iwasaki |
| 8,158,987 | B2 | 4/2012 | Nabekura et al. |
| 8,202,365 | B2 | 6/2012 | Umeda et al. |
| 8,212,238 | B2 | 7/2012 | Kato et al. |
| 8,212,248 | B2 | 7/2012 | Itagaki et al. |
| 8,217,680 | B2 | 7/2012 | Kim et al. |
| 8,295,079 | B2 | 10/2012 | Yamamoto et al. |
| 8,304,298 | B2 | 11/2012 | Ofuji et al. |
| 8,324,628 | B2 | 12/2012 | Kim et al. |
| 8,354,674 | B2 | 1/2013 | Kimura |
| 8,410,838 | B2 * | 4/2013 | Kato ................ G11C 7/04 327/199 |
| 8,669,551 | B2 | 3/2014 | Kim et al. |
| 8,723,240 | B2 | 5/2014 | Tanabe |
| 8,784,700 | B2 | 7/2014 | Inoue et al. |
| 8,860,485 | B2 * | 10/2014 | Kato ................ G11C 7/04 327/199 |
| 8,877,521 | B2 | 11/2014 | Tanabe |
| 8,994,086 | B2 | 3/2015 | Yamazaki et al. |
| 9,053,985 | B2 | 6/2015 | Tanaka et al. |
| 9,350,334 | B2 * | 5/2016 | Kato ................ G11C 7/04 |
| 9,362,339 | B2 | 6/2016 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0071039 | A1 | 4/2004 | Fujimori |
| 2004/0127038 | A1 | 7/2004 | Carcia et al. |
| 2004/0164778 | A1 | 8/2004 | Toyoda et al. |
| 2005/0017302 | A1 | 1/2005 | Hoffman |
| 2005/0169039 | A1 | 8/2005 | Peng et al. |
| 2005/0169040 | A1 | 8/2005 | Peng et al. |
| 2005/0199959 | A1 | 9/2005 | Chiang et al. |
| 2005/0205921 | A1 | 9/2005 | Ishitt et al. |
| 2006/0035452 | A1 | 2/2006 | Carcia et al. |
| 2006/0043377 | A1 | 3/2006 | Hoffman et al. |
| 2006/0079037 | A1 * | 4/2006 | Hoffman ............ H01L 29/0673 438/158 |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |

(56) References Cited

U.S. PATENT DOCUMENTS

| | | |
|---|---|---|
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0229133 A1 | 10/2007 | Tam et al. |
| 2007/0252207 A1 | 11/2007 | Park et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048744 A1 | 2/2008 | Fukuoka |
| 2008/0050595 A1 | 2/2008 | Nakagawara et al. |
| 2008/0073653 A1 | 3/2008 | Lwasakit |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258789 A1 | 10/2008 | Motomura |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0108256 A1 | 4/2009 | Kwak et al. |
| 2009/0114910 A1 | 5/2009 | Chang |
| 2009/0134399 A1 | 5/2009 | Sakakura et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0085081 A1 | 4/2010 | Ofuji et al. |
| 2010/0148171 A1 | 6/2010 | Hayashi et al. |
| 2010/0193785 A1 | 8/2010 | Kimura |
| 2010/0276685 A1 | 11/2010 | Itagaki et al. |
| 2011/0010493 A1 | 1/2011 | Kimura et al. |
| 2011/0024741 A1 | 2/2011 | Abe et al. |
| 2011/0089417 A1 | 4/2011 | Yamazaki et al. |
| 2011/0090184 A1* | 4/2011 | Yamazaki ............... G09G 3/20 345/204 |
| 2011/0101351 A1 | 5/2011 | Yamazaki |
| 2011/0187410 A1 | 8/2011 | Kato et al. |
| 2011/0260157 A1 | 10/2011 | Yano et al. |
| 2014/0001040 A1 | 1/2014 | Inoue et al. |
| 2014/0339073 A1 | 11/2014 | Inoue et al. |
| 2016/0358977 A1 | 12/2016 | Yamazaki et al. |

FOREIGN PATENT DOCUMENTS

| | | | |
|---|---|---|---|
| CN | 001641882 A | 7/2005 | |
| CN | 001713388 A | 12/2005 | |
| CN | 001992369 A | 7/2007 | |
| CN | 101036232 A | * 9/2007 | ............ H01L 29/49 |
| CN | 101057329 A | 10/2007 | |
| CN | 101064345 A | 10/2007 | |
| CN | 101310371 A | 11/2008 | |
| CN | 101325202 A | 12/2008 | |
| CN | 101335273 A | 12/2008 | |
| CN | 101335301 A | * 12/2008 | ........... H01L 21/336 |
| CN | 101527318 A | 9/2009 | |
| EP | 0135036 A | 3/1985 | |
| EP | 1447909 A | 8/2004 | |
| EP | 1583239 A | 10/2005 | |
| EP | 1737044 A | 12/2006 | |
| EP | 2096188 A | 9/2009 | |
| EP | 2226847 A | 9/2010 | |
| EP | 2339639 A | 6/2011 | |
| EP | 2381476 A | 10/2011 | |
| EP | 2471972 A | 7/2012 | |
| EP | 2669402 A | 12/2013 | |
| EP | 2816607 A | 12/2014 | |
| JP | 57-011526 A | 1/1982 | |
| JP | 60-025269 A | 2/1985 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 5-110392 A | * 4/1993 | ............ H03K 19/096 |
| JP | 05-110392 A | 4/1993 | |
| JP | 05-251705 A | 9/1993 | |
| JP | 07-147530 A | 6/1995 | |
| JP | 08-264794 A | 10/1996 | |
| JP | 10-239400 A | 9/1998 | |
| JP | 11-505377 | 5/1999 | |
| JP | 2000-044236 A | 2/2000 | |
| JP | 2000-077982 A | 3/2000 | |
| JP | 2000-150900 A | 5/2000 | |
| JP | 2000-269457 A | 9/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2005-269616 A | 9/2005 | |
| JP | 2005-323295 A | 11/2005 | |
| JP | 2006-050208 A | 2/2006 | |
| JP | 2006-165532 A | 6/2006 | |
| JP | 2007-194594 A | 8/2007 | |
| JP | 2007-258223 A | 10/2007 | |
| JP | 2008-052847 A | 3/2008 | |
| JP | 2008-147903 A | 6/2008 | |
| JP | 2008-533693 | 8/2008 | |
| JP | 2008-214697 A | 9/2008 | |
| JP | 2008-280216 A | 11/2008 | |
| JP | 2009-033145 A | 2/2009 | |
| JP | 2009-135350 A | 6/2009 | |
| JP | 2009-164393 A | 7/2009 | |
| JP | 2009-167087 A | 7/2009 | |
| JP | 2009-528670 | 8/2009 | |
| JP | 2009-206942 A | 9/2009 | |
| JP | 2009-212443 A | 9/2009 | |
| JP | 2008/136505 | 7/2010 | |
| TW | 200912832 | 3/2009 | |
| WO | WO-2003/044953 | 5/2003 | |
| WO | WO-2004/059838 | 7/2004 | |
| WO | WO-2004/114391 | 12/2004 | |
| WO | WO-2006/041578 | 4/2006 | |
| WO | WO-2006/051996 | 5/2006 | |
| WO | WO-2007/029844 | 3/2007 | |
| WO | WO-2007/094501 | 8/2007 | |
| WO | WO-2007/142167 | 12/2007 | |
| WO | WO-2008/143304 | 11/2008 | |
| WO | WO-2009/028298 | 3/2009 | |

(56) References Cited

FOREIGN PATENT DOCUMENTS

| WO | WO-2009/087943 | 7/2009 |
|---|---|---|
| WO | WO-2009/110623 | 9/2009 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for Amoled Back Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transitionithe "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 35 No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a CHARGE-Generation Layer", Adv. Mater. (Advanced Materials), 2006, vol. 13, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO SYSTEMS [A; Fe, Ga, or Al; B: Mg, Mn, Fe, Nl, Cu,Or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaOS(ZnO)3, and Ga2O3(ZnO)m (m < 7, 8, 9, and 16) in the In2O3—ZnGaZO4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Nakamura.M, "Synthesis of Homologous Compound with New Long-Period Structure", NIRIM Newsletter, Mar. 1, 1995, vol. 150, pp. 1-4.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nomura.K et al., "Thin-Film Transistor Fabricated in Single-Crystalline Transparent Oxide Semiconductor", Science, May 23, 2003, vol. 300, No. 5623, pp. 1269-1272.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Carrier transport in transparent oxide semiconductor with intrinsic structural randomness probed using single-crystalline InGaO3(ZnO)5 films", (Appl. Phys. Lett. (Applied Physics Letters), Sep. 13, 2004, vol. 85, No. 11, pp. 1993-1995.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 399-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn- Oxide TFTs", IDW'09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of Igzo Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.
Kim.W et al., "An Experimental High-Density DRAM Cell with a Built-in Gain Stage", IEEE Journal of Solid-State Circuits, Aug. 1, 1994, vol. 29, No. 8, pp. 978-981.
Shukuri.S et al., "A Complementary Gain Cell Technology for sub-1 V Supply DRAMs ", IEDM 92: Technical Digest of International Electron Devices Meeting, Dec. 13, 1992, pp. 1006-1008.
Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.
International Search Report (Application No. PCT/JP2010/069764) dated Feb. 8, 2011.
Written Opinion (Application No. PCT/JP2010/069764) dated Feb. 8, 2011.
European Search Report (Application No. 10831470.9) dated Feb. 14, 2014.
Chinese Office Action (Application No. 201080052404.5) dated Jul. 17, 2014.
Taiwanese Office Action (Application No. 099139211) dated Jul. 24, 2015.
Chinese Office Action (Application No. 201410541227.7) dated Aug. 2, 2016.
Taiwanese Office Action (Application No. 105103566) dated Mar. 7, 2017.
Chinese Office Action (Application No. 201410541227.7) dated Apr. 1, 2017.
Korean Office Action (Application No. 2012-7015724) dated Dec. 12, 2016.
Chinese Office Action (Application No. 201410541227.7) dated Sep. 29, 2017.
Taiwanese Office Action (Application No. 106118898) dated Jan. 24, 2018.

* cited by examiner

Energy band diagram of B-B' section ($V_G$>0)

Energy band diagram of B-B' section ($V_G$<0)

NONVOLATILE LATCH CIRCUIT AND LOGIC CIRCUIT, AND SEMICONDUCTOR DEVICE USING THE SAME

CROSS-REFERENCE TO RELATED APPLICATIONS

This application is a continuation of U.S. application Ser. No. 14/510,310, filed Oct. 9, 2014, now allowed, which is a continuation of U.S. application Ser. No. 13/854,176, filed Apr. 1, 2013, now U.S. Pat. No. 8,860,485, which is a continuation of U.S. application Ser. No. 12/946,122, filed Nov. 15, 2010, now U.S. Pat. No. 8,410,838, which claims the benefit of a foreign priority application filed in Japan as Serial No. 2009-265738 on Nov. 20, 2009, all of which are incorporated by reference.

TECHNICAL FIELD

The invention disclosed herein relates to a nonvolatile logic circuit in which the logical state of storing data is not erased even after the power is turned off, and a semiconductor device using the nonvolatile logic circuit. In particular, the invention disclosed herein relates to a nonvolatile latch circuit and a semiconductor device using the nonvolatile latch circuit.

BACKGROUND ART

An integrated circuit has been proposed in which nonvolatile logic is integrated, where a feature of "nonvolatile" with which data is not erased even when the power is turned off is applied to a logic circuit. For example, a nonvolatile latch circuit using a ferroelectric element has been proposed as nonvolatile logic (see Patent Document 1).

REFERENCE

Patent Document

[Patent Document 1] PCT International Publication No. 2003/044953

DISCLOSURE OF INVENTION

However, a nonvolatile latch circuit using a ferroelectric element has problems in terms of reliability of the number of rewrites and reduction in voltage. In addition, a ferroelectric element is polarized by an electric field which is applied to the element, and stores data by remanent polarization. However, when the remanent polarization is small, the following problems might arise: the influence of variation becomes large, and a high-accuracy reading circuit is needed.

In view of the above problems, an object of an embodiment of the present invention is to provide a novel nonvolatile latch circuit and a semiconductor device using the nonvolatile latch circuit.

A nonvolatile latch circuit according to one embodiment of the present invention includes a latch portion having a loop structure, in which an output of a first element is electrically connected to an input of a second element, and an output of the second element is electrically connected to an input of the first element; and a data holding portion for holding data of the latch portion. In the data holding portion, a transistor using an oxide semiconductor as a semiconductor material for forming a channel formation region is used as a switching element. In addition, the data holding portion includes an inverter which is electrically connected to a source electrode or a drain electrode of the transistor. With the use of the transistor, data held in the latch portion can be written into a gate capacitor of the inverter or a capacitor which is prepared separately. Further, with the use of the transistor, the data written into the gate capacitor of the inverter or the capacitor which is prepared separately can be held.

In other words, a nonvolatile latch circuit according to one embodiment of the present invention includes a latch portion and a data holding portion for holding data of the latch portion. The data holding portion includes a transistor and an inverter. A channel formation region of the transistor includes an oxide semiconductor layer. One of a source electrode and a drain electrode of the transistor is electrically connected to a wiring supplied with an output signal, the other of the source electrode and the drain electrode of the transistor is electrically connected to an input of the inverter, and an output of the inverter is electrically connected to a wiring supplied with an input signal.

In the above nonvolatile latch circuit, the data holding portion can include a capacitor in addition to the transistor and the inverter. The capacitor can be used for writing and holding data held in the latch portion. One of electrodes of the capacitor can be used by being electrically connected to the other of the source electrode and the drain electrode of the transistor.

In the above nonvolatile latch circuit, the latch portion includes a first element and a second element, and has a loop structure in which an output of the first element is electrically connected to an input of the second element, and an output of the second element is electrically connected to an input of the first element. In addition, the input of the first element is electrically connected to a wiring supplied with an input signal, and the output of the first element is electrically connected to a wiring supplied with an output signal. For example, an inverter can be used for each of the first element and the second element. Alternatively, a NAND can be used for the first element, and a clocked inverter can be used for the second element, for example.

In the above nonvolatile latch circuit, the transistor has a function of writing data held in the latch portion into a gate capacitor of the inverter or a capacitor which is prepared separately in the data holding portion. In addition, the transistor has a function of holding the data written into the gate capacitor of the inverter or the capacitor which is prepared separately in the data holding portion.

In the above nonvolatile latch circuit, with a transistor including an oxide semiconductor layer, which is formed with an oxide semiconductor material, for a channel formation region, can obtain the following characteristics even in the case of, for example, an element whose channel width W is $1\times10^4$ μm and channel length L is 3 μm: an off-state current at normal temperature is less than or equal to $1\times10^{-13}$ A; and a subthreshold swing (S value) is approximately 0.1 V/dec. (a gate insulating film: 100 nm thickness). Therefore, leakage current, that is, an off-state current at a state where a voltage between a gate and a source electrode is approximately 0 is much smaller than that of a transistor using silicon. Accordingly, with the transistor including an oxide semiconductor layer for a channel formation region, which serves as a switching element, a charge accumulated in the capacitor of the data storing portion can be kept stored without any change even after supply of a power source voltage to the latch circuit has stopped. In other words, data written into the data holding portion can be kept held without any change. Moreover, after the supply of the power source voltage to the latch circuit has started again, the data held in the data holding portion can be read. Accordingly, the logical state can be restored to the logical state prior to the stop of the supply of the power source voltage. Further, in temperature characteristics, the off-state current can be sufficiently low and the on-state current can be sufficiently high even at a high temperature. For example, as $V_G$-$I_D$ characteristics of the transistor, data is obtained in a range of −25° C. to 150° C. with low temperature dependence of off-state currents, on-state currents, mobilities, and S values. In this manner, an embodiment of the present invention is to provide a nonvolatile latch circuit which has a wide operating temperature range and operates stably even at a high temperature and in which a logical state of storing data is not erased even after the power is turned off.

In the above nonvolatile latch circuit, various logic circuits can be provided by using the nonvolatile latch circuit. In addition, various semiconductor devices using the logic circuits can be provided. For example, among a plurality of block circuits of the logic circuit, supply of a power source voltage to one or the plurality of block circuits which is/are not used can be stopped. With the use of the nonvolatile latch circuit, the logical state of the block circuit can be kept stored even after the supply of the power source voltage to the block circuit has stopped. Moreover, the stored logical state can be read after the supply of the power source voltage to the block circuit has started again. Accordingly, the logical state can be restored to the logical state prior to the stop of the supply of the power source voltage.

In the above nonvolatile latch circuit, as the oxide semiconductor layer, any of the following materials can be used: an In—Ga—Zn—O-based material; an In—Sn—O-based material; an In—Sn—Zn—O-based material; an In—Al—Zn—O-based material; an Sn—Ga—Zn—O-based material; an Al—Ga—Zn—O-based material; an Sn—Al—Zn—O-based material; an In—Zn—O-based material; an Sn—Zn—O-based material; an Al—Zn—O-based material; an In—O-based material; an Sn—O-based material; and a Zn—O-based material. In addition, the oxide semiconductor layer may contain indium, gallium, and zinc. Moreover, the hydrogen concentration in the oxide semiconductor layer can be set to less than or equal to $5\times10^{19}/cm^3$, preferably, less than or equal to $5\times10^{18}/cm^3$, more preferably, less than or equal to $5\times10^{17}/cm^3$, still more preferably, less than or equal to $1\times10^{16}/cm^3$, and even more preferably, less than $1\times10^{16}/cm^3$. Further, the carrier concentration in the oxide semiconductor layer can be set to less than $1\times10^{14}/cm^3$, preferably, less than $1\times10^{12}/cm^3$, more preferably, less than $1\times10^{11}/cm^3$. Furthermore, the off-state current at normal temperature of the transistor can be set to less than or equal to $1\times10^{-13}$ A.

In the above nonvolatile latch circuit, the transistor using an oxide semiconductor may be a bottom-gate type, a top-gate type, a bottom-contact type, or a top-contact type. A bottom-gate transistor includes at least a gate electrode over an insulating surface; a gate insulating film over the gate electrode; and an oxide semiconductor layer to be a channel formation region over the gate electrode, with the gate insulating film interposed therebetween. The top-gate transistor includes at least an oxide semiconductor layer to be a channel formation region over an insulating surface; a gate insulating film over the oxide semiconductor layer; and a gate electrode over the oxide semiconductor layer, with the gate insulating film interposed therebetween. The bottom-contact transistor includes an oxide semiconductor layer to be a channel formation region over a source electrode and a drain electrode. The top-contact transistor includes a source electrode and a drain electrode over an oxide semiconductor layer to be a channel formation region.

Note that in this specification and the like, the terms such as "above" and "below" do not necessarily mean "directly above" and "directly below", respectively, in the description of a physical relationship between components. For example, the expression "a gate electrode over a gate insulating layer" can mean the case where there is an additional component between the gate insulating layer and the gate electrode. The terms of "above" and "below" are just used for convenience of explanations and they can be interchanged unless otherwise specified.

In this specification and the like, the term of "electrode" or "wiring" does not limit the function of components. For example, an "electrode" can be used as part of "wiring", and the "wiring" can be used as part of the "electrode". In addition, the term of "electrode" or "wiring" can also mean a combination of a plurality of "electrodes" and "wirings", for example.

Note that functions of the "source" and the "drain" may be switched in the case where transistors of different polarities are employed or in the case where the direction of a current flow changes in a circuit operation. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an object having any electric function are a switching element such as a transistor, a resistor, an inductor, a capacitor, and an element with a variety of functions as well as an electrode and a wiring.

According to an embodiment of the present invention, with the use of a transistor using an oxide semiconductor as a semiconductor material for forming a channel formation region, which serves as a switching element of a data holding portion, a nonvolatile latch circuit which has a wide operating temperature range and operates stably even at a high temperature and in which a logical state of storing data is not erased even after the power is turned off, or a latch circuit provided with a data holding portion where a refresh period is sufficiently long can be realized. Since data writing is performed by switching of the transistor, the number of rewrites is not substantially limited. In addition, the writing voltage is almost equivalent to the threshold voltage of the transistor; thus, the transistor can operate at a low voltage. For example, the operation voltage can be set at approximately 1 V or less. Further, since a charge accumulated in a capacitor of the data storing portion can be kept held without any change, the influence of variation is small and data can be read easily as compared to the case where remanent polarization is used as data.

Various logic circuits can be provided by using the nonvolatile latch circuit. For example, in the logic circuit using the nonvolatile latch circuit, the power consumption can be reduced by turning off the power of the unused block. In addition, since a logical state is stored even when the power is turned off, a system can be started when the power is turned on or terminated when the power is turned off, at high speed and low power.

BEST MODE FOR CARRYING OUT THE INVENTION

Figure 1A:
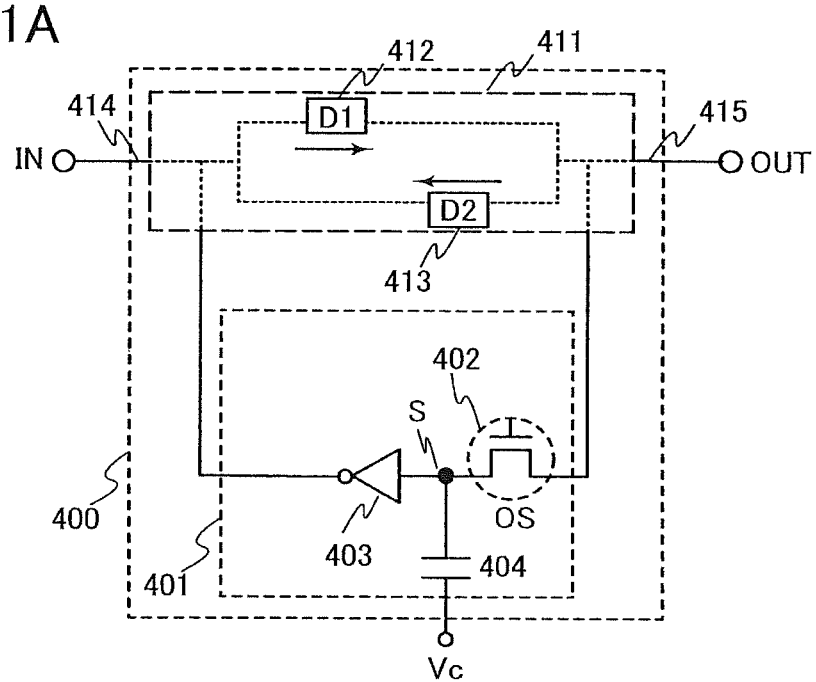
FIGS. 1A and 1B illustrate an example of a configuration of a nonvolatile latch circuit.

Hereinafter, embodiments and an example of the present invention are described below with reference to the drawings. However, the present invention is not limited to the following description. It is easily understood by those skilled in the art that the mode and detail can be changed in various ways unless departing from the scope and spirit of the present invention. Therefore, the present invention should not be construed as being limited to the description in the following embodiments and example. In describing structures of the present invention with reference to the drawings, reference numerals denoting the same components are used in different drawings.

Note that the size, the thickness of a layer, and a region of each structure illustrated in the drawings and the like in embodiments are exaggerated for simplicity in some cases. Therefore, embodiments of the present invention are not limited to such scales.

Note that terms with ordinal numbers such as "first", "second", and "third" in this specification are used in order to identify components, and the terms do not limit the components numerically.

[Embodiment 1]

In this embodiment, an example of a configuration and an operation of a nonvolatile latch circuit which is an embodiment of the invention disclosed herein, a method for manufacturing an element included in the nonvolatile latch circuit, and the like will be described with reference to FIGS. 1A and 1B, FIGS. 2A and 2B, FIGS. 3A and 3B, FIGS. 4A to 4H, FIGS. 5A to 5G, FIGS. 6A to 6D, FIG. 7, FIG. 8, FIGS. 9A and 9B, FIG. 10, FIG. 11, FIG. 12, FIG. 13, FIG. 14, FIG. 15, FIG. 16, and FIG. 17.

<Configuration and Operation of Nonvolatile Latch Circuit>

Figure 1B:
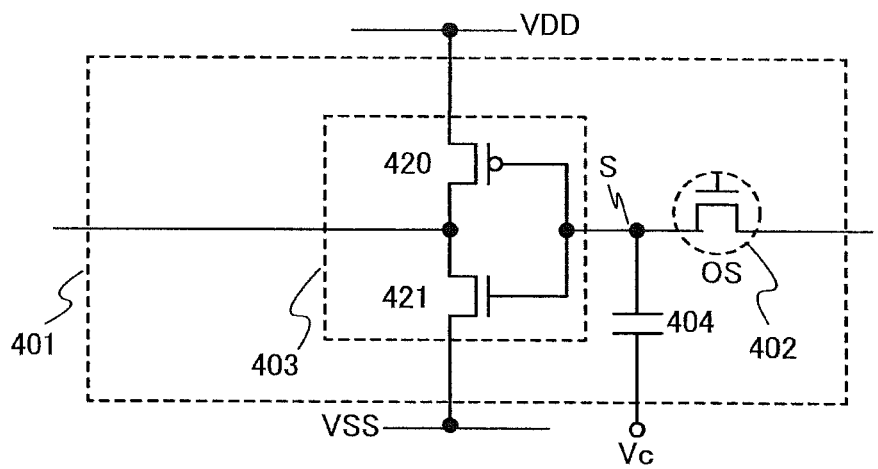

FIG. 1A illustrates a configuration of a nonvolatile latch circuit 400 including a latch portion 411 and a data holding portion 401 for holding data of the latch portion. FIG. 1B illustrates a configuration of the data holding portion 401.

The nonvolatile latch circuit 400 in FIG. 1A includes the latch portion 411 having a loop structure and the data holding portion 401 for holding data of the latch portion. In the latch portion 411 having a loop structure, an output of a first element (D1) 412 is electrically connected to an input of a second element (D2) 413, and an output of the second element (D2) 413 is electrically connected to an input of the first element (D1) 412.

The input of the first element (D1) 412 is electrically connected to a wiring 414 supplied with an input signal of the latch circuit. The output of the first element (D1) 412 is electrically connected to a wiring 415 supplied with an output signal of the latch circuit.

When there is a plurality of inputs of the first element (D1) 412, one of the inputs can be electrically connected to the wiring 414 supplied with the input signal of the latch circuit. When there is a plurality of inputs of the second element (D2) 413, one of the inputs can be electrically connected to the output of the first element (D1) 412.

As the first element (D1) 412, an element in which inputted signal is inverted and the resulting signal serves as an output can be used. For example, as the first element (D1) 412, an inverter, a NAND, a NOR, a clocked inverter, or the like can be used. As the second element (D2) 413, an element in which inputted signal is inverted and the resulting signal serves as an output can be used. For example, as the second element (D2) 413, an inverter, a NAND, a NOR, a clocked inverter, or the like can be used.

In the data holding portion 401, a transistor 402 using an oxide semiconductor as a semiconductor material for forming a channel formation region is used as a switching element. One of a source electrode and a drain electrode of the transistor 402 is electrically connected to the wiring 415 supplied with the output signal. In addition, the data holding portion 401 includes a capacitor 404 and an inverter 403 which are each electrically connected to the other of the source electrode and the drain electrode of the transistor 402. In other words, one of electrodes of the capacitor 404 and an input (an input terminal) of the inverter 403 are each electrically connected to the other of the source electrode and the drain electrode of the transistor 402. A node where one of the electrodes of the capacitor 404 and the input of the inverter 403 are each electrically connected to the other of the source electrode and the drain electrode of the transistor 402 is referred to as a node S. The other electrode of the capacitor 404 is supplied with a potential $V_c$.

In addition, an output of the inverter 403 is electrically connected to the wiring 414 supplied with the input signal. The inverter 403 includes a transistor 420 and a transistor 421. A source electrode of the transistor 420 is electrically connected to a high-level power source voltage VDD. A source electrode of the transistor 421 is electrically connected to a low-level power source voltage VSS.

Figure 2A:
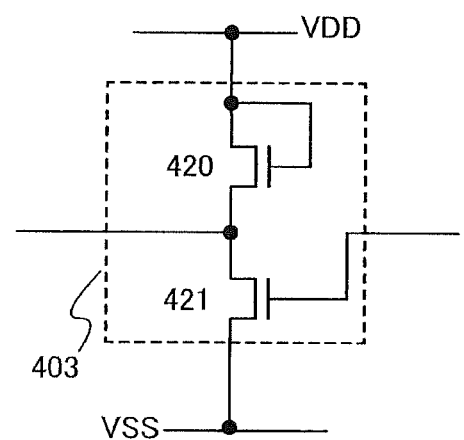
FIGS. 2A and 2B illustrate an example of a configuration of part of a nonvolatile latch circuit.
Figure 2B:
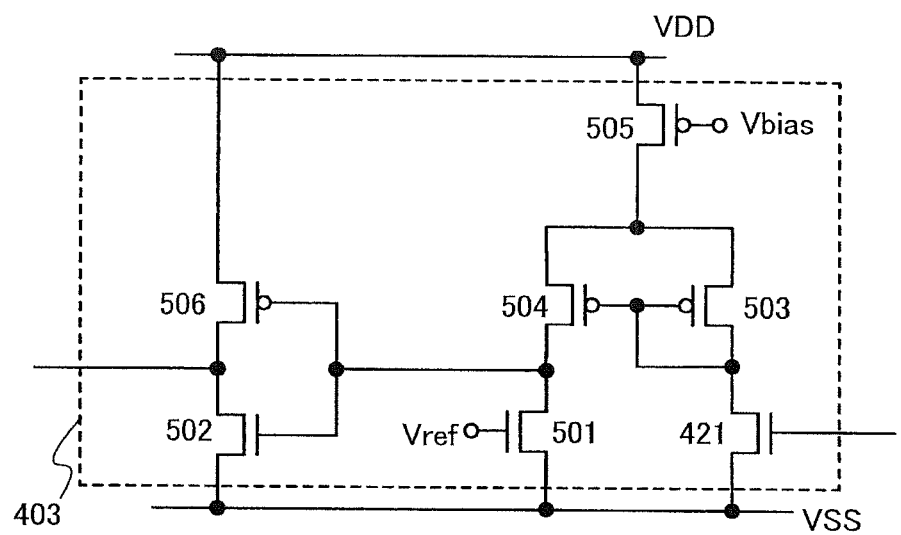

The configuration of the inverter 403 is not limited to that illustrated in FIG. 1B, and may include, for example, an n-channel transistor 420 and an n-channel transistor 421 as illustrated in FIG. 2A. Alternatively, the output may be provided with a buffer. Further alternatively, a sense amplifier circuit may be used instead of the inverter 403. For example, a differential amplifier type sense amplifier circuit as illustrated in FIG. 2B may be used. The differential amplifier type sense amplifier circuit as illustrated in FIG. 2B includes an n-channel transistor 421, an n-channel transistor 501, an n-channel transistor 502, a p-channel transistor 503, a p-channel transistor 504, a p-channel transistor 505, and a p-channel transistor 506. In either case, it is important that the input (input terminal) be in a floating state (a high impedance state).

The transistor 402 using an oxide semiconductor has a function of writing data held in the latch portion 411 into the capacitor 404 and a gate capacitor of the inverter 403 in the data holding portion 401. In addition, the transistor 402 has a function of holding the data written into the capacitor 404 and the gate capacitor of the inverter 403 in the data holding portion 401.

A writing operation of the data held in the latch portion 411 into the data holding portion 401, and holding, reading, and rewriting operations of the data will be described. First, the transistor 402 is turned on by supplying a gate electrode of the transistor 402 with a potential at which the transistor 402 is turned on. Accordingly, the data held in the latch portion, that is, a potential of the wiring 415 supplied with the output signal is applied to one of the electrodes of the capacitor 404 and the input terminal of the inverter 403. As a result, the charge in accordance with the potential of the wiring 415 is accumulated in one of the electrodes of the capacitor 404 and the gate capacitor of the inverter 403 (this operation corresponds to writing). After that, the transistor 402 is turned off in such a manner that a potential of the gate electrode of the transistor 402 is set at a potential at which the transistor 402 is turned off. Accordingly, the charge accumulated in one of the electrodes of the capacitor 404 and the gate capacitor of the inverter 403 is held (holding). The data can be read by reading a potential of one of the electrodes of the capacitor 404 and a potential of the input terminal of the inverter 403 (this operation corresponds to reading). Rewriting of the data can be performed in a manner similar to that of the writing and holding of the data.

As the oxide semiconductor layer included in the transistor 402, any of the following materials can be used: an In—Ga—Zn—O-based material; an In—Sn—O-based material; an In—Sn—Zn—O-based material; an In—Al—Zn—O-based material; an Sn—Ga—Zn—O-based material; an Al—Ga—Zn—O-based material; an Sn—Al—Zn—O-based material; an In—Zn—O-based material; an Sn—Zn—O-based material; an Al—Zn—O-based material; an In—O-based material; an Sn—O-based material; and a Zn—O-based material.

Here, the oxide semiconductor layer is preferably an oxide semiconductor layer which is highly purified by sufficiently removing an impurity such as hydrogen. Specifically, the hydrogen concentration in the oxide semiconductor layer can be set to less than or equal to $5\times10^{19}/cm^3$, preferably, less than or equal to $5\times10^{18}/cm^3$, more preferably, less than or equal to $5\times10^{17}/cm^3$, still more preferably, less than or equal to $1\times10^{16}/cm^3$, and even more preferably less than $1\times10^{16}/cm^3$. Further, the carrier concentration in the oxide semiconductor layer can be set to less than $1\times10^{14}/cm^3$, preferably, less than $1\times10^{12}/cm^3$, more preferably, less than $1\times10^{11}/cm^3$. In the oxide semiconductor layer which is highly purified by sufficiently reducing the hydrogen concentration, the carrier concentration is sufficiently low as compared to carrier concentration (approximately $1\times10^{14}/cm^3$) in a general silicon wafer (a silicon wafer to which a slight amount of impurity elements such as phosphorus or boron is added).

In this manner, by using an oxide semiconductor which is highly purified by sufficiently reducing hydrogen concentration and made to be an i-type oxide semiconductor or a substantially i-type oxide semiconductor with extremely low carrier concentration, the transistor 402 which has extremely favorable off-state current characteristics can be obtained. For example, even in the case of an element whose channel width W is $1\times10^4$ μm and channel length L is 3 μm, when a drain voltage $V_D$ which is applied to a drain electrode is +1 V or +10 V and a gate voltage $V_G$ which is applied to a gate electrode ranges from −5 V to −20 V, an off-state current at normal temperature is less than or equal to $1\times10^{-13}$ A. Further, in temperature characteristics, a transistor in which an off-state current can be sufficiently low and an on-state current can be sufficiently high even at a high temperature can be obtained. For example, as $V_G$-$I_D$ characteristics of the transistor 402, data is obtained in a range of −25° C. to 150° C. with low temperature dependence of off-state currents, on-state currents, mobilities, and S values. Note that the above hydrogen concentration in the oxide semiconductor layer was measured by SIMS (secondary ion mass spectroscopy).

Note that an oxide semiconductor included in the oxide semiconductor layer is not particularly limited as long as it has a non-single-crystal structure. A variety of structures, such as an amorphous structure, a microcrystalline (nanocrystalline or the like) structure, a polycrystalline structure, a structure in which microcrystals or polycrystals are included in an amorphous material, or a structure in which microcrystals or polycrystals are formed at a surface of an amorphous structure, can be employed.

In this manner, by using as a switching element the transistor 402 using an oxide semiconductor which is highly purified by sufficiently reducing hydrogen concentration and made to be an i-type oxide semiconductor or a substantially i-type oxide semiconductor with extremely low carrier concentration, the charge accumulated in the capacitor 404 and the gate capacitor of the inverter 403 in the data holding portion 401 can be kept held for an extremely long time even after supply of a power source voltage to the latch circuit 400 has stopped. In other words, the data written into the data holding portion 401 can be kept held for an extremely long time. In addition, after the supply of the power source voltage to the latch circuit 400 has started again, the data held in the data holding portion 401 can be read. Accordingly, the logical state can be restored to the logical state prior to the stop of the supply of the power source voltage. In this manner, by using as a switching element the transistor 402 using an oxide semiconductor which is highly purified by sufficiently reducing hydrogen concentration and made to be an i-type oxide semiconductor or a substantially i-type oxide semiconductor with extremely low carrier concentration, a novel nonvolatile latch circuit which has a wide operating temperature range and operates stably even at a high temperature and in which a logical state of storing data is not erased even after the power is turned off can be realized.

Among elements of the nonvolatile latch circuit 400, a material other than an oxide semiconductor can be used as a semiconductor material for the elements other than the transistor 402. As the material other than an oxide semiconductor, single crystal silicon, crystalline silicon, or the like can be used. For example, the element other than the transistor 402 can be provided over a substrate containing a semiconductor material. As the substrate containing a semiconductor material, a silicon wafer, an SOI (silicon on insulator) substrate, a silicon film over an insulating surface, or the like can be used. With the use of the material other than an oxide semiconductor, high-speed operation can be realized.

Further, among the elements of the nonvolatile latch circuit 400, the elements other than the transistor 402 can also be formed using an oxide semiconductor as a semiconductor material.

<Planar Structure and Cross-sectional Structure of Elements of Nonvolatile Latch Circuit>

Figure 3A:
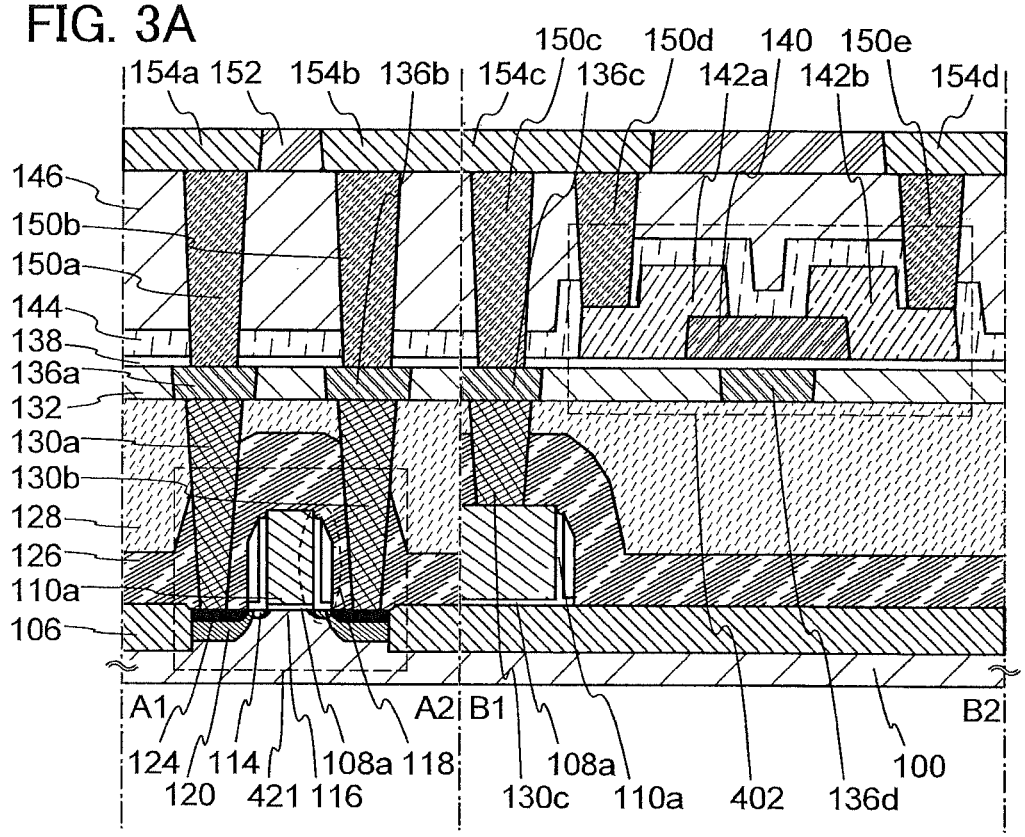
FIGS. 3A and 3B are a cross-sectional view and a plan view illustrating an example of elements of a nonvolatile latch circuit.
Figure 3B:
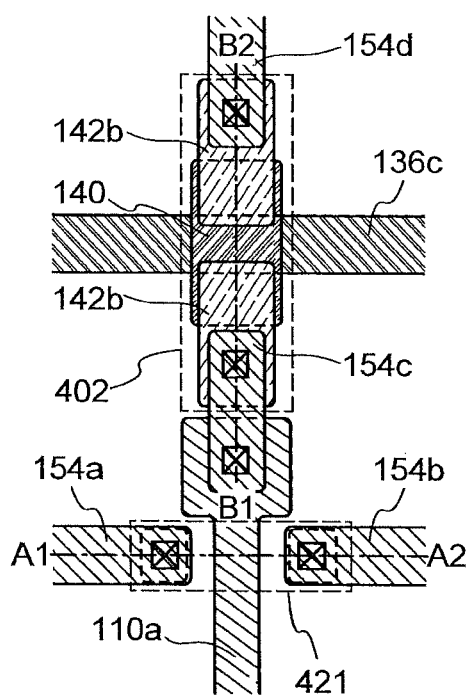

FIGS. 3A and 3B illustrate an example of the structure of the transistor 402 and the elements other than the transistor 402 of the nonvolatile latch circuit. Here, as the element other than the transistor 402, the transistor 421 included in the inverter 403 of the data holding portion 401 is described as an example. The elements other than the transistor 402 can have a structure the same or similar to that of the transistor 421. The element such as the capacitor 404 can be formed using a film for forming the transistor 402 or a film for forming the element other than the transistor 402. FIG. 3A illustrates a cross section, and FIG. 3B illustrates a plan view. Here, FIG. 3A corresponds to section A1-A2 and B1-B2 of FIG. 3B. As illustrated in FIGS. 3A and 3B, the transistor 421 using a material other than an oxide semiconductor is provided in a lower portion, and the transistor 402 using an oxide semiconductor is provided in an upper portion.

The transistor 421 includes a channel formation region 116 provided in a substrate 100 containing a semiconductor material; impurity regions 114 and high-concentration regions 120 (a combination of the impurity regions 114 and the high-concentration regions 120 can simply be referred to as impurity regions) formed with the channel formation region 116 interposed therebetween; a gate insulating layer 108a over the channel formation region 116; a gate electrode 110a over the gate insulating layer 108a; a source or drain electrode 130a electrically connected to the impurity region 114; and a source or drain electrode 130b electrically connected to the impurity region 114.

Here, sidewall insulating layers 118 are formed on the sides of the gate electrode 110a. Moreover, as seen from a plane, the high-concentration regions 120 are formed in a region of the substrate 100 which does not overlap with the sidewall insulating layers 118, and metal compound regions 124 are present over the high-concentration regions 120. Further, an element isolation insulating layer 106 is formed over the substrate 100 so as to surround the transistor 421, and an interlayer insulating layer 126 and an interlayer insulating layer 128 are formed so as to cover the transistor 421. The source or drain electrode 130a and the source or drain electrode 130b are electrically connected to the metal compound regions 124 through openings formed in the interlayer insulating layer 126 and the interlayer insulating layer 128. In other words, the source or drain electrode 130a and the source or drain electrode 130b are electrically connected to the high-concentration regions 120 and the impurity regions 114 through the metal compound regions 124. Further, an electrode 130c which is provided in a manner similar to that of the source or drain electrode 130a and the source or drain electrode 130b is electrically connected to the gate electrode 110a.

The transistor 402 includes a gate electrode 136d over the interlayer insulating layer 128; a gate insulating layer 138 over the gate electrode 136d; an oxide semiconductor layer 140 over the gate insulating layer 138; and a source or drain electrode 142a and a source or drain electrode 142b which are over the oxide semiconductor layer 140 and electrically connected to the oxide semiconductor layer 140.

Here, the gate electrode 136d is formed so as to be embedded in an insulating layer 132 which is over the interlayer insulating layer 128. Furthermore, similarly to the gate electrode 136d, an electrode 136a, an electrode 136b, and an electrode 136c are formed in contact with the source or drain electrode 130a, the source or drain electrode 130b, and the electrode 130c, respectively.

A protective insulating layer 144 is formed over the transistor 402 so as to be in contact with part of the oxide semiconductor layer 140. An interlayer insulating layer 146 is formed over the protective insulating layer 144. Here, the protective insulating layer 144 and the interlayer insulating layer 146 are provided with openings that reach the source or drain electrode 142a and the source or drain electrode 142b. An electrode 150d and an electrode 150e are in contact with the source or drain electrode 142a and the source or drain electrode 142b through the openings. At the same time as formation of the electrode 150d and the electrode 150e, an electrode 150a, an electrode 150b, and an electrode 150c are formed which are in contact with the electrode 136a, the electrode 136b, and the electrode 136c, respectively, through openings in the gate insulating layer 138, the protective insulating layer 144, and the interlayer insulating layer 146.

Here, the oxide semiconductor layer 140 is preferably an oxide semiconductor layer which is highly purified by sufficiently removing an impurity such as hydrogen. Specifically, the hydrogen concentration in the oxide semiconductor layer 140 can be set to less than or equal to $5 \times 10^{19}/\text{cm}^3$, preferably, less than or equal to $5 \times 10^{18}/\text{cm}^3$, more preferably, less than or equal to $5 \times 10^{17}/\text{cm}^3$, still more preferably, less than or equal to $1 \times 10^{16}/\text{cm}^3$, and even more preferably less than $1 \times 10^{16}/\text{cm}^3$. Further, the carrier concentration in the oxide semiconductor layer 140 can be set to less than $1 \times 10^{14}/\text{cm}^3$, preferably, less than $1 \times 10^{12}/\text{cm}^3$, more preferably, less than $1 \times 10^{11}/\text{cm}^3$. In the oxide semiconductor layer 140 which is highly purified by sufficiently reducing the hydrogen concentration, the carrier concentration is sufficiently low as compared to carrier concentration (approximately $1 \times 10^{14}/\text{cm}^3$) in a general silicon wafer (a silicon wafer to which a slight amount of impurity elements such as phosphorus or boron is added). In this manner, by using an oxide semiconductor which is highly purified by sufficiently reducing hydrogen concentration and made to be an i-type oxide semiconductor or a substantially i-type oxide semiconductor with extremely low carrier concentration, the transistor 402 which has extremely favorable off-state current characteristics can be obtained. For example, even in the case of an element whose channel width W is $1\times10^4$ µm and channel length L is 3 µm, when a drain voltage VD which is applied to a drain electrode is +1 V or +10 V and a gate voltage $V_G$ which is applied to a gate electrode ranges from −5 V to −20 V, an off-state current at normal temperature is less than or equal to $1\times10^{-13}$ A. Note that the above hydrogen concentration in the oxide semiconductor layer was measured by SIMS (secondary ion mass spectroscopy).

An insulating layer 152 is formed over the interlayer insulating layer 146. An electrode 154a, an electrode 154b, an electrode 154c, and an electrode 154d are formed so as to be embedded in the interlayer insulating layer 152. Here, the electrode 154a is in contact with the electrode 150a, the electrode 154b is in contact with the electrode 150b, the electrode 154c is in contact with the electrode 150c and the electrode 150d, and the electrode 154d is in contact with the electrode 150e.

That is, in the elements of the nonvolatile latch circuit in FIGS. 3A and 3B, the gate electrode 110a of the transistor 421 is electrically connected to the source or drain electrode 142a of the transistor 402 through the electrode 130c, the electrode 136c, the electrode 150c, the electrode 154c, and the electrode 150d.

<Method for Manufacturing Elements of Nonvolatile Latch Circuit>

Next, an example of a method for manufacturing the elements of the nonvolatile latch circuit will be described. First, a method for manufacturing the transistor 421 in the lower portion will be described below with reference to FIGS. 4A to 4H, and then a method for manufacturing the transistor 402 in the upper portion will be described below with reference to FIGS. 5A to 5G and FIGS. 6A to 6D.

<Method for Manufacturing Transistor in Lower Portion>

Figure 4A:
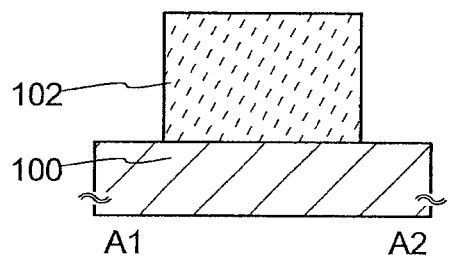
FIGS. 4A to 4H illustrate an example of a method for manufacturing an element of a nonvolatile latch circuit.

First, the substrate 100 containing a semiconductor material is prepared (see FIG. 4A). A single crystal semiconductor substrate of silicon, carbon silicon, or the like; a microcrystalline semiconductor substrate; a compound semiconductor substrate of silicon germanium or the like; an SOI substrate, or the like can be used as the substrate 100 containing a semiconductor material. Here, an example of the case where a single crystal silicon substrate is used as the substrate 100 containing a semiconductor material is described. Note that in general, the term "SOI substrate" means a substrate having a silicon semiconductor layer over its insulating surface. In this specification and the like, the term "SOI substrate" also means a substrate having a semiconductor layer using a material other than silicon over its insulating surface. That is, a semiconductor layer included in the "SOI substrate" is not limited to a silicon semiconductor layer. Examples of the SOI substrate include a substrate which has a semiconductor layer over its insulating substrate such as a glass substrate, with an insulating layer between the semiconductor layer and the insulating substrate.

A protective layer 102 that serves as a mask for forming an element isolation insulating layer is formed over the substrate 100 (see FIG. 4A). An insulating layer of silicon oxide, silicon nitride, silicon nitride oxide, or the like, for example, can be used as the protective layer 102. Note that before and after this step, an impurity element imparting n-type conductivity or an impurity element imparting p-type conductivity can be added to the substrate 100 in order to control the threshold voltage of the transistor. As the impurity imparting n-type conductivity, phosphorus, arsenic, or the like can be used, for example, when the semiconductor material contained in the substrate 100 is silicon. As the impurity imparting p-type conductivity, boron, aluminum, gallium, or the like can be used, for example.

Next, with the use of the above protective layer 102 as a mask, part of the substrate 100 in a region which is not covered with the protective layer 102 (an exposed region) is removed by etching. Thus, an isolated semiconductor region 104 is formed (see FIG. 4B). As the etching, dry etching is preferably performed, but wet etching can be performed. An etching gas and an etchant can be selected as appropriate depending on a material of layers to be etched.

Figure 4B:
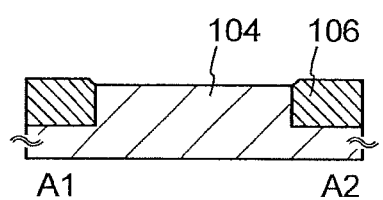

Next, an insulating layer is formed so as to cover the semiconductor region 104 and a region of the insulating layer which overlaps with the semiconductor region 104 is selectively removed, so that the element isolation insulating layers 106 are formed (see FIG. 4B). The insulating layer is formed using silicon oxide, silicon nitride, silicon nitride oxide, or the like. Methods for removing the insulating layer include etching, polishing such as CMP, and the like, and any of these are applicable. Note that after the semiconductor region 104 is formed or after the element isolation insulating layers 106 are formed, the protective layer 102 is removed.

Next, an insulating layer is formed over the semiconductor region 104, and a layer containing a conductive material is formed over the insulating layer.

Because the insulating layer serves as a gate insulating layer later, the insulating layer preferably has a single-layer structure or a stacked structure using a film containing silicon oxide, silicon nitride oxide, silicon nitride, hafnium oxide, aluminum oxide, tantalum oxide, or the like formed with a CVD method, a sputtering method, or the like. Alternatively, the insulating layer can be formed by oxidizing or nitriding a surface of the semiconductor region 104 by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer; the insulating layer can be formed in the range of 1 nm to 100 nm inclusive, for example.

The layer containing a conductive material can be formed using a metal material such as aluminum, copper, titanium, tantalum, or tungsten. Alternatively, the layer containing a conductive material can be formed using a semiconductor material such as polycrystalline silicon containing a conductive material. There is no particular limitation on the method for forming the layer containing a conductive material; a variety of film formation methods such as an evaporation method, a CVD method, a sputtering method, and a spin coating method can be employed. Note that in this embodiment, an example of the case where the layer containing a conductive material is formed using a metal material is described.

Figure 4C:
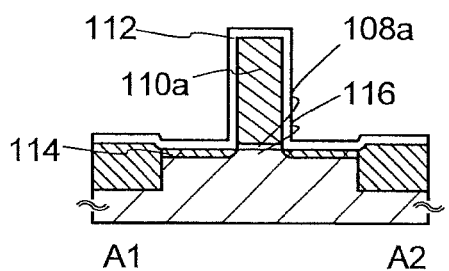

After that, the insulating layer and the layer containing a conductive material are selectively etched, so that the gate insulating layer 108a and the gate electrode 110a are formed (see FIG. 4C).

Next, an insulating layer 112 that covers the gate electrode 110a is formed (see FIG. 4C). Then, the impurity regions 114 with a shallow junction depth are formed by adding phosphorus (P), arsenic (As), or the like to the semiconductor region 104 (see FIG. 4C). Note that phosphorus or arsenic is added here in order to form an n-channel transistor; however, an impurity element such as boron (B) or aluminum (Al) may be added in the case of forming a p-channel transistor. With the formation of the impurity regions 114, the channel formation region 116 is formed in the semiconductor region 104 below the gate insulating layer 108a (see FIG. 4C). Here, the concentration of the impurity added can be set as appropriate; the concentration is preferably increased when the size of a semiconductor element is extremely decreased. The step in which the impurity regions 114 are formed after the formation of the insulating layer 112 is employed here; alternatively, the insulating layer 112 may be formed after the formation of the impurity regions 114.

Figure 4D:
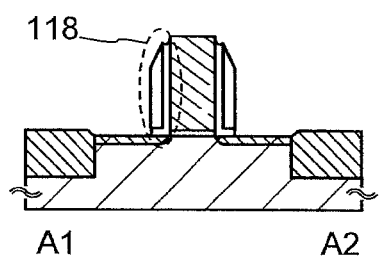
Figure 4E:
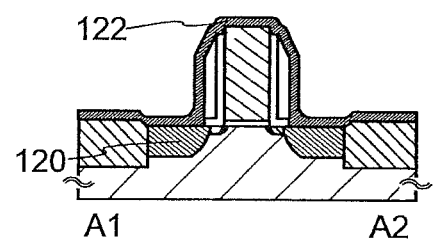
Figure 4F:
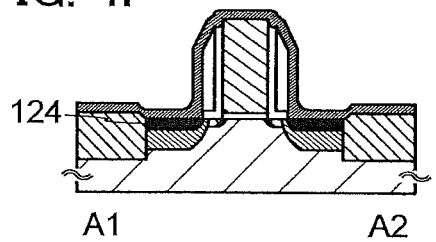

Next, the sidewall insulating layers 118 are formed (see FIG. 4D). When an insulating layer is formed to cover the insulating layer 112 and then subjected to highly anisotropic etching, the sidewall insulating layers 118 can be formed in a self-aligned manner. At this time, it is preferable to partly etch the insulating layer 112 so that a top surface of the gate electrode 110a and top surfaces of the impurity regions 114 are exposed.

Then, an insulating layer is formed to cover the gate electrode 110a, the impurity regions 114, the sidewall insulating layers 118, and the like. Next, phosphorus (P), arsenic (As), or the like is added to regions in contact with the impurity regions 114, so that the high-concentration impurity regions 120 are formed. After that, the insulating layer is removed, and a metal layer 122 is formed to cover the gate electrode 110a, the sidewall insulating layers 118, the high-concentration impurity regions 120, and the like (see FIG. 4E). A variety of film formation methods such as a vacuum evaporation method, a sputtering method, or a spin coating method can be employed for forming the metal layer 122. The metal layer 122 is preferably formed using a metal material that reacts with a semiconductor material included in the semiconductor region 104 to be a low-resistance metal compound. Examples of such a metal material are titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 4F). Note that when the gate electrode 110a is formed using polycrystalline silicon or the like, a metal compound region is also formed in a region of the gate electrode 110a in contact with the metal layer 122.

As the heat treatment, irradiation with a flash lamp can be employed, for example. Although it is needless to say that another heat treatment method may be used, a method with which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 4G:
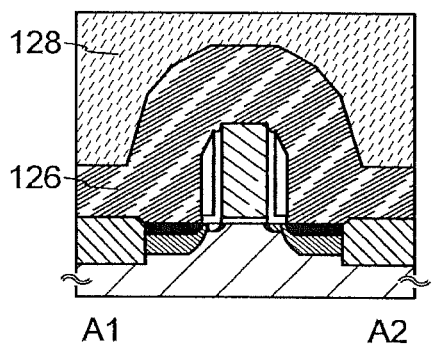

Then, the interlayer insulating layer 126 and the interlayer insulating layer 128 are formed to cover the components formed in the above steps (see FIG. 4G). The interlayer insulating layer 126 and the interlayer insulating layer 128 can be formed using an inorganic insulating material such as silicon oxide, silicon nitride oxide, silicon nitride, hafnium oxide, aluminum oxide, or tantalum oxide. Moreover, the interlayer insulating layer 126 and the interlayer insulating layer 128 can also be formed using an organic insulating material such as polyimide or acrylic. Note that a two-layer structure of the interlayer insulating layer 126 and the interlayer insulating layer 128 is employed here; however, the structure of an interlayer insulating layer is not limited to this structure. After the formation of the interlayer insulating layer 128, a surface of the interlayer insulating layer 128 is preferably planarized with CMP, etching, or the like.

Figure 4H:
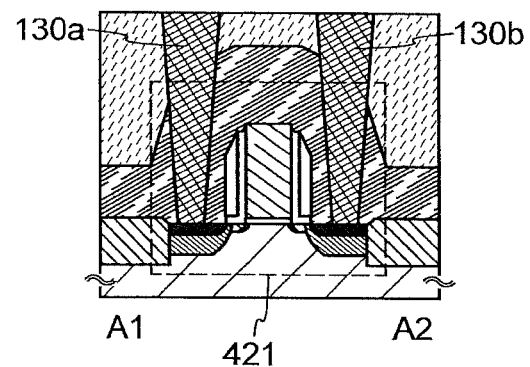

Then, openings that reach the metal compound regions 124 are formed in the interlayer insulating layers, and the source or drain electrode 130a and the source or drain electrode 130b are formed in the openings (see FIG. 4H). The source or drain electrode 130a and the source or drain electrode 130b can be formed in such a manner, for example, that a conductive layer is formed in a region including the openings with a PVD method, a CVD method, or the like and then part of the conductive layer is removed by etching, CMP, or the like.

Note that in the case where the source or drain electrode 130a and the source or drain electrode 130b are formed by removing part of the conductive layer, the process is preferably performed so that the surfaces are planarized. For example, when a thin titanium film or a thin titanium nitride film is formed in a region including the openings and then a tungsten film is formed to be embedded in the openings, excess tungsten, titanium, titanium nitride, or the like is removed and the planarity of the surface can be improved by subsequent CMP. When the surface including the source or drain electrode 130a and the source or drain electrode 130b is planarized in such a manner, an electrode, a wiring, an insulating layer, a semiconductor layer, and the like can be favorably formed in later steps.

Note that only the source or drain electrode 130a and the source or drain electrode 130b in contact with the metal compound regions 124 are shown here; however, an electrode that is in contact with the gate electrode 110a (e.g., the electrode 130c in FIG. 3A) and the like can also be formed in this step. There is no particular limitation on a material used for the source or drain electrode 130a and the source and drain electrode 130b, and a variety of conductive materials can be used. For example, a conductive material such as molybdenum, titanium, chromium, tantalum, tungsten, aluminum, copper, neodymium, or scandium can be used.

Through the above steps, the transistor 421 using the substrate 100 containing a semiconductor material is formed. Note that an electrode, a wiring, an insulating layer, or the like may be further formed after the above steps. When the wirings have a multi-layer structure of a stacked structure including an interlayer insulating layer and a conductive layer, a highly integrated semiconductor device can be provided.

<Method for Manufacturing Transistor in Upper Portion>

Next, steps for manufacturing the transistor 402 over the interlayer insulating layer 128 will be described with reference to FIGS. 5A to 5G and FIGS. 6A to 6D. Note that FIGS. 5A to 5G and FIGS. 6A to 6D illustrate steps for manufacturing electrodes, the transistor 402, and the like over the interlayer insulating layer 128; therefore, the transistor 421 and the like placed below the transistor 402 are omitted.

Figure 5A:
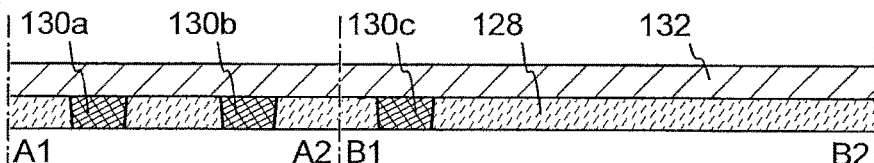
FIGS. 5A to 5G illustrate an example of a method for manufacturing elements of a nonvolatile latch circuit.
Figure 5B:
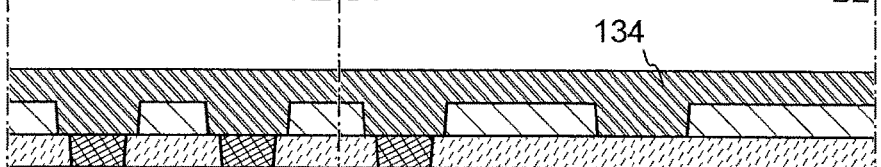

First, the insulating layer 132 is formed over the interlayer insulating layer 128, the source or drain electrode 130a, the source or drain electrode 130b, and the electrode 130c (see FIG. 5A). The insulating layer 132 can be formed with a PVD method, a CVD method, or the like. The insulating layer 132 can be formed using an inorganic insulating material such as silicon oxide, silicon nitride oxide, silicon nitride, hafnium oxide, aluminum oxide, or tantalum oxide.

Next, openings that reach the source or drain electrode 130a, the source or drain electrode 130b, and the electrode 130c are formed in the insulating layer 132. At this time, an opening is also formed in a region where the gate electrode 136d is to be formed later. Then, a conductive layer 134 is formed to be embedded in the openings (see FIG. 5B). The openings can be formed with a method such as etching using a mask. The mask can be formed with a method such as light exposure using a photomask. Either wet etching or dry etching may be used as the etching; dry etching is preferably used in terms of microfabrication. The conductive layer 134 can be formed with a film formation method such as a PVD method or a CVD method. The conductive layer 134 can be formed using a conductive material such as molybdenum, titanium, chromium, tantalum, tungsten, aluminum, copper, neodymium, or scandium or an alloy or a compound (e.g., a nitride) of any of these materials, for example.

More specifically, it is possible to employ a method, for example, in which a thin titanium film is formed in a region including the openings with a PVD method and a thin titanium nitride film is formed with a CVD method, and then, a tungsten film is formed to be embedded in the openings. Here, the titanium film formed with a PVD method has a function of reducing an oxide film at the interface with the insulating layer 132 to decrease the contact resistance with lower electrodes (here, the source or drain electrode 130a, the source or drain electrode 130b, the electrode 130c, and the like). The titanium nitride film formed after the formation of the titanium film has a barrier function of preventing diffusion of the conductive material. A copper film may be formed with a plating method after the formation of the barrier film of titanium, titanium nitride, or the like.

Figure 5C:
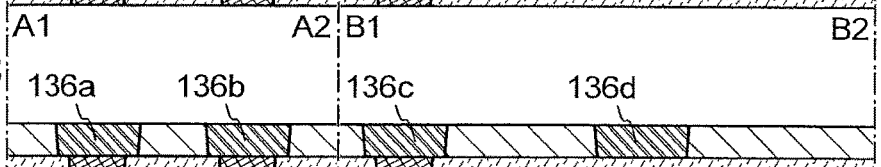

After the conductive layer 134 is formed, part of the conductive layer 134 is removed by etching, CMP, or the like, so that the insulating layer 132 is exposed and the electrode 136a, the electrode 136b, the electrode 136c, and the gate electrode 136d are formed (see FIG. 5C). Note that when the electrode 136a, the electrode 136b, the electrode 136c, and the gate electrode 136d are formed by removing part of the conductive layer 134, the process is preferably performed so that the surfaces are planarized. When the surfaces of the insulating layer 132, the electrode 136a, the electrode 136b, the electrode 136c, and the gate electrode 136d are planarized in such a manner, an electrode, a wiring, an insulating layer, a semiconductor layer, and the like can be favorably formed in later steps.

Figure 5D:
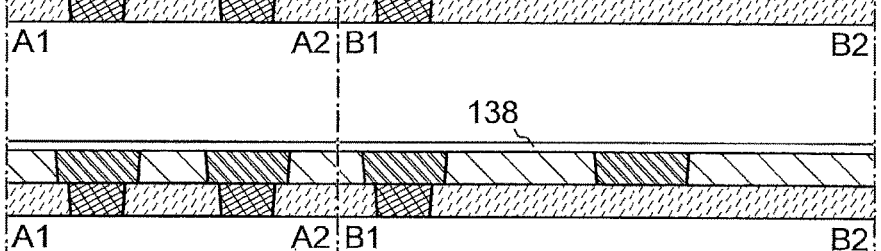

Next, the gate insulating layer 138 is formed to cover the insulating layer 132, the electrode 136a, the electrode 136b, the electrode 136c, and the gate electrode 136d (see FIG. 5D). The gate insulating layer 138 can be formed with a CVD method, a sputtering method, or the like. The gate insulating layer 138 is preferably formed using silicon oxide, silicon nitride, silicon oxynitride, silicon nitride oxide, aluminum oxide, hafnium oxide, tantalum oxide, or the like. Note that the gate insulating layer 138 may have a single-layer structure or a stacked structure. For example, the gate insulating layer 138 can be formed using silicon oxynitride with a plasma CVD method using silane (SiH$_4$), oxygen, and nitrogen as a source gas. There is no particular limitation on the thickness of the gate insulating layer 138; the gate insulating layer 138 can have a thickness of 10 nm to 500 nm inclusive, for example. In the case of employing a stacked structure, for example, the gate insulating layer 138 is preferably a stack of a first gate insulating layer with a thickness of 50 nm to 200 nm inclusive, and a second gate insulating layer with a thickness of 5 nm to 300 nm inclusive over the first gate insulating layer.

Note that an oxide semiconductor that becomes intrinsic or substantially intrinsic by removal of impurities (a highly purified oxide semiconductor) is quite susceptible to the interface level and the interface charge; therefore, when such an oxide semiconductor is used for an oxide semiconductor layer, the interface with the gate insulating layer is important. In other words, the gate insulating layer 138 that is to be in contact with a highly purified oxide semiconductor layer needs to have high quality.

For example, the gate insulating layer 138 is preferably formed with a high-density plasma CVD method using a microwave (2.45 GHz) because the gate insulating layer 138 can be dense and have high withstand voltage and high quality. When a highly purified oxide semiconductor layer and a high-quality gate insulating layer are in close contact with each other, the interface level can be reduced and favorable interface characteristics can be obtained.

It is needless to say that, even when a highly purified oxide semiconductor layer is used, another method such as a sputtering method or a plasma CVD method can be employed as long as a high-quality insulating layer can be formed as a gate insulating layer. Moreover, it is possible to use an insulating layer whose quality and interface characteristics are improved with heat treatment performed after the formation of the insulating layer. In any case, an insulating layer that has favorable film quality as the gate insulating layer 138 and can reduce interface level density with an oxide semiconductor layer to form a favorable interface is formed as the gate insulating layer 138.

In a gate bias-temperature stress test (BT test) at 85° C. with $2 \times 10^6$ V/cm for 12 hours, if an impurity is added to an oxide semiconductor, a bond between the impurity and a main component of the oxide semiconductor is broken by a high electric field (B: bias) and high temperature (T: temperature), and a generated dangling bond causes a drift of the threshold voltage ($V_{th}$).

In contrast, when impurities of an oxide semiconductor, particularly hydrogen and water, are reduced to a minimum and interface characteristics between the oxide semiconductor and the gate insulating layer are made favorable as described above, a transistor that is stable through the BT test can be obtained.

Figure 5E:
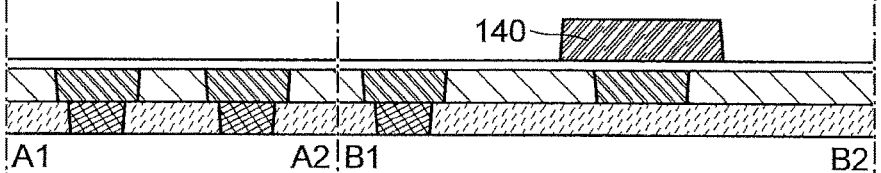

Next, an oxide semiconductor layer is formed over the gate insulating layer 138 and processed with a method such as etching using a mask, so that the island-shaped oxide semiconductor layer 140 is formed (see FIG. 5E).

As the oxide semiconductor layer, it is preferable to use an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer. In this embodiment, as the oxide semiconductor layer, an amorphous oxide semiconductor layer is formed with a sputtering method using an In—Ga—Zn—O-based metal oxide target. Note that since crystallization of an amorphous oxide semiconductor layer can be suppressed by adding silicon to the amorphous oxide semiconductor layer, an oxide semiconductor layer may be formed, for example, using a target containing SiO$_2$ of 2 wt % to 10 wt % inclusive.

As a target used for forming an oxide semiconductor layer with a sputtering method, a metal oxide target containing zinc oxide as its main component can be used, for example. Moreover, a metal oxide target containing In, Ga, and Zn (a composition ratio of $In_2O_3:Ga_2O_3:ZnO=1:1:1$ [molar ratio]) can be used, for example. Furthermore, as the metal oxide target containing In, Ga, and Zn, a target having a composition ratio of $In_2O_3:Ga_2O_3:ZnO=1:1:2$ (molar ratio) or a target having a composition ratio of $In_2O_3:Ga_2O_3:ZnO=1:1:4$ (molar ratio) can also be used. The filling rate of a metal oxide target is 90% to 100% inclusive, preferably, greater than or equal to 95% (e.g., 99.9%). A dense oxide semiconductor layer is formed by using a metal oxide target with a high filling rate.

The atmosphere in which the oxide semiconductor layer is formed is preferably a rare gas (typically, argon) atmosphere, an oxygen atmosphere, or a mixed atmosphere containing a rare gas (typically, argon) and oxygen. Specifically, it is preferable to use a high-purity gas, for example, from which an impurity such as hydrogen, water, a hydroxyl group, or hydride is removed to a concentration of a few ppm or less (preferably, a few ppb or less).

At the time of forming the oxide semiconductor layer, the substrate is held in a treatment chamber that is maintained at reduced pressure and the substrate temperature is set to 100° C. to 600° C. inclusive, preferably, 200° C. to 400° C. inclusive. The oxide semiconductor layer is formed while the substrate is heated, so that the impurity concentration in the oxide semiconductor layer can be reduced. Moreover, damage due to sputtering is reduced. Then, a sputtering gas from which hydrogen and water are removed is introduced into the treatment chamber while moisture remaining in the treatment chamber is being removed, and the oxide semiconductor layer is formed using metal oxide as a target. An entrapment vacuum pump is preferably used in order to remove moisture remaining in the treatment chamber. For example, a cryopump, an ion pump, or a titanium sublimation pump can be used. An evacuation unit may be a turbo pump provided with a cold trap. In the film formation chamber that is evacuated with the cryopump, a hydrogen atom, a compound containing a hydrogen atom such as water ($H_2O$) (and more preferably also a compound containing a carbon atom), and the like are removed, whereby the concentration of an impurity contained in the oxide semiconductor layer formed in the film formation chamber can be reduced.

The oxide semiconductor layer can be formed under the following conditions, for example: the distance between the substrate and the target is 100 mm; the pressure is 0.6 Pa; the direct-current (DC) power supply is 0.5 kW; and the atmosphere is oxygen (the proportion of the oxygen flow is 100%). Note that it is preferable to use a pulse direct current (DC) power source because dust can be reduced and the thickness distribution is uniform. The thickness of the oxide semiconductor layer is 2 nm to 200 nm inclusive, preferably, 5 nm to 30 nm inclusive. Note that since an appropriate thickness differs depending on an oxide semiconductor material, the thickness is set as appropriate depending on the material to be used.

Note that before the oxide semiconductor layer is formed with a sputtering method, dust on a surface of the gate insulating layer 138 is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which a high-frequency voltage is applied to the surface to be processed under an argon atmosphere so that plasma is generated near a substrate. Note that an atmosphere of nitrogen, helium, oxygen, or the like may be used instead of an argon atmosphere.

As an etching method for the oxide semiconductor layer, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron chloride ($BCl_3$), silicon chloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid, ammonia peroxide mixture (a mixture of ammonia, water, and a hydrogen peroxide solution), or the like can be used. An etchant such as ITO07N (produced by KANTO CHEMICAL CO., INC.) may also be used.

Then, first heat treatment is preferably performed on the oxide semiconductor layer. The oxide semiconductor layer can be dehydrated or dehydrogenated with the first heat treatment. The temperature of the first heat treatment is 300° C. to 750° C. inclusive, preferably, higher than or equal to 400° C. and lower than the strain point of the substrate. For example, the substrate is introduced into an electric furnace in which a resistance heating element or the like is used and the oxide semiconductor layer 140 is subjected to heat treatment at 450° C. for 1 hour under a nitrogen atmosphere. The oxide semiconductor layer 140 is not exposed to the air during the heat treatment so that entry of water and hydrogen can be prevented.

The heat treatment apparatus is not limited to the electric furnace and can be an apparatus for heating an object to be processed by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, a GRTA process may be performed as follows. The substrate is put in an inert gas that has been heated to a high temperature of 650° C. to 700° C., heated for several minutes, and taken out of the inert gas. The GRTA process enables high-temperature heat treatment for a short time. Moreover, the GRTA process can be employed even when the temperature exceeds the strain point of the substrate because it is heat treatment for a short time.

Note that the first heat treatment is preferably performed under an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably, greater than or equal to 7 N (99.99999%) (i.e., the impurity concentration is less than or equal to 1 ppm, preferably, less than or equal to 0.1 ppm).

In the case where an electrical furnace is used in the first heat treatment, an atmosphere can be changed when a heat treatment temperature falls. For example, an inert gas such as nitrogen or a rare gas such as helium, neon, or argon is used as an atmosphere during heat treatment, and the atmosphere is switched to an atmosphere containing oxygen when the heat treatment temperature falls. As the atmosphere containing oxygen, an oxygen gas or a mixed gas of an oxygen gas and a nitrogen gas can be used. In the case where the atmosphere containing oxygen is employed, it is preferable that the atmosphere do not contain water, hydrogen, or the like. Alternatively, the purity of the oxygen gas or the nitrogen used is preferably greater than or equal to 6N (99.9999%), more preferably, greater than or equal to 7N (99.99999%) (that is, the impurity concentration is less than or equal to 1 ppm, preferably less than or equal to 0.1 ppm).

In some cases, the oxide semiconductor layer is crystallized to be microcrystalline or polycrystalline, which depends on the conditions of the first heat treatment or the material of the oxide semiconductor layer. For example, in some cases, the oxide semiconductor layer becomes a microcrystalline oxide semiconductor layer having a degree of crystallization of 90% or more, or 80% or more. Further, in some cases the oxide semiconductor layer may be an amorphous oxide semiconductor layer containing no crystalline component, which depends on the conditions of the first heat treatment or the material of the oxide semiconductor layer.

Furthermore, in some cases, the oxide semiconductor layer becomes a layer in which a microcrystal (with a grain size of 1 nm to 20 nm inclusive, typically, 2 nm to 4 nm inclusive) is mixed in an amorphous oxide semiconductor (e.g., a surface of the oxide semiconductor layer).

The electric characteristics of the oxide semiconductor layer can be changed by aligning microcrystals in an amorphous semiconductor. For example, when the oxide semiconductor layer is formed using an In—Ga—Zn—O-based metal oxide target, the electric characteristics of the oxide semiconductor layer can be changed by formation of a microcrystalline portion in which crystal grains of $In_2Ga_2ZnO_7$ with electrical anisotropy are aligned.

More specifically, for example, when the crystal grains are arranged so that the c-axis of $In_2Ga_2ZnO_7$ is perpendicular to a surface of the oxide semiconductor layer, the conductivity in the direction parallel to the surface of the oxide semiconductor layer can be improved and insulating properties in the direction perpendicular to the surface of the oxide semiconductor layer can be improved. Furthermore, such a microcrystalline portion has a function of suppressing entry of an impurity such as water or hydrogen into the oxide semiconductor layer.

Note that the oxide semiconductor layer including the microcrystalline portion can be formed by heating the surface of the oxide semiconductor layer by a GRTA process. Further, the oxide semiconductor layer can be formed in a more preferred manner by using a sputtering target in which the amount of Zn is smaller than that of In or Ga.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography step is performed.

Note that the above-described heat treatment can be referred to as dehydration treatment, dehydrogenation treatment, or the like because of its effect of dehydration or dehydrogenation on the oxide semiconductor layer 140. Such dehydration treatment or dehydrogenation treatment can be performed, for example, after the oxide semiconductor layer is formed, after a source or drain electrode is stacked over the oxide semiconductor layer 140, or after a protective insulating layer is formed over the source or drain electrode. Such dehydration treatment or dehydrogenation treatment may be performed once or plural times.

Figure 5F:
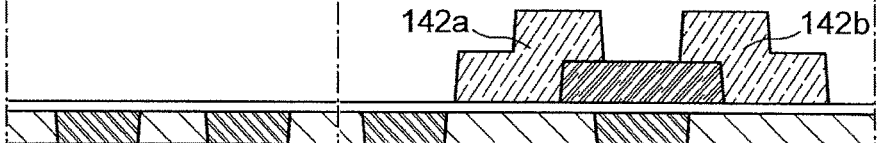

Next, the source or drain electrode 142*a* and the source or drain electrode 142*b* are formed in contact with the oxide semiconductor layer 140 (see FIG. 5F). The source or drain electrode 142*a* and the source or drain electrode 142*b* can be formed in such a manner that a conductive layer is formed to cover the oxide semiconductor layer 140 and then is selectively etched.

The conductive layer can be formed with a PVD (Physical Vapor Deposition) method such as a sputtering method, or a CVD (Chemical Vapor Deposition) method such as a plasma CVD method. As a material for the conductive layer, an element selected from aluminum, chromium, copper, tantalum, titanium, molybdenum, and tungsten; an alloy containing any of these elements as its component; or the like can be used. Moreover, one or more materials selected from manganese, magnesium, zirconium, beryllium, and thorium may be used instead of the above materials. It is also possible to use aluminum combined with one or more of elements selected from titanium, tantalum, tungsten, molybdenum, chromium, neodymium, and scandium. The conductive layer can have a single-layer structure or a stacked structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in this order. Alternatively, an In—Ga—Zn—O-based oxide conductive film, an In—Sn—O-based oxide conductive film, an In—Sn—Zn—O-based oxide conductive film, an In—Al—Zn—O-based oxide conductive film, a Sn—Ga—Zn—O-based oxide conductive film, an Al—Ga—Zn—O-based oxide conductive film, a Sn—Al—Zn—O-based oxide conductive film, an In—Zn—O-based oxide conductive film, a Sn—Zn—O-based oxide conductive film, an Al—Zn—O-based oxide conductive film, an In—O-based oxide conductive film, a Sn—O-based oxide conductive film, or a Zn—O-based oxide conductive film can be used. In that case, as compared to a material for the oxide semiconductor layer 140, a material whose conductivity is high or whose resistivity is low is preferably used. The conductivity of an oxide conductive film can be increased by an increase in the carrier concentration. The carrier concentration in an oxide conductive film can be increased by an increase in the hydrogen concentration. Further, the carrier concentration in an oxide conductive film can be increased by an increase in oxygen deficiency.

Here, ultraviolet light, KrF laser light, or ArF laser light is preferably used for light exposure at the time of forming a mask used for etching.

The channel length (L) of the transistor is determined by a distance between a lower edge portion of the source or drain electrode 142a and a lower edge portion of the source or drain electrode 142b. Note that in the case where light exposure is performed so that the channel length (L) is less than 25 nm, light exposure for forming a mask is performed with extreme ultraviolet rays whose wavelength is extremely short of several nanometers to several tens of nanometers. The resolution of light exposure with extreme ultraviolet rays is high and the depth of focus is large. For these reasons, it is possible to design a mask so that the channel length (L) of the transistor to be formed later is less than 25 nm, that is, in the range of 10 nm to 1000 nm inclusive, and the circuit can operate at higher speed. Moreover, the off-state current is extremely low, which prevents an increase in power consumption.

The materials and etching conditions of the conductive layer and the oxide semiconductor layer 140 are adjusted as appropriate so that the oxide semiconductor layer 140 is not removed in etching of the conductive layer. Note that in some cases, the oxide semiconductor layer 140 is partly etched in the etching step and thus has a groove portion (a recessed portion) depending on the materials and the etching conditions.

An oxide conductive layer may be formed between the oxide semiconductor layer 140 and the source or drain electrode 142a and between the oxide semiconductor layer 140 and the source or drain electrode 142b. The oxide conductive layer and a conductive layer for forming the source or drain electrode 142a and the source or drain electrode 142b can be successively formed. The oxide conductive layer can function as a source region or a drain region. By providing such an oxide conductive layer, the resistance of the source region or the drain region can be reduced, so that the transistor can operate at high speed.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps for processing into different patterns. That is, a resist mask corresponding to at least two kinds of different patterns can be formed by using a multi-tone mask. Thus, the number of light-exposure masks can be reduced and the number of corresponding photolithography steps can also be reduced, whereby a process can be simplified.

Note that plasma treatment is preferably performed with the use of a gas such as $N_2O$, $N_2$, or Ar after the above step. This plasma treatment removes water or the like attached to an exposed surface of the oxide semiconductor layer. Plasma treatment may be performed using a mixed gas of oxygen and argon.

Figure 5G:
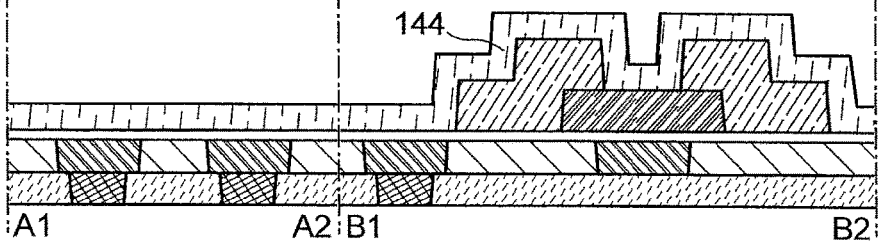

Next, the protective insulating layer 144 is formed in contact with part of the oxide semiconductor layer 140 without exposure to the air (see FIG. 5G).

The protective insulating layer 144 can be formed with a method such as a sputtering method, with which impurities such as water and hydrogen are prevented from being mixed to the protective insulating layer 144, as appropriate. The protective insulating layer 144 has a thickness of at least 1 nm. The protective insulating layer 144 can be formed using silicon oxide, silicon nitride, silicon oxynitride, silicon nitride oxide, or the like. The protective insulating layer 144 can have a single-layer structure or a stacked structure. The substrate temperature at the time of forming the protective insulating layer 144 is preferably room temperature to 300° C. inclusive. The atmosphere for forming the protective insulating layer 144 is preferably a rare gas (typically, argon) atmosphere, an oxygen atmosphere, or a mixed atmosphere containing a rare gas (typically, argon) and oxygen.

If hydrogen is contained in the protective insulating layer 144, the hydrogen may enter the oxide semiconductor layer or extract oxygen in the oxide semiconductor layer, whereby the resistance of the oxide semiconductor layer on the backchannel side might be decreased and a parasitic channel might be formed. Therefore, it is important not to use hydrogen in forming the protective insulating layer 144 so that the oxide insulating layer 144 contains hydrogen as little as possible.

Moreover, the protective insulating layer 144 is preferably formed while water left in the treatment chamber is removed, in order that hydrogen, a hydroxyl group, or moisture is not contained in the oxide semiconductor layer 140 and the protective insulating layer 144.

An entrapment vacuum pump is preferably used in order to remove moisture remaining in the treatment chamber. For example, a cryopump, an ion pump, or a titanium sublimation pump is preferably used. An evacuation unit may be a turbo pump provided with a cold trap. In the film formation chamber that is evacuated with the cryopump, a hydrogen atom and a compound containing a hydrogen atom, such as water ($H_2O$), are removed, for example; thus, the concentration of an impurity contained in the protective insulating layer 144 formed in the film formation chamber can be reduced.

As a sputtering gas used at the time of forming the protective insulating layer 144, it is preferable to use a high-purity gas from which an impurity such as hydrogen, water, a hydroxyl group, or hydride is removed to a concentration of a few ppm or less (preferably, a few ppb or less).

Next, second heat treatment is preferably performed under an inert gas atmosphere or an oxygen gas atmosphere (preferably, at 200° C. to 400° C. inclusive, for example, at 250° C. to 350° C. inclusive). For example, the second heat treatment is performed at 250° C. for 1 hour under a nitrogen atmosphere. The second heat treatment can reduce variation in electric characteristics of the transistor.

Furthermore, heat treatment may be performed at 100° C. to 200° C. inclusive for 1 hour to 30 hours inclusive in the air. This heat treatment may be performed at a fixed heating temperature; alternatively, the following change in the heating temperature may be repeatedly performed plural times: the heating temperature is increased from room temperature to a temperature of 100° C. to 200° C. inclusive and then decreased to room temperature. This heat treatment may be performed under a reduced pressure before the protective insulating layer is formed. The heat treatment time can be shortened under the reduced pressure. This heat treatment may be performed instead of the second heat treatment or may be performed before or after the second heat treatment.

Figure 6A:
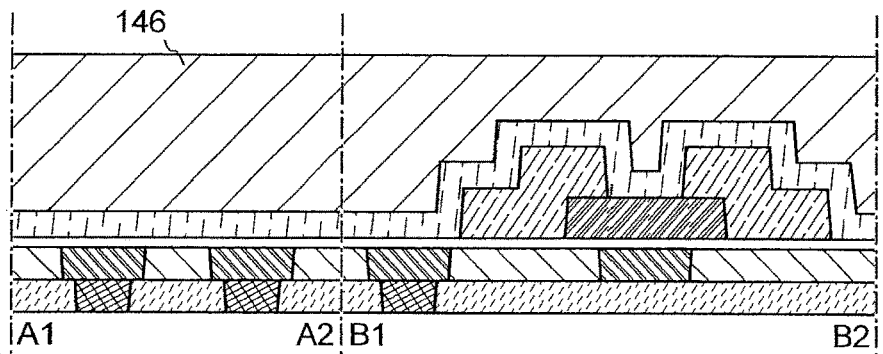
FIGS. 6A to 6D illustrate an example of a method for manufacturing elements of a nonvolatile latch circuit.
Figure 6B:
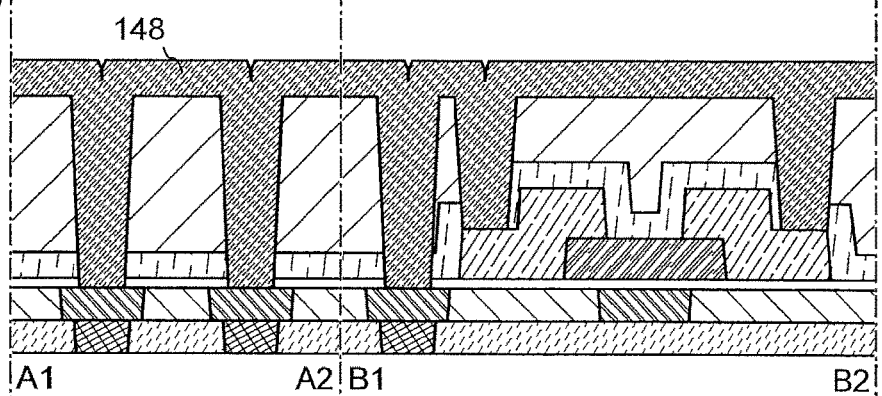

Next, the interlayer insulating layer 146 is formed over the protective insulating layer 144 (see FIG. 6A). The interlayer insulating layer 146 can be formed with a PVD method, a CVD method, or the like. The interlayer insulating layer 146 can be formed using an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized with a method such as CMP or etching.

Next, openings that reach the electrode 136a, the electrode 136b, the electrode 136c, the source or drain electrode 142a, and the source or drain electrode 142b are formed in the interlayer insulating layer 146, the protective insulating layer 144, and the gate insulating layer 138. Then, a conductive layer 148 is formed to be embedded in the openings (see FIG. 6B). The openings can be formed with a method such as etching using a mask. The mask can be formed with a method such as light exposure using a photomask. Either wet etching or dry etching may be used as the etching; dry etching is preferably used in terms of microfabrication. The conductive layer 148 can be formed with a film formation method such as a PVD method or a CVD method. The conductive layer 148 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings with a PVD method and a thin titanium nitride film is formed with a CVD method, and then, a tungsten film is formed to be embedded in the openings. Here, the titanium film formed with a PVD method has a function of reducing an oxide film at the interface with the interlayer insulating layer 146 to decrease the contact resistance with lower electrodes (here, the electrode 136a, the electrode 136b, the electrode 136c, the source or drain electrode 142a, and the source or drain electrode 142b). The titanium nitride film formed after the formation of the titanium film has a barrier function of preventing diffusion of the conductive material. A copper film may be formed with a plating method after the formation of the barrier film of titanium, titanium nitride, or the like.

Figure 6C:
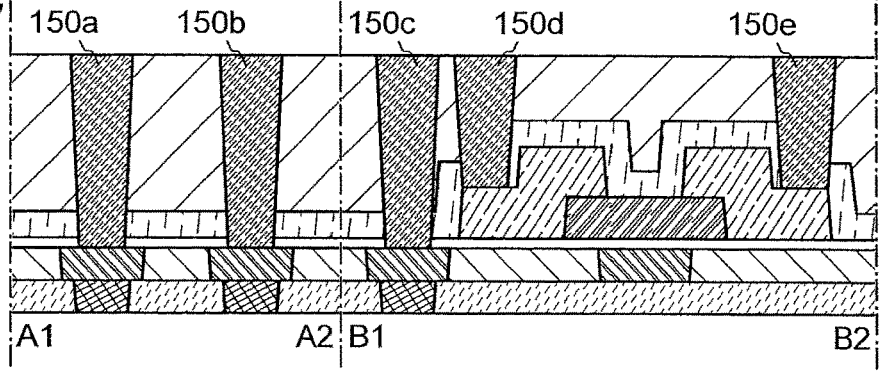

After the conductive layer 148 is formed, part of the conductive layer 148 is removed with a method such as etching or CMP, so that the interlayer insulating layer 146 is exposed and the electrode 150a, the electrode 150b, the electrode 150c, the electrode 150d, and the electrode 150e are formed (see FIG. 6C). Note that when the electrode 150a, the electrode 150b, the electrode 150c, the electrode 150d, and the electrode 150e are formed by removing part of the conductive layer 148, the process is preferably performed so that the surfaces are planarized. When the surfaces of the interlayer insulating layer 146, the electrode 150a, the electrode 150b, the electrode 150c, the electrode 150d, and the electrode 150e are planarized in such a manner, an electrode, a wiring, an insulating layer, a semiconductor layer, and the like can be favorably formed in later steps.

Then, the insulating layer 152 is formed, and openings that reach the electrode 150a, the electrode 150b, the electrode 150c, the electrode 150d, and the electrode 150e are formed in the insulating layer 152. After a conductive layer is formed to be embedded in the openings, part of the conductive layer is removed with a method such as etching or CMP. Thus, the insulating layer 152 is exposed and the electrode 154a, the electrode 154b, the electrode 154c, and the electrode 154d are formed (see FIG. 6D). This step is similar to the step of forming the electrode 150a and the like; therefore, the detailed description is omitted.

In the case where the transistor 402 is formed with the above-described method, the hydrogen concentration in the oxide semiconductor layer 140 is $5 \times 10^{19}$ atoms/cm$^3$ or less and the off-state current of the transistor 402 is $1 \times 10^{-13}$ A or less. The transistor 402 with excellent characteristics can be obtained by the application of the oxide semiconductor layer 140 that is highly purified by sufficiently reducing the hydrogen concentration as described above. Moreover, it is possible to manufacture a semiconductor device that has excellent characteristics and includes the transistor 421 formed using a material other than an oxide semiconductor in the lower portion and the transistor 402 formed using an oxide semiconductor in the upper portion.

Note that silicon carbide (e.g., 4H—SiC) is given as a semiconductor material which can be compared with an oxide semiconductor. An oxide semiconductor and 4H—SiC have some things in common. The carrier density is one of them. In accordance with Fermi-Dirac distribution, the density of minority carriers in an oxide semiconductor is estimated to be approximately $10^{-7}$/cm$^3$. This value of the minority carrier density is extremely small similarly to that in 4H—SiC, $6.7 \times 10^{-11}$/cm$^3$. When the minority carrier density of an oxide semiconductor is compared with the intrinsic carrier density of silicon (approximately $1.4 \times 10^{10}$/cm$^3$), it can be understood well that the minority carrier density of an oxide semiconductor is significantly low.

Further, the energy band gap of an oxide semiconductor is 3.0 eV to 3.5 eV and the energy band gap of 4H—SiC is 3.26 eV. Thus, an oxide semiconductor and silicon carbide are similar in that they are both wide-gap semiconductors.

On the other hand, there is a major difference between an oxide semiconductor and silicon carbide, that is, the process temperature. Since heat treatment at 1500° C. to 2000° C. is generally needed in a semiconductor process using silicon carbide, it is difficult to form a stack of silicon carbide and a semiconductor element formed using a semiconductor material other than silicon carbide. This is because a semiconductor substrate, the semiconductor element, or the like is damaged at such high temperatures. Meanwhile, an oxide semiconductor can be formed with heat treatment at 300° C. to 500° C. (the glass transition temperature or lower, up to about 700° C.); therefore, it is possible to form an integrated circuit with the use of a semiconductor material other than an oxide semiconductor and then to form a semiconductor element including an oxide semiconductor.

In addition, in contrast to silicon carbide, an oxide semiconductor is advantageous because a low heat-resistant substrate such as a glass substrate can be used. Moreover, an oxide semiconductor does not need to be subjected to heat treatment at high temperature, so that energy cost can be reduced sufficiently as compared to silicon carbide, which is another advantage.

Although a lot of researches on properties of an oxide semiconductor such as density of state (DOS) have been conducted, they do not include the idea of sufficiently reducing the DOS itself. According to an embodiment of the invention disclosed herein, a highly purified oxide semiconductor is formed by removing water or hydrogen which might affect the DOS. This is based on the idea that the DOS itself is sufficiently reduced. Such a highly purified oxide semiconductor enables fabrication of very excellent industrial products.

Further, it is also possible to form a more highly purified (i-type) oxide semiconductor by supplying oxygen to a dangling bond of metal which is generated by oxygen vacancy and reducing the DOS due to the oxygen vacancy. For example, an oxide film containing excessive oxygen is formed in close contact with a channel formation region and then oxygen is supplied to the channel formation region from the oxide film, so that the DOS due to oxygen vacancy can be reduced.

A defect of an oxide semiconductor is said to be attributed to a level of 0.1 eV to 0.2 eV under the conduction band due to excessive hydrogen, a deep level due to shortage of oxygen, or the like. Thorough removal of hydrogen and sufficient supply of oxygen for elimination of such a defect would be right as a technological thought.

An oxide semiconductor is generally considered as an n-type semiconductor; however, according to an embodiment of the invention disclosed herein, an i-type semiconductor is realized by removing impurities, particularly water and hydrogen. In this respect, it can be said that an embodiment of the invention disclosed herein includes a novel technical idea because it is different from an i-type semiconductor such as silicon added with an impurity.

<Electrical Conduction Mechanism of Transistor Using Oxide Semiconductor>

An electrical conduction mechanism of a transistor using an oxide semiconductor will be described with reference to FIG. 7, FIG. 8, FIGS. 9A and 9B, and FIG. 10. Note that the following description is based on the assumption of an ideal situation for easy understanding and does not necessarily reflect a real situation. Note also that the following description is just a consideration and does not affect the validity of the invention.

Figure 7:
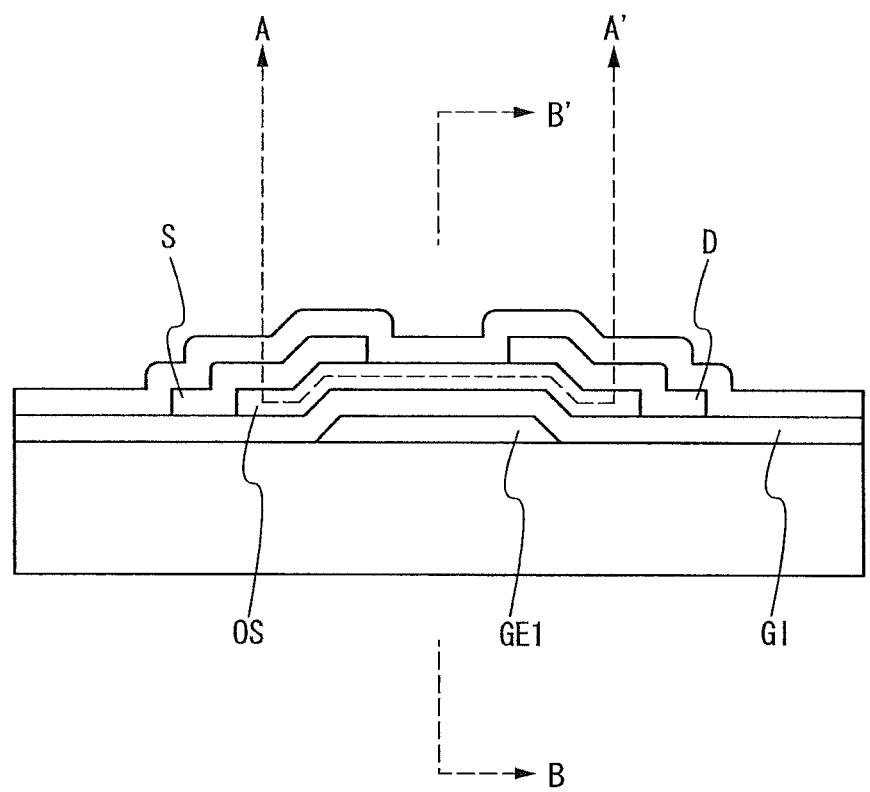
FIG. 7 illustrates an example of a cross-sectional structure of an inverted staggered transistor using an oxide semiconductor.

FIG. 7 is a cross-sectional view of an inverted staggered transistor (thin film transistor) using an oxide semiconductor. An oxide semiconductor layer (OS) is provided over a gate electrode (GE1) with a gate insulating layer (GI) interposed therebetween, and a source electrode (S) and a drain electrode (D) are provided over the oxide semiconductor layer. An insulating layer is provided so as to cover the source electrode (S) and the drain electrode (D).

Figure 8:
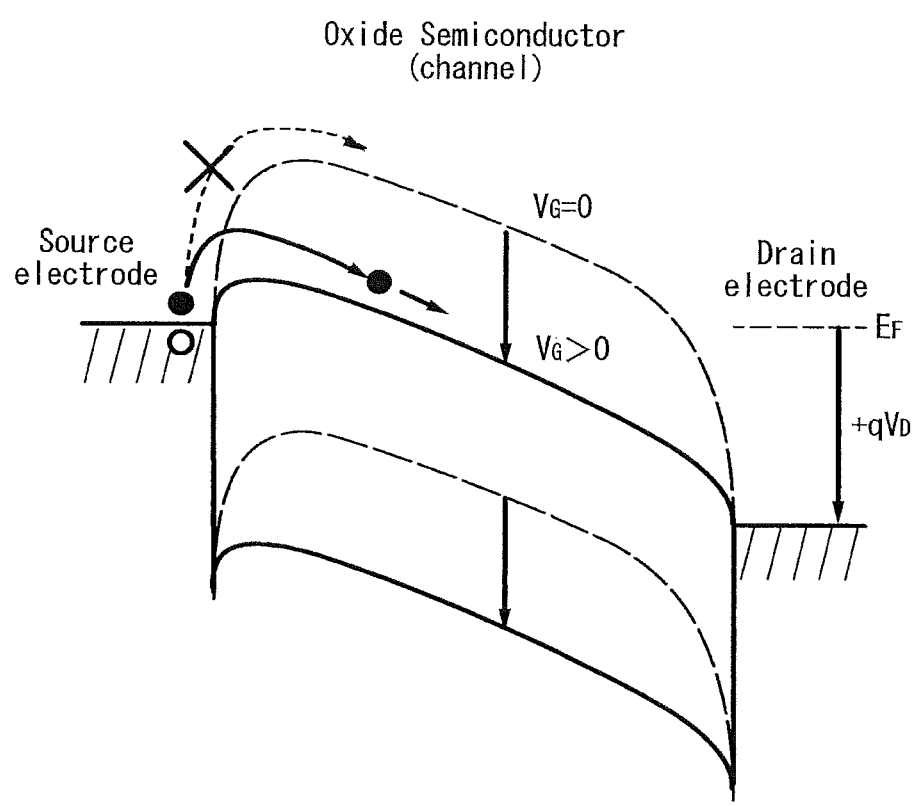
FIG. 8 is an energy band diagram (schematic diagram) along an A-A' section in FIG. 7.

FIG. 8 is an energy band diagram (schematic diagram) of the cross section A-A' in FIG. 7. In FIG. 8, a black circle (●) and a white circle (○) represent an electron and a hole and have electric charges (−q, +q), respectively. With a positive voltage ($V_D$>0) applied to the drain electrode, the dashed line shows the case where no voltage is applied to the gate electrode ($V_G$=0) and the solid line shows the case where a positive voltage is applied to the gate electrode ($V_G$>0). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

Figure 9A:
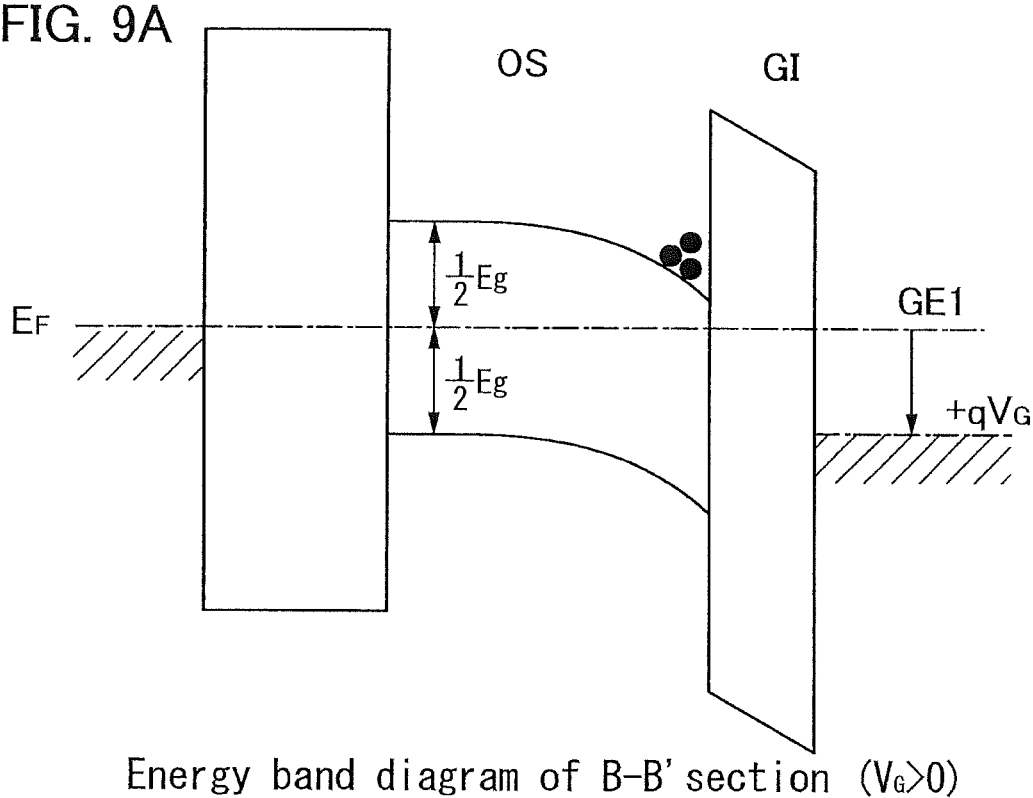
FIG. 9A illustrates a state where a positive potential ($+V_G$) is applied to a gate (G1)
Figure 9B:
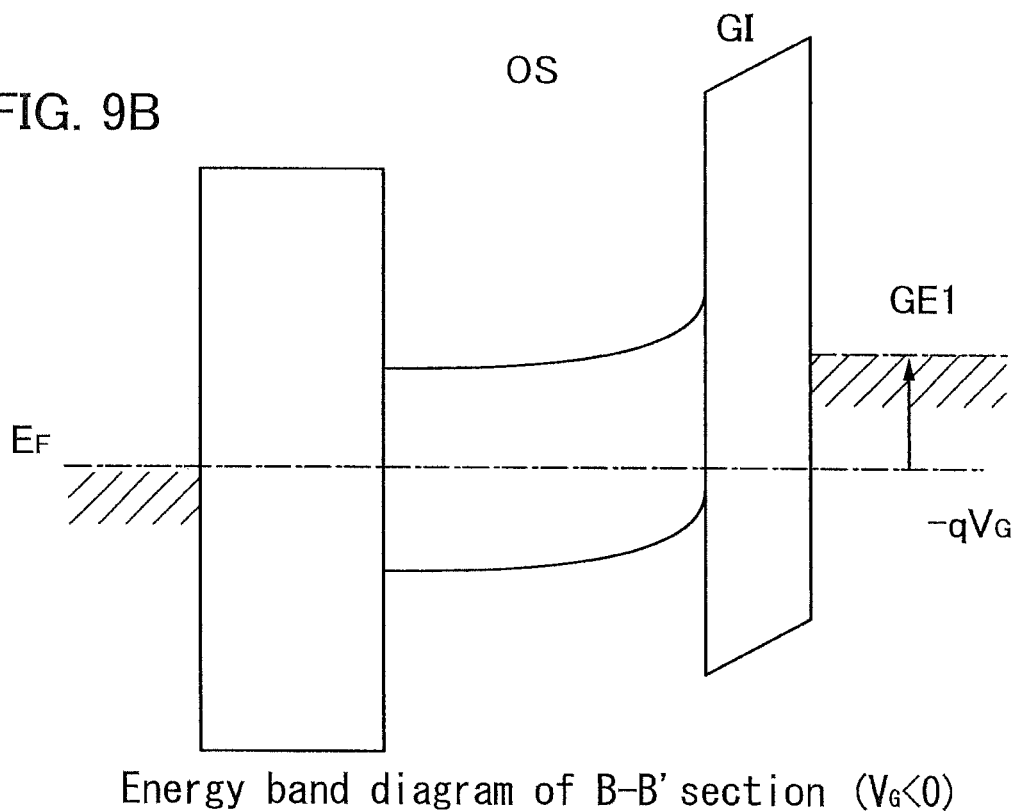
FIG. 9B illustrates a state where a negative potential ($-V_G$) is applied to the gate (G1).

FIGS. 9A and 9B are energy band diagrams (schematic diagrams) along the cross section B-B' in FIG. 7. FIG. 9A illustrates a state where a positive voltage ($V_G$>0) is applied to a gate electrode (GE1), that is, an on state where a carrier (electron) flows between a source electrode and a drain electrode. FIG. 9B illustrates a state where a negative voltage ($V_G$<0) is applied to the gate electrode (GE1), that is, an off state (where a minority carrier does not flow).

Figure 10:
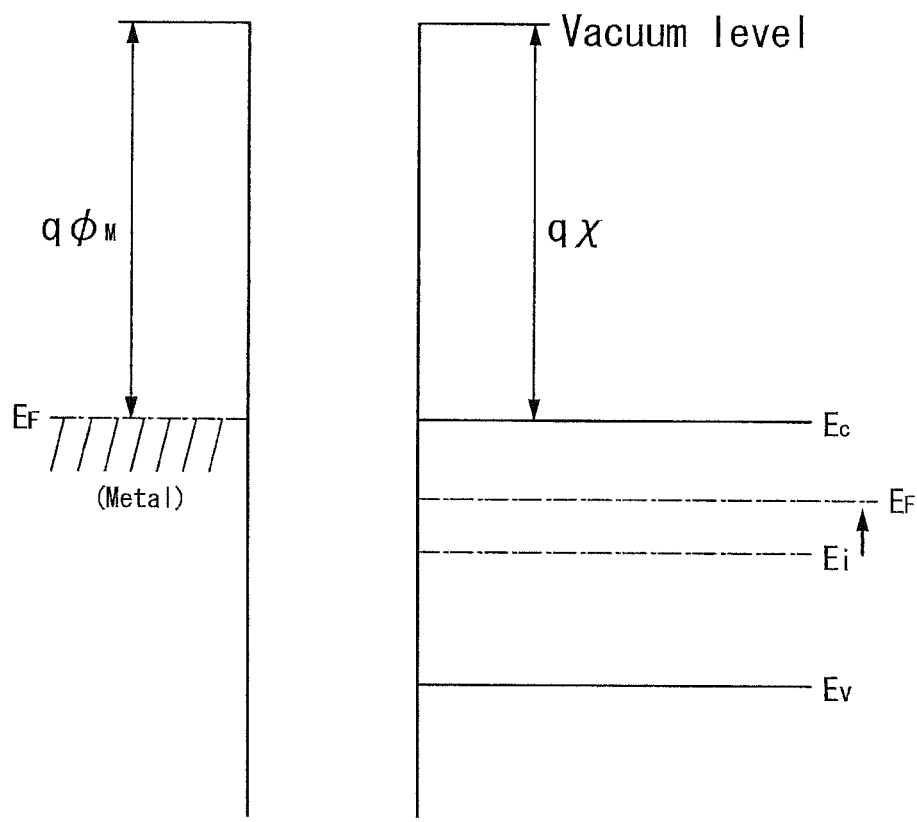
FIG. 10 is illustrates the relationships between the vacuum level and the work function of a metal ($\phi_M$) and between the vacuum level and the electron affinity ($\chi$) of an oxide semiconductor.

FIG. 10 illustrates the relationships between the vacuum level and the work function of a metal (ϕM) and between the vacuum level and the electron affinity (χ) of an oxide semiconductor.

At normal temperature, electrons in the metal are degenerated and the Fermi level is located in the conduction band.

Meanwhile, a conventional oxide semiconductor is n-type, and the Fermi level ($E_F$) is distant from the intrinsic Fermi level ($E_i$) in the center of the band gap and is located near the conduction band. It is known that part of hydrogen is a donor in an oxide semiconductor and is one factor causing an oxide semiconductor to be an n-type oxide semiconductor.

In contrast, an oxide semiconductor according to an embodiment of the invention disclosed herein is an oxide semiconductor that is made to be intrinsic (i-type) or to be close to intrinsic in the following manner: hydrogen, which is the cause to produce an n-type oxide semiconductor, is removed from the oxide semiconductor for high purification, so that the oxide semiconductor includes an element (impurity element) other than its main component of the oxide semiconductor as little as possible.

That is, a feature of an embodiment of the invention disclosed herein is that an oxide semiconductor is made to be or be close to a highly purified i-type (intrinsic) semiconductor not by addition of an impurity element but by elimination of impurities such as hydrogen and water as much as possible. Thus, the Fermi level ($E_F$) can be comparable with the intrinsic Fermi level ($E_i$).

It is said that the band gap ($E_g$) of an oxide semiconductor is 3.15 eV, the electron affinity (χ) thereof is said to be 4.3 eV. The work function of titanium (Ti) contained in a source electrode and a drain electrode is substantially equal to the electron affinity (χ) of an oxide semiconductor. In this case, a Schottky barrier against an electron is not formed at the interface between metal and an oxide semiconductor.

At that time, as illustrated in FIG. 9A, the electron travels in the vicinity of the interface between a gate insulating layer and the highly purified oxide semiconductor (the bottom portion where the oxide semiconductor is stable in terms of energy).

As illustrated in FIG. 9B, when a negative potential is supplied to the gate electrode (GE1), a hole which is a minority carrier does not exist substantially. Thus, the current value is substantially close to zero.

In such a manner, the oxide semiconductor becomes intrinsic (an i-type semiconductor) or substantially intrinsic by being highly purified so as to contain an element other than its main component (i.e., an impurity element) as little as possible. Thus, characteristics of the interface between the oxide semiconductor and the gate insulating layer become important. For that reason, the gate insulating layer needs to form a favorable interface with the oxide semiconductor. Specifically, it is preferable to use the following insulating layer, for example: an insulating layer formed with a CVD method using high-density plasma generated with a power source frequency in the range of the VHF band to the microwave band, or an insulating layer formed with a sputtering method.

When the interface between the oxide semiconductor and the gate insulating layer is made favorable while the oxide semiconductor is highly purified, in the case where the transistor has a channel width W of $1 \times 10^4$ μm and a channel length L of 3 μm, for example, it is possible to realize an off-state current of $10^{-13}$ A or less and a subthreshold swing (S value) of 0.1 V/dec. (a gate insulating layer: 100 nm thickness).

When the oxide semiconductor is highly purified as described above so as to contain an element other than its main component (i.e., an impurity element) as little as possible, the transistor can operate in a favorable manner.

<Resistance of Transistor Using Oxide Semiconductor to Hot Carrier Degradation>

Next, the resistance of a transistor using an oxide semiconductor to hot carrier degradation will be described with reference to FIG. 11, FIG. 12, and FIG. 13. Note that the following description is based on the assumption of an ideal situation for easy understanding and does not necessarily reflect a real situation. Note also that the following description is just a consideration.

Main causes of hot carrier degradation are channel hot electron injection (CHE injection) and drain avalanche hot carrier injection (DAHC injection). Note that only electrons are considered below for simplicity.

CHE injection refers to a phenomenon in which electrons having gained energy higher than the barrier of a gate insulating layer in a semiconductor layer are injected into the gate insulating layer or the like. Electrons gain energy by being accelerated by a low electric field.

DAHC injection refers to a phenomenon in which electrons generated by collision of electrons accelerated by a high electric field are injected to a gate insulating layer or the like. A difference between DAHC injection and CHE injection is whether or not they involve avalanche breakdown caused by impact ionization. Note that DAHC injection requires electrons having a kinetic energy higher than a band gap of a semiconductor.

Figure 11:
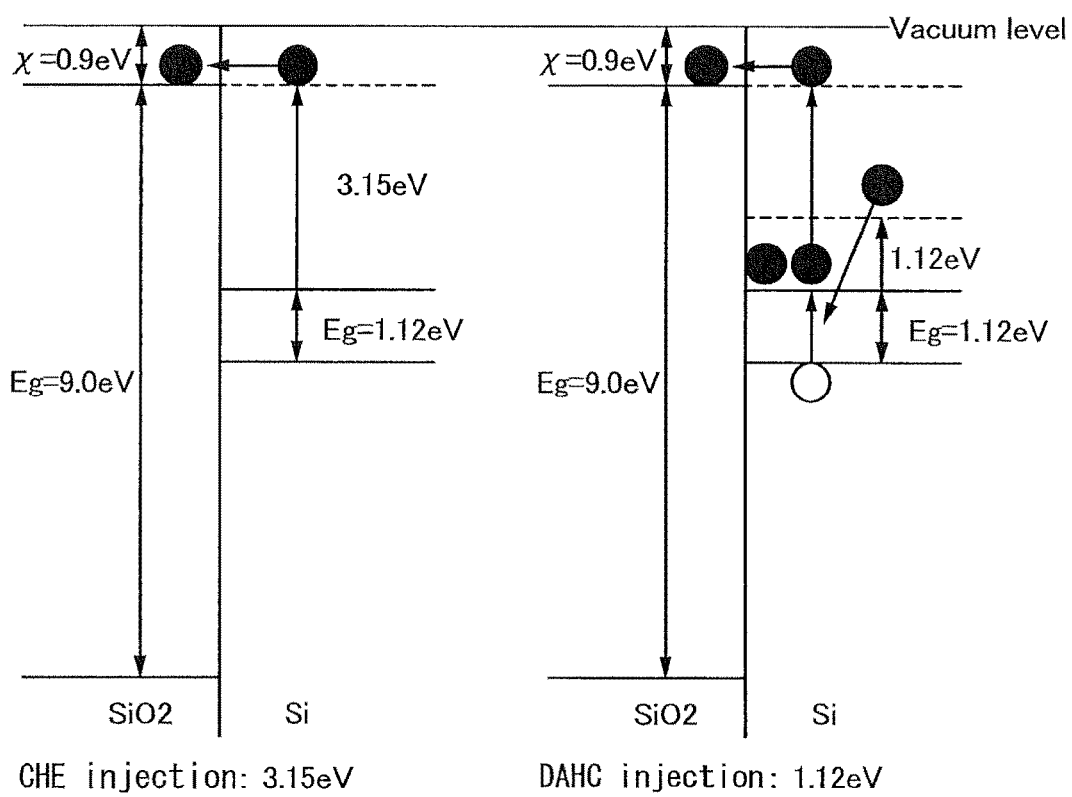
FIG. 11 illustrates energy required for hot carrier injection in silicon (Si).
Figure 12:
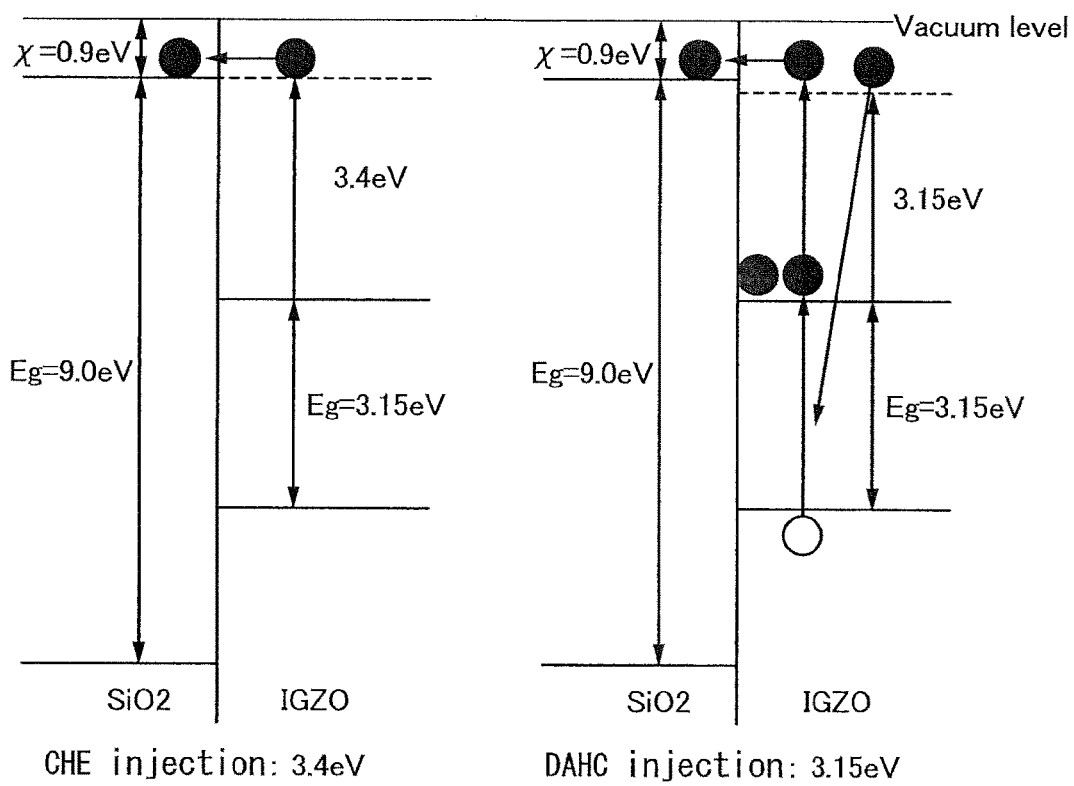
FIG. 12 illustrates energy required for hot carrier injection in an In—Ga—Zn—O-based oxide semiconductor (IGZO).
Figure 13:
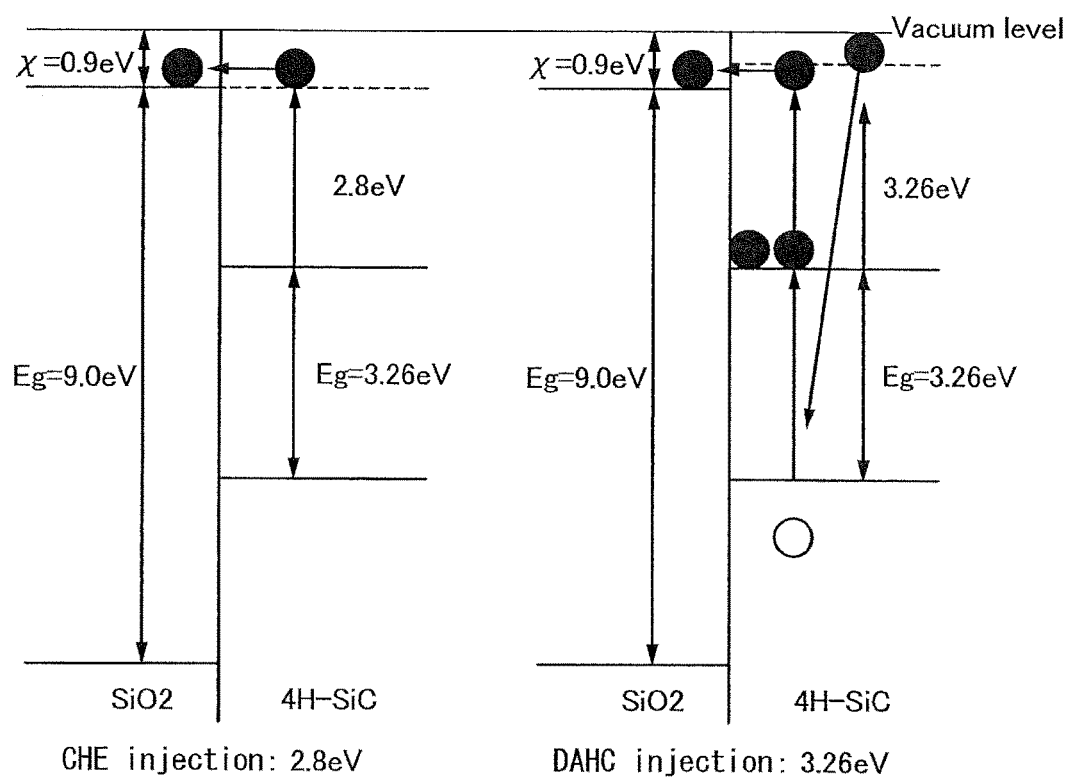
FIG. 13 illustrates energy required for hot carrier injection in silicon carbide (4H—SiC).

FIG. 11 illustrates energy required for each hot carrier injection which is estimated from the band structure of silicon (Si), and FIG. 12 illustrates energy required for each hot carrier injection which is estimated from the band structure of an In—Ga—Zn—O-based oxide semiconductor (IGZO). The left of each of FIG. 11 and FIG. 12 show CHE injection, and the right of each of FIG. 11 and FIG. 12 show DAHC injection.

Regarding silicon, degradation caused by DAHC injection is more serious than that caused by CHE injection. This results from the fact that carriers (e.g., electrons) which are accelerated without colliding are very few in silicon whereas silicon has a narrow band gap and avalanche breakdown readily occurs therein. The avalanche breakdown increases the number of electrons capable of crossing over the barrier of the gate insulating layer, and the probability of DAHC injection readily becomes higher than that of CHE injection.

Regarding an In—Ga—Zn—O-based oxide semiconductor, the energy required for CHE injection does not greatly differ from that in the case of silicon, and the probability of CHE injection is still low. In addition, the energy required for DAHC injection is substantially equal to the energy required for CHE injection due to a wide band gap.

In other words, the probabilities of both CHE injection and DAHC injection are low and the resistance to hot carrier degradation is higher than that of silicon.

Meanwhile, the band gap of an In—Ga—Zn—O-based oxide semiconductor is comparable to that of silicon carbide (SiC) which attracts attention as a material having a high withstand voltage. FIG. 13 illustrates energy required for each hot carrier injection regarding 4H—SiC. Regarding CHE injection, an In—Ga—Zn—O-based oxide semiconductor has a slightly higher threshold and can be said to have an advantage.

As described above, it can be seen that an In—Ga—Zn—O-based oxide semiconductor has significantly higher resistance to hot carrier degradation and higher resistance to source-drain breakdown than silicon. It can also be said that a withstand voltage comparable to that of silicon carbide can be obtained.

<Short-channel Effect in Transistor Using Oxide Semiconductor>

Next, a short-channel effect in a transistor using an oxide semiconductor will be described with reference to FIG. 14 and FIG. 15. Note that the following description is based on the assumption of an ideal situation for easy understanding and does not necessarily reflect a real situation. Note also that the following description is just a consideration.

The short-channel effect refers to degradation of electric characteristics which becomes obvious with miniaturization of a transistor (a reduction in channel length (L)). The short-channel effect results from the effect of a drain on a source. Specific examples of the short-channel effect are a decrease in threshold voltage, an increase in subthreshold swing (S value), an increase in leakage current, and the like.

Here, a structure capable of suppressing a short-channel effect is examined by device simulation. Specifically, four kinds of models each having a different carrier concentration and a different thickness of an oxide semiconductor layer were prepared, and the relationship between a channel length (L) and a threshold voltage ($V_{th}$) was checked. As the models, bottom-gate transistors were employed, in each of which an oxide semiconductor had a carrier concentration of $1.7 \times 10^{-8}/cm^3$ or $1.0 \times 10^{15}/cm^3$ and an oxide semiconductor layer with a thickness of 1 μm or 30 nm. Note that an In—Ga—Zn—O-based oxide semiconductor was used for the oxide semiconductor layer, and a silicon oxynitride film with a thickness of 100 nm was used as a gate insulating layer. It was assumed that, in the oxide semiconductor, the band gap was 3.15 eV, the electron affinity was 4.3 eV, the relative permittivity was 15, and the electron mobility was 10 $cm^2$/Vs. The relative permittivity of the silicon oxynitride film was assumed to be 4.0. The calculation was performed using device simulation software "ATLAS" produced by Silvaco Inc.

Note that there is no significant difference in calculation results between a top-gate transistor and a bottom-gate transistor.

Figure 14:
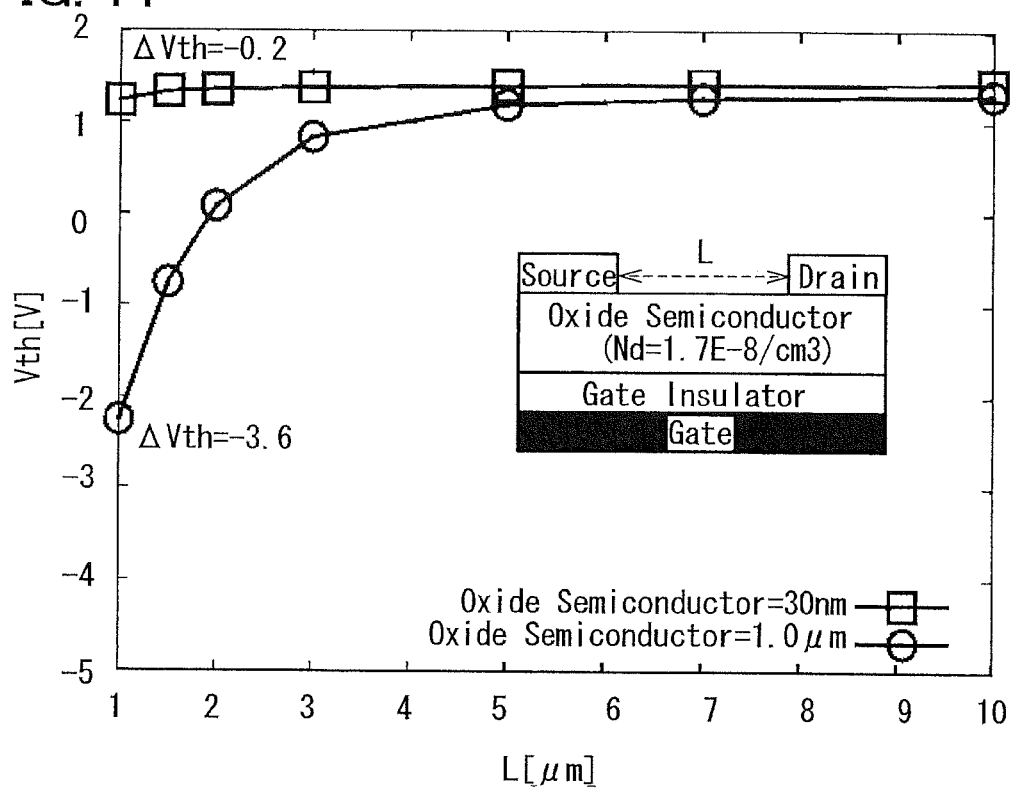
FIG. 14 shows the results of device simulation as to short-channel effect.
Figure 15:
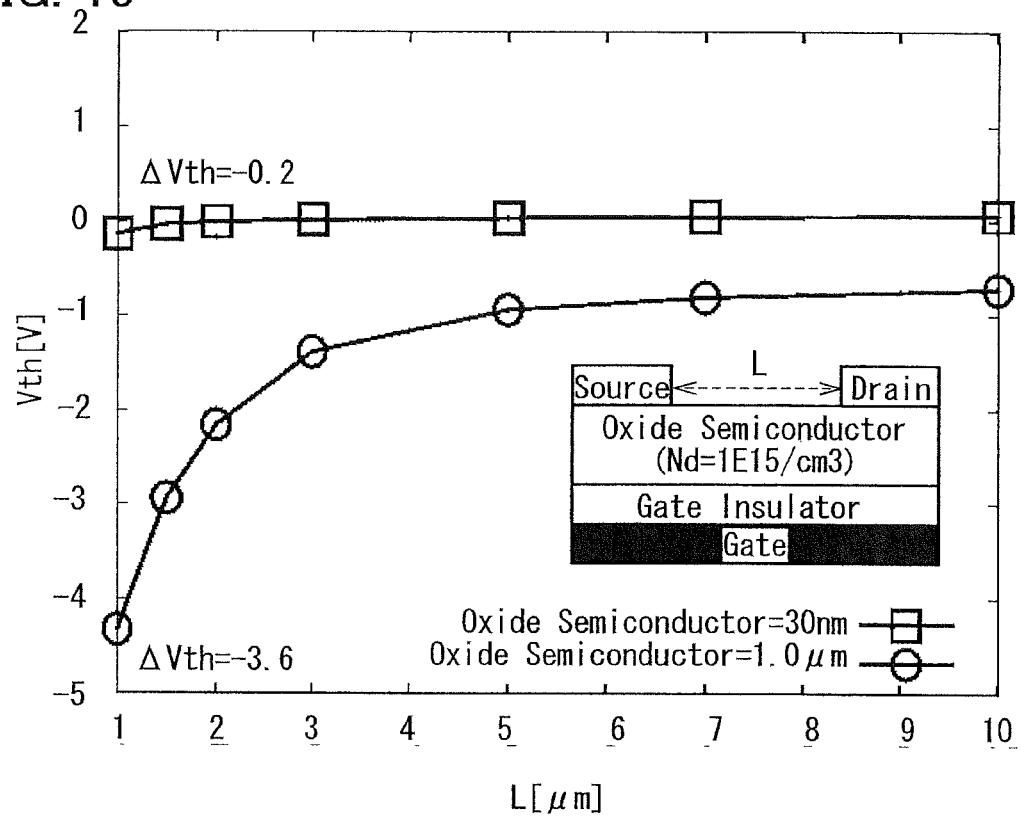
FIG. 15 shows the results of device simulation as to short-channel effect.

FIG. 14 and FIG. 15 show calculation results. FIG. 14 shows the case where the carrier concentration is $1.7 \times 10^{-8}/cm^3$, and FIG. 15 shows the case where the carrier concentration is $1.0 \times 10^{15}/cm^3$. FIG. 14 and FIG. 15 each show the amount of change ($\Delta V_{th}$) in threshold voltage ($V_{th}$) when a transistor whose channel length (L) is 10 μm is used as a reference and channel lengths (L) vary from 10 μm to 1 μm. As shown in FIG. 14, in the case where the carrier concentration in the oxide semiconductor was $1.7 \times 10^{-8}/cm^3$ and the thickness of the oxide semiconductor layer was 1 μm, the amount of change ($\Delta V_{th}$) in threshold voltage was −3.6 V. Moreover, as shown in FIG. 14, in the case where the carrier concentration in the oxide semiconductor was $1.7 \times 10^{-8}/cm^3$ and the thickness of the oxide semiconductor layer was 30 nm, the amount of change ($\Delta V_{th}$) in threshold voltage was −0.2 V. In addition, as shown in FIG. 15, in the case where the carrier concentration in the oxide semiconductor was $1.0 \times 10^{15}/cm^3$ and the thickness of the oxide semiconductor layer was 1 μm, the amount of change ($\Delta V_{th}$) in threshold voltage was −3.6 V. Moreover, as shown in FIG. 15, in the case where the carrier concentration in the oxide semiconductor was $1.0 \times 10^{15}/cm^3$ and the thickness of the oxide semiconductor layer was 30 nm, the amount of change ($\Delta V_{th}$) in threshold voltage was −0.2 V. The results show that a short-channel effect can be suppressed in a transistor using an oxide semiconductor by a reduction in thickness of an oxide semiconductor layer. For example, in the case where the channel length (L) is approximately 1 μm, even with an oxide semiconductor layer having sufficiently high carrier concentration, it can be understood that a short-channel effect can be sufficiently suppressed when the thickness of the oxide semiconductor layer is set to approximately 30 nm.

<Carrier Concentration>

A technical idea according to the invention disclosed herein is to make an oxide semiconductor layer as close as possible to an intrinsic (i-type) oxide semiconductor layer by sufficiently reducing the carrier concentration thereof. A method for calculating the carrier concentration and an actually measured carrier concentration will be described with reference to FIG. 16 and FIG. 17.

First, a method for calculating the carrier concentration is briefly explained. The carrier concentration can be calculated in such a manner that a MOS capacitor is manufactured and the results of C-V measurement (C-V characteristics) of the MOS capacitor are evaluated.

More specifically, carrier concentration $N_d$ can be calculated in the following manner: C-V characteristics are obtained by plotting the relationship between the gate voltage $V_G$ and capacitance C of a MOS capacitor; a graph of the relationship between the gate voltage $V_G$ and $(1/C)^2$ is obtained from the C-V characteristics; a differential value of $(1/C)^2$ in a weak inversion region of the graph is found; and the differential value is substituted into Formula 1. Note that e, $\varepsilon_0$, and $\varepsilon$ in Formula 1 represent elementary electric charge, vacuum permittivity, and relative permittivity of an oxide semiconductor, respectively.

[Formula 1]

$$N_d = -\left(\frac{2}{e\varepsilon_0\varepsilon}\right) \bigg/ \frac{d(1/C)^2}{dV} \quad (1)$$

Next, carrier concentration actually measured with the above method is described. A sample (a MOS capacitor) used for the measurement was formed as follows: a titanium film was formed to a thickness of 300 nm over a glass substrate; a titanium nitride film was formed to a thickness of 100 nm over the titanium film; an oxide semiconductor layer using an In—Ga—Zn—O-based oxide semiconductor was formed to a thickness of 2 μm over the titanium nitride film; a silicon oxynitride film was formed to a thickness of 300 nm over the oxide semiconductor layer, and a silver film was formed to a thickness of 300 nm over the silicon oxynitride film. Note that the oxide semiconductor layer was formed using a metal oxide target including In, Ga, and Zn (In:Ga:Zn=1:1:0.5 [atom %]) with a sputtering method. Further, an atmosphere in which the oxide semiconductor layer was formed was a mixed atmosphere of argon and oxygen (with a flow ratio of Ar:O$_2$=30 (sccm): 15 (sccm)).

Figure 16:
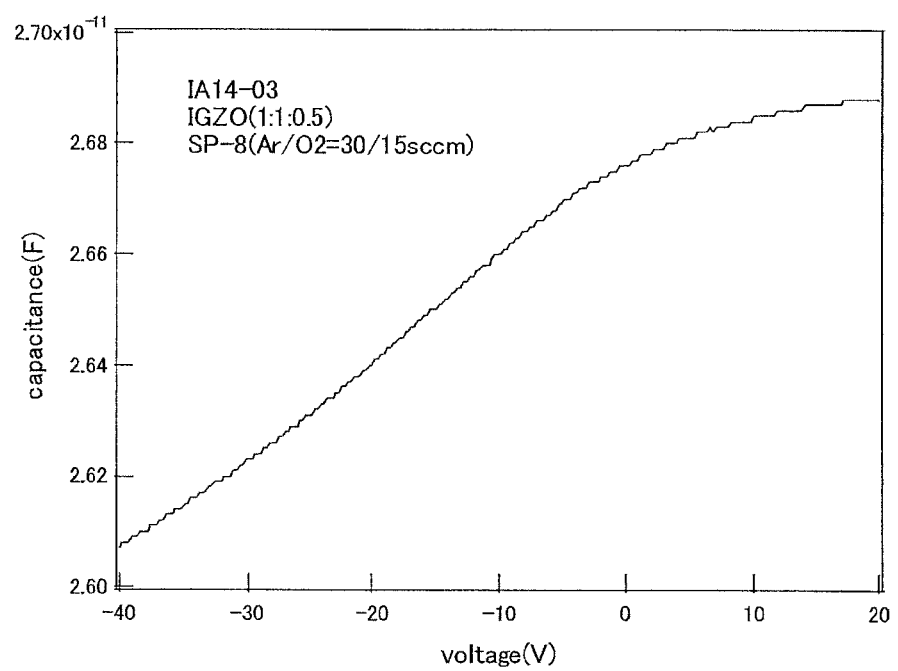
FIG. 16 shows C-V characteristics.
Figure 17:
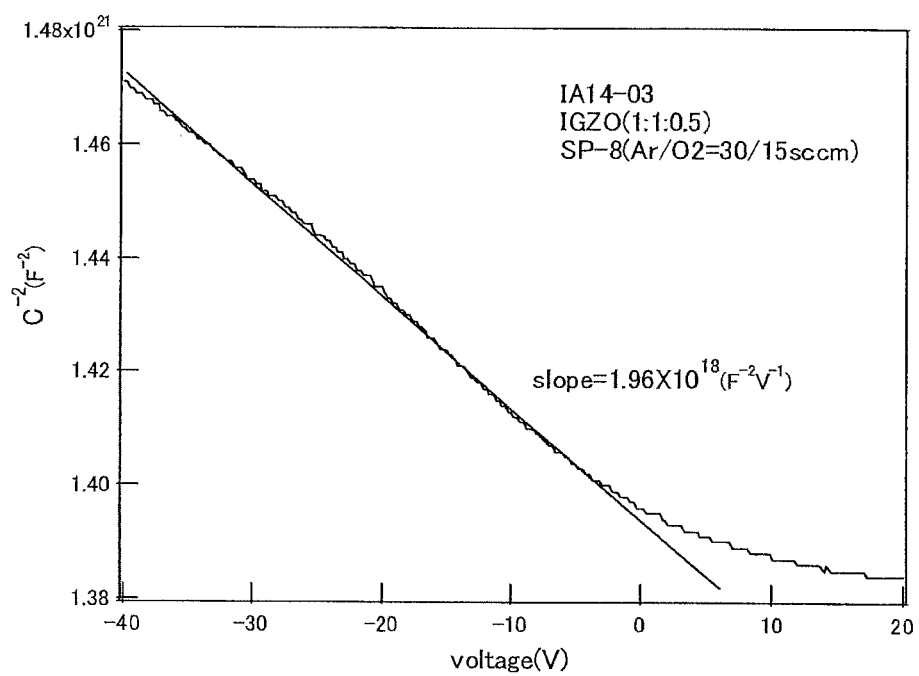
FIG. 17 shows the relationship between $V_G$ and $(1/C)^2$.

FIG. 16 and FIG. 17 show the C-V characteristics and the relationship between $V_G$ and $(1/C)^2$, respectively. The carrier concentration calculated using Formula 1 from the differential value of $(1/C)^2$ in a weak inversion region of the graph of FIG. 17 was $6.0\times10^{10}/cm^3$.

In this manner, by using an i-type or substantially i-type oxide semiconductor (e.g., with a carrier concentration of less than $1\times10^{12}/cm^3$, preferably, less than or equal to $1\times10^{11}/cm^3$), a transistor with excellent off-state current characteristics can be obtained.

With the use of the nonvolatile latch circuit according to this embodiment and a transistor using an oxide semiconductor as a semiconductor material for forming a channel formation region, which serves as a switching element of a data holding portion, a nonvolatile latch circuit which has a wide operating temperature range and operates stably even at a high temperature and in which a logical state of storing data is not erased even after the power is turned off or a latch circuit provided with a data holding portion where a refresh period is sufficiently long can be realized. Since data writing is performed by switching of the transistor, the number of writes is not substantially limited. In addition, the writing voltage is almost equivalent to the threshold voltage of the transistor; thus, the transistor can operate at a low voltage. For example, the operation voltage can be set at 1 V or less. Further, since a charge accumulated in a capacitor of the data storing portion can be kept held without any change, the influence of variation is small and data can be read easily.

Various logic circuits can be provided by using the nonvolatile latch circuit. For example, the power consumption can be reduced by turning off the power of the unused block. In addition, since a logical state is stored even when the power is turned off, a system can be started when the power is turned on or terminated when the power is turned off, at high speed and low power.

The structures, methods, and the like described in this embodiment can be combined as appropriate with any of the structures, methods, and the like described in the other embodiments.

[Embodiment 2]

Figure 18A:
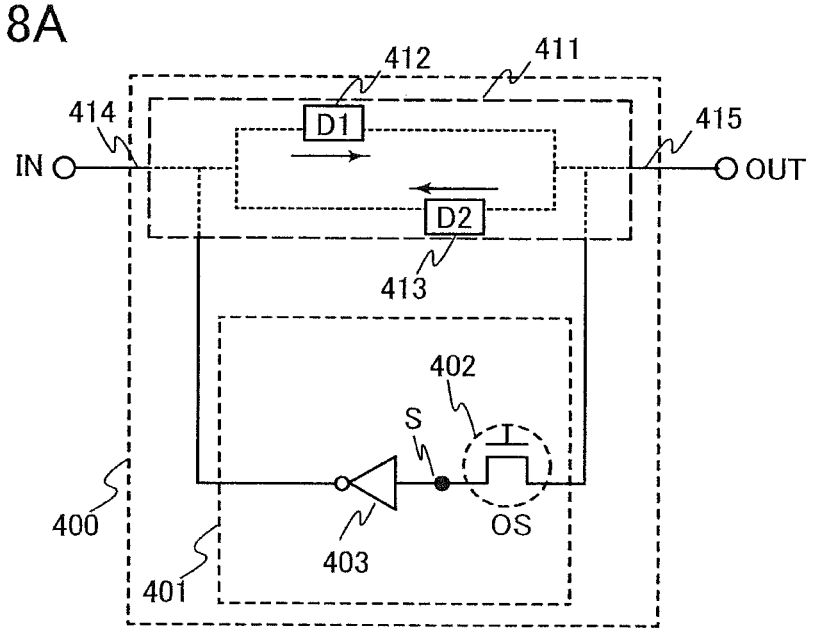
FIGS. 18A and 18B illustrate an example of a configuration of a nonvolatile latch circuit.
Figure 18B:
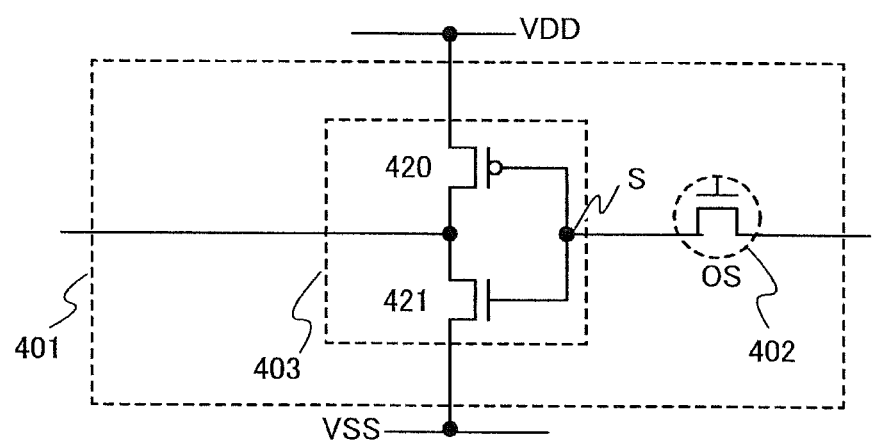

In this embodiment, another example of a configuration of the nonvolatile latch circuit which is an embodiment of the invention disclosed herein, which is different from the example in FIGS. 1A and 1B, will be described with reference to FIGS. 18A and 18B. FIG. 18A illustrates a configuration of a nonvolatile latch circuit 400 including the latch portion 411 and a data holding portion 401 for holding data of the latch portion. FIG. 18B illustrates a configuration of the data holding portion 401.

FIGS. 18A and 18B illustrate an example in which the configuration of the data holding portion 401 is different from that in FIGS. 1A and 1B. Specifically, a capacitor (the capacitor 404 in FIGS. 1A and 1B) of the data holding portion 401 is not provided in this example. The other configurations are the same as that of FIGS. 1A and 1B; therefore, description thereof is omitted. The structure of the transistor 402 is similar to that in Embodiment 1.

In the data holding portion 401, the transistor 402 using an oxide semiconductor as a semiconductor material for forming a channel formation region is used as a switching element. In addition, the data holding portion 401 includes the inverter 403 which is electrically connected to the other of the source electrode and the drain electrode of the transistor 402.

One of the source electrode and the drain electrode of the transistor 402 is electrically connected to the wiring 415 supplied with the output signal. In addition, the output of the inverter 403 is electrically connected to the wiring 414 supplied with the input signal. The inverter 403 includes the transistor 420 and the transistor 421. The source electrode of the transistor 420 is electrically connected to the high-level power source voltage VDD. The source electrode of the transistor 421 is electrically connected to the low-level power source voltage VSS.

The configuration in this embodiment does not include the capacitor connected to the node S. In this case, a charge is accumulated in the gate capacitors of the transistors included in the inverter 403. Here, the gate capacitor of the transistor 421 included in the inverter 403 can be preferably made larger than the gate capacitor of the transistor 420 included in the inverter 403. The size of a gate capacitor can be controlled in accordance with a channel length L, a channel width W, a film thickness of a gate insulating film, permittivity, or the like of a transistor. In such a manner, the rate of capacitors formed between VSS and the node S among the gate capacitors of the transistor 420 and the transistor 421 is increased. Accordingly, the potentials of the gate electrodes of the transistor 420 and the transistor 421 are hardly influenced by variation of VDD, which is preferable.

The configuration of the inverter 403 is not limited to that illustrated in FIG. 18B, and may include, for example, an n-channel transistor as illustrated in FIG. 2A. Alternatively, the output may be provided with a buffer. Further alternatively, a sense amplifier circuit may be used instead of the inverter 403. For example, a differential amplifier type sense amplifier circuit as illustrated in FIG. 2B may be used. In either case, it is important that the input terminal be in a floating state (a high impedance state). Further, in the circuit of FIG. 2A, a charge is inputted to and accumulated in the gate capacitor of the transistor 421 and, in the circuit of FIG. 2B, a charge is inputted to and accumulated in the gate capacitor of the transistor 421. Since the gate capacitors of the circuit in FIGS. 2A and 2B are mainly formed between VSS and the node S, the potential of the input terminal is hardly influenced by variation of VDD, which is preferable.

The transistor 402 using an oxide semiconductor has a function of writing data held in the latch portion 411 into the gate capacitor of the inverter 403 in the data holding portion 401. In addition, the transistor 402 has a function of holding the data written into the gate capacitor of the inverter 403 in the data holding portion 401.

A writing operation of the data held in the latch portion 411 into the data holding portion 401, and holding, reading, and rewriting operations of the data will be described. First, the transistor 402 is turned on by supplying the gate electrode of the transistor 402 with a potential at which the transistor 402 is turned on. Accordingly, the data held in the latch portion, that is, the potential of the wiring 415 supplied with the output signal is applied to the input terminal of the inverter 403. As a result, the charge in accordance with the potential of the wiring 415 is accumulated in the gate capacitor of the inverter 403 (this operation corresponds to writing). After that, the transistor 402 is turned off in such a manner that the potential of the gate electrode of the transistor 402 is set at the potential at which the transistor 402 is turned off. Accordingly, the charge accumulated in the gate capacitor of the inverter 403 is held (holding). The data can be read by reading the potential of the potential of the input terminal of the inverter 403 (this operation corresponds to reading). Rewriting of the data can be performed in a manner similar to that of the writing and holding of the data.

With the use of the nonvolatile latch circuit according to this embodiment, and a transistor using an oxide semiconductor as a semiconductor material for forming a channel formation region, which serves as a switching element of a data holding portion, a nonvolatile latch circuit which has a wide operating temperature range and operates stably even at a high temperature and in which a logical state of storing data is not erased even after the power is turned off or a latch circuit provided with a data holding portion where a refresh period is sufficiently long can be realized. Since data writing is performed by switching of the transistor, the number of writes is not substantially limited. In addition, the writing voltage is almost equivalent to the threshold voltage of the transistor; thus, the transistor can operate at a low voltage. For example, the operation voltage can be set at 1 V or less. Further, since a charge accumulated in a capacitor of the data storing portion can be kept held without any change, the influence of variation is small and data can be read easily.

Various logic circuits can be provided by using the nonvolatile latch circuit. For example, the power consumption can be reduced by turning off the power of the unused block. In addition, since a logical state is stored even when the power is turned off, a system can be started when the power is turned on or terminated when the power is turned off, at high speed and low power.

This embodiment mode can be freely combined with any of the other embodiments.

[Embodiment 3]

In this embodiment, an example of a configuration and an operation of the nonvolatile latch circuit which is an embodiment of the invention disclosed herein will be described with reference to FIGS. 19A and 19B and FIGS. 1A and 1B.

Figure 19A:
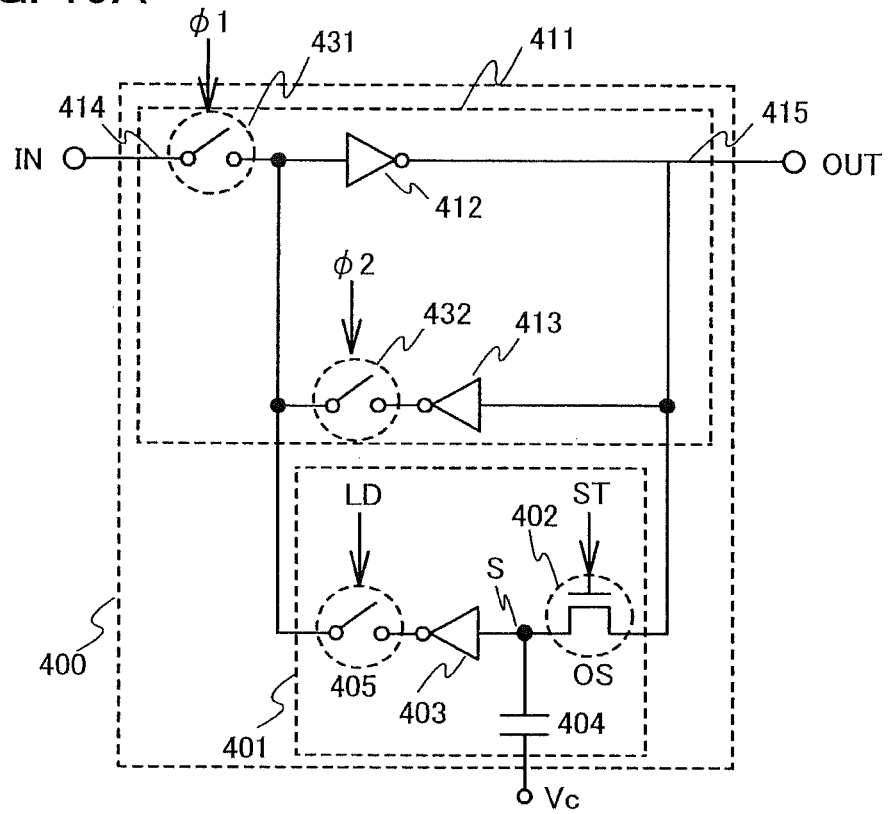
FIG. 19A illustrates an example of a configuration of a nonvolatile latch circuit.
Figure 19B:
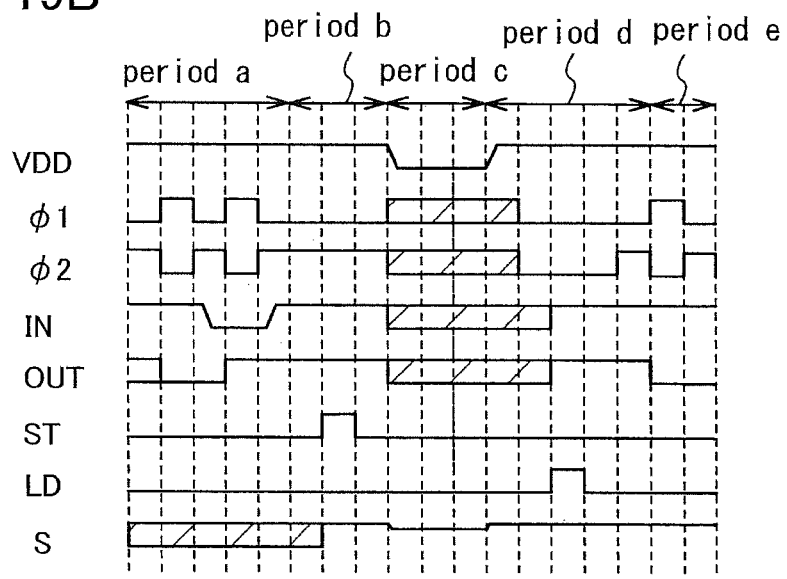
FIG. 19B illustrates an example of an operation of the nonvolatile latch circuit.

FIG. 19A illustrates a configuration of the nonvolatile latch circuit 400 including the latch portion 411 and the data holding portion 401 for holding data of the latch portion. FIG. 19B illustrates an example of a timing chart of the nonvolatile latch circuit 400.

FIG. 19A is an example in which the configuration of the latch portion 411 in FIG. 1A is specifically illustrated. FIG. 19A is an example of the configuration of the latch portion 411 in FIG. 1A, where an inverter is used for each of the first element and the second element. The structure of the transistor 402 is similar to that in Embodiment 1.

The latch portion 411 includes an inverter 412 and an inverter 413. The latch portion 411 has a loop structure in which an output of the inverter 412 is electrically connected to an input of the inverter 413, and an output of the inverter 413 is electrically connected to an input of the inverter 412. In addition, the latch portion 411 includes a switch 431 and a switch 432, and the output of the inverter 413 is electrically connected to the input of the inverter 412 via the switch 432.

The input of the inverter 412 is electrically connected to the wiring 414 supplied with the input signal of the latch circuit via the switch 431. The output of the inverter 412 is electrically connected to the wiring 415 supplied with the output signal of the latch circuit.

In the data holding portion 401, the transistor 402 using an oxide semiconductor as a semiconductor material for forming a channel formation region is used as a switching element. In addition, the data holding portion 401 includes the capacitor 404 and the inverter 403 which are each electrically connected to the other of the source electrode and the drain electrode of the transistor 402.

One of the source electrode and the drain electrode of the transistor 402 is electrically connected to the wiring 415 supplied with the output signal. In addition, the output of the inverter 403 is electrically connected to the wiring 414 supplied with the input signal via a switch 405.

The transistor 402 using an oxide semiconductor has a function of writing data held in the latch portion 411 into the capacitor 404 and the gate capacitor of the inverter 403 in the data holding portion 401. In addition, the transistor 402 has a function of holding the data written into the capacitor 404 and the gate capacitor of the inverter 403 in the data holding portion 401.

The wiring 414 is supplied with a potential of an input signal IN from a circuit of a previous stage. A circuit of a subsequent stage is supplied with the potential of the wiring 415 as an output signal OUT. The switch 431 is supplied with a potential of a clock signal φ1. When the clock signal φ1 is supplied with a high-level potential, the switch 431 is turned on. The switch 432 is supplied with a potential of a clock signal φ2. When the clock signal φ2 is supplied with a high-level potential, the switch 432 is turned on. A gate of the transistor 402 is supplied with a potential of a control signal ST. When the control signal ST is supplied with a high-level potential, the control signal ST has a potential at which the transistor 402 is turned on. The switch 405 is supplied with a potential of a control signal LD. When the control signal LD is supplied with a high-level potential, the control signal LD has a potential at which the switch 405 is turned on. In a normal operation period, the clock signal φ2 has an inverted signal of the clock signal φ1. Here, an example is shown in which the transistors and the switches are turned on when the potentials of the control signals and the clock signals are at high levels.

Each of the inverter 403 of the data holding portion 401 and the inverter 412 and the inverter 413 of the latch portion 411 is supplied with a high-level power source voltage VDD and a low-level power source voltage VSS.

Next, FIG. 19B illustrates an example of a timing chart of the potentials of the input signal 1N, the output signal OUT, the control signal ST, the control signal LD, the clock signal φ1, and the clock signal φ2 in a period in which the nonvolatile latch circuit 400 is in an operation state (an operation period) and in a period in which the nonvolatile latch circuit 400 is in a stop state (a non-operation period). In addition, FIG. 19B illustrates the potentials of the node S of the data holding portion 401 and the power source voltage VDD. The node S indicates the potential of one of the electrodes of the capacitor 404 and the potential of the input terminal of the inverter 403. Note that the other electrode of the capacitor 404 is supplied with a fixed potential, for example, a ground potential.

In FIG. 19B, a period a, a period b, a period d, and a period e are each an operation period, and a period c is a non-operation period. The period a and the period e are each a normal operation period, and the clock signal φ1 and the clock signal φ2 are each supplied with a high-level potential or a low-level potential alternately. The period b is a preparation period prior to the non-operation period. The period b is also referred to as a falling period. The period d is a preparation period after the power source voltage VDD has turned on until a normal operation period starts. The period d is also referred to as a rising period.

When the clock signal φ1 is supplied with a high-level potential and the clock signal φ2 is supplied with a low-level potential in the normal operation period (period a), the switch 432 is turned off and an inverter loop is cut, and the switch 431 is turned on; therefore, the potential of the input signal is inputted to the inverter 412. The potential of the input signal is inverted by the inverter 412 and is supplied to a circuit of a subsequent stage as an output signal OUT. If the potential of the input signal is a high level when the clock signal φ1 is supplied with a high-level potential, an output signal having a low-level potential can be obtained. If the potential of the input signal is a low level when the clock signal φ1 is supplied with a high-level potential, an output signal having a high-level potential can be obtained. When the clock signal φ1 is supplied with a low-level potential and the clock signal φ2 is supplied with a high-level potential, the switch 431 is turned off, and the switch 432 is turned on and an inverter loop is formed; therefore, the potential of the output signal OUT is held (data is latched). In the normal operation period, the control signal ST is not supplied with a potential at which the transistor 402 is turned on. The node S has a potential which has been held. Here, the potential of the node S is set at an undefined value.

Next, when the control signal ST is supplied with a potential at which the transistor 402 is turned on in the preparation period (period b) prior to the non-operation period, the transistor 402 is turned on and the node S is supplied with the potential of the output signal (this operation corresponds to writing). When the potential of the output signal is a high level, the potential of the node S is a high level. After that, the transistor 402 is turned off by supplying the control signal ST with a potential at which the transistor 402 is turned off; therefore, the potential of the node S becomes a floating state. As a result, the potential written into the node S is held without any change (holding). Note that it is sufficient that the clock signal φ2 and the clock signal φ1 have a potential at the termination of the period a. Alternatively, data at the termination of the period a may be latched by fixing the potential of the clock signal φ2 to a high level and the potential of the clock signal φ1 to a low level. The control signal ST may be supplied with a potential at which the transistor 402 is turned on after the period b has started or with a potential at which the transistor 402 is turned on at the same time as the start of the period b.

Next, in the non-operation period (period c), supply of the power source is stopped and the potential of the power source voltage VDD is lowered. The potentials of the clock signal φ1, the clock signal φ2, the input signal IN, and the output signal OUT can take any values between VDD and VSS. During this time, the potentials of the control signal ST and the control signal LD are each held at a low level. For example, the potentials are each held at a ground potential. In the non-operation period (period c), the potential of the node S is in a floating state; therefore, a charge accumulated in the node S is held without any change (holding). Note that when the power source voltage VDD is lowered, the potential of the node S varies in some cases more or less due to the influence of the capacitive coupling with the power source potential. It is needless to say that, when the power source voltage VDD is supplied again, the potential of the node S is restored to the original potential because the charge accumulated in the node S is held.

Next, in the preparation period (period d) after the power source voltage VDD has turned on until a normal operation period starts, when the control signal LD is supplied with a potential at which the switch 405 is turned on with the potentials of the clock signal φ2 and the clock signal φ1 each fixed at a low level, the switch 405 is turned on, and the potential held in the node S, which is inverted by the inverter 403, is applied to the latch portion 411. Then, after the control signal LD is supplied with a potential at which the switch 405 is turned on, the clock signal φ2 and the clock signal φ1 are each supplied with the potential at the termination of the period a. Accordingly, the logical state of the period d can be restored to the logical state prior to the non-operation period. The potential of the control signal LD may be set at a low level prior to the termination of the period d or a potential at which the switch 405 is turned on may be held until the termination of the period d.

Next, in the normal operation period (period e), the clock signal φ1 and the clock signal φ2 are alternately supplied with a high-level potential or a low-level potential to be a normal operation state. At the start of the normal operation period (period e), the operations of the clock signal φ1 and the clock signal φ2 may be started from the same potentials as the termination of the previous normal operation period (period a) or may be started from a subsequent state of the potential at the termination of the period a.

The potential of the node S can be rewritten at the timing at which the control signal ST is supplied next with a potential at which the transistor 402 is turned on. Therefore, the potential of the node S is held without any change until the timing at which the control signal ST is supplied next with a potential at which the transistor 402 is turned on.

Note that in the period d, the potential $V_c$ of the other electrode of the capacitor 404 may be a value between VDD and VSS. Accordingly, the node S is supplied with a potential to which the potential $V_c$ is added, so that a reading operation can be performed more stably.

With the use of the nonvolatile latch circuit according to this embodiment, and a transistor using an oxide semiconductor as a semiconductor material for forming a channel formation region, which serves as a switching element of a data holding portion, a nonvolatile latch circuit which has a wide operating temperature range and operates stably even at a high temperature and in which a logical state of storing data is not erased even after the power is turned off or a latch circuit provided with a data holding portion where a refresh period is sufficiently long can be realized. Since data writing is performed by switching of the transistor, the number of writes is not substantially limited. In addition, the writing voltage is almost equivalent to the threshold voltage of the transistor; thus, the transistor can operate at a low voltage. For example, the operation voltage can be set at 1 V or less. Further, since a charge accumulated in a capacitor of the data storing portion can be kept held without any change, the influence of variation is small and data can be read easily.

Various logic circuits can be provided by using the nonvolatile latch circuit. For example, the power consumption can be reduced by turning off the power of the unused block. In addition, since a logical state is stored even when the power is turned off, a system can be started when the power is turned on or terminated when the power is turned off, at high speed and low power.

This embodiment mode can be freely combined with any of the other embodiments.

[Embodiment 4]

Figure 20A:
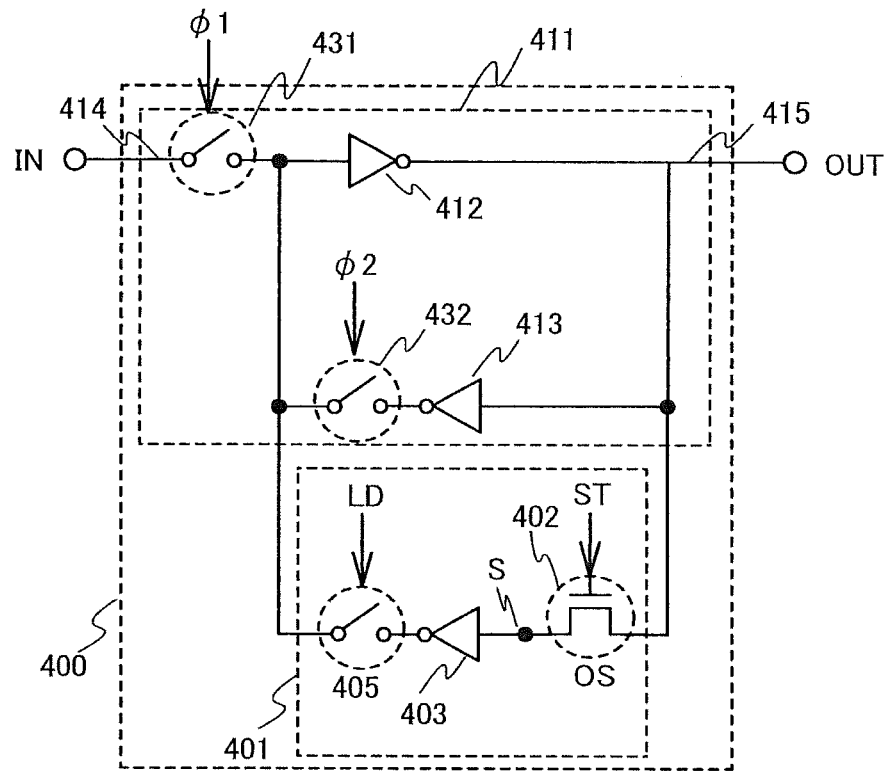
FIG. 20A illustrates an example of a configuration of a nonvolatile latch circuit.
Figure 20B:
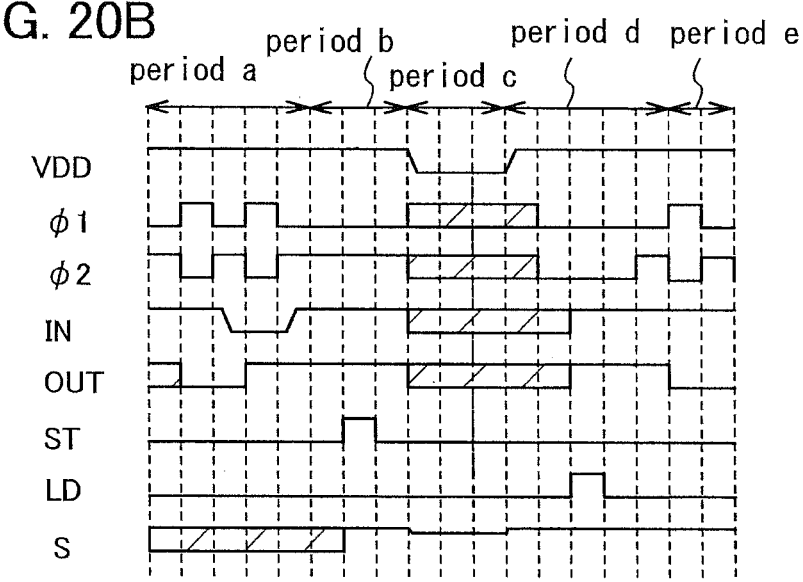
FIG. 20B illustrates an example of an operation of the nonvolatile latch circuit.

In this embodiment, another example of a configuration and an operation of the nonvolatile latch circuit which is an embodiment of the invention disclosed herein, which is different from the example in FIGS. 19A and 19B, will be described with reference to FIGS. 20A and 20B and FIGS. 18A and 18B. FIG. 20A illustrates a configuration of the nonvolatile latch circuit 400 including the latch portion 411 and the data holding portion 401 for holding data of the latch portion. FIG. 20B illustrates an example of a timing chart of the nonvolatile latch circuit 400.

FIGS. 20A and 20B illustrate an example in which the configuration of the data holding portion 401 is different from that in FIGS. 19A and 19B. Specifically, a capacitor (the capacitor 404 in FIGS. 19A and 19B) of the data holding portion 401 is not provided in this example. The other configurations are the same as that of FIGS. 19A and 19B; therefore, description thereof is omitted.

FIG. 20A is an example in which the configuration of the latch portion 411 in FIG. 18A is specifically illustrated. FIG. 20A is an example of the configuration of the latch portion 411 in FIG. 18A, where an inverter is used for each of the first element and the second element. The configuration of the data holding portion 401 is described with reference to FIGS. 18A and 18B. The structure of the transistor 402 is similar to that in Embodiment 1.

In the data holding portion 401, the transistor 402 using an oxide semiconductor as a semiconductor material for forming a channel formation region is used as a switching element. In addition, the data holding portion 401 includes the inverter 403 which is electrically connected to the other of the source electrode and the drain electrode of the transistor 402.

One of the source electrode and the drain electrode of the transistor 402 is electrically connected to the wiring 415 supplied with the output signal. In addition, the output of the inverter 403 is electrically connected to the wiring 414 supplied with the input signal via the switch 405. The configuration of the inverter 403 is as illustrated in FIG. 18B, and the inverter 403 includes the transistor 420 and the transistor 421. The source electrode of the transistor 420 is electrically connected to the high-level power source voltage VDD. The source electrode of the transistor 421 is electrically connected to the low-level power source voltage VSS.

The configuration in this embodiment does not include the capacitor connected the node S. In this case, a charge is accumulated in the gate capacitors of the transistors included in the inverter 403. Here, the gate capacitor of the transistor 421 included in the inverter 403 can be preferably made larger than the gate capacitor of the transistor 420 included in the inverter 403. The size of a gate capacitor can be controlled in accordance with a channel length L, a channel width W, a film thickness of a gate insulating film, permittivity, or the like of a transistor. In such a manner, the capacitor components of the input capacitor of the inverter 403 are mainly formed between VSS and the node S. Accordingly, the potential of the input terminal is hardly influenced by variation of VDD, which is preferable.

The configuration of the inverter 403 is not limited to that illustrated in FIG. 18B, and may include, for example, an n-channel transistor as illustrated in FIG. 2A. Alternatively, the output may be provided with a buffer. Further alternatively, a sense amplifier circuit may be used instead of the inverter 403. For example, a differential amplifier type sense amplifier circuit as illustrated in FIG. 2B may be used. In either case, it is important that the input terminal be in a floating state (a high impedance state). Further, the charge of the input of the circuit in FIG. 2A is accumulated in the gate capacitor of the transistor 421, and the charge of the input of the circuit in FIG. 2B is accumulated in the gate capacitor of the transistor 421. Since the gate capacitors in the circuit in FIGS. 2A and 2B are mainly formed between VSS and the node S, the potential of the input terminal is hardly influenced by variation of VDD, which is preferable.

The transistor 402 using an oxide semiconductor has a function of writing data held in the latch portion 411 into the gate capacitor of the inverter 403. In addition, the transistor 402 has a function of holding the data written into the gate capacitor of the inverter 403.

FIG. 20B illustrates an example of a timing chart of the nonvolatile latch circuit 400. The timing chart in FIG. 20B is almost similar to the timing chart in FIG. 19B; therefore, description thereof is omitted.

With the use of the nonvolatile latch circuit according to this embodiment, and a transistor using an oxide semiconductor as a semiconductor material for forming a channel formation region, which serves as a switching element of a data holding portion, a nonvolatile latch circuit which has a wide operating temperature range and operates stably even at a high temperature and in which a logical state of storing data is not erased even after the power is turned off or a latch circuit provided with a data holding portion where a refresh period is sufficiently long can be realized. Since data writing is performed by switching of the transistor, the number of writes is not substantially limited. In addition, the writing voltage is almost equivalent to the threshold voltage of the transistor; thus, the transistor can operate at a low voltage.

For example, the operation voltage can be set at 1 V or less. Further, since a charge accumulated in a capacitor of the data storing portion can be kept held without any change, the influence of variation is small and data can be read easily.

Various logic circuits can be provided by using the nonvolatile latch circuit. For example, the power consumption can be reduced by turning off the power of the unused block. In addition, since a logical state is stored even when the power is turned off, a system can be started when the power is turned on or terminated when the power is turned off, at high speed and low power.

This embodiment mode can be freely combined with any of the other embodiments.

[Embodiment 5]

Figure 21A:
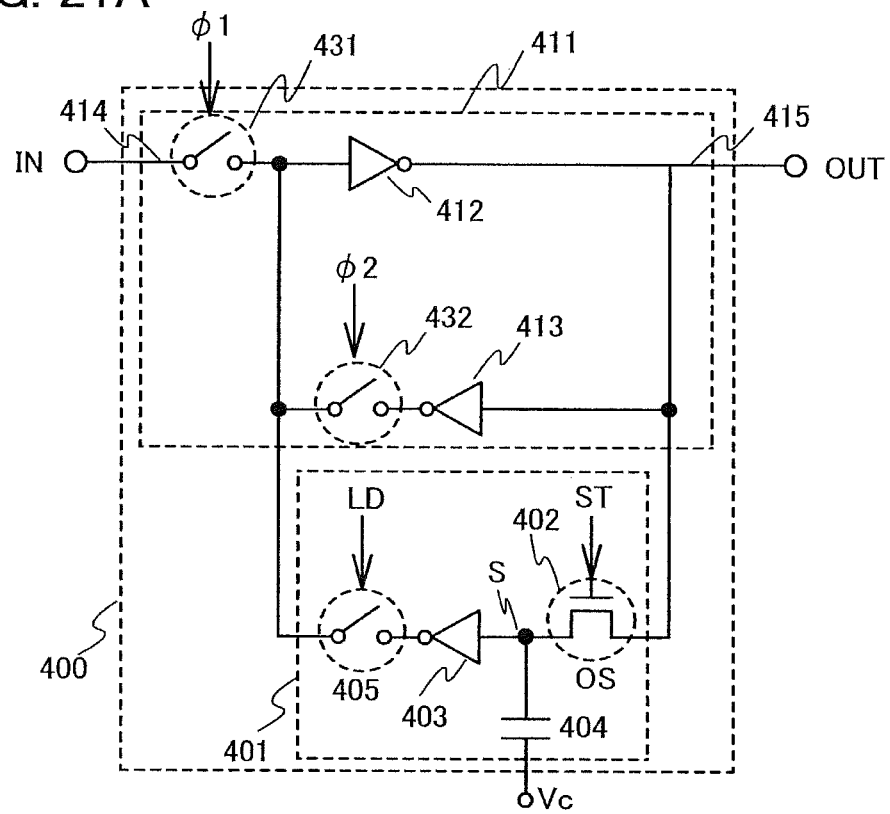
FIG. 21A illustrates an example of a configuration of a nonvolatile latch circuit.
Figure 21B:
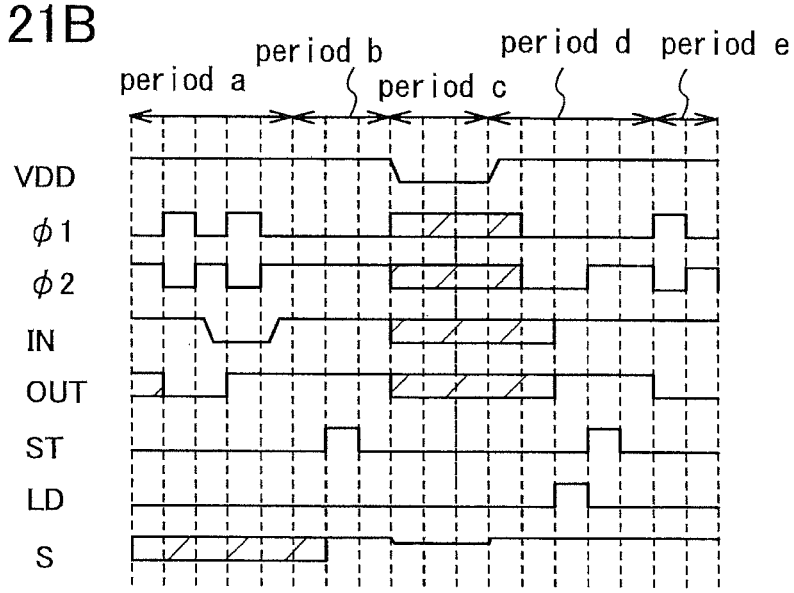
FIG. 21B illustrates an example of an operation of the nonvolatile latch circuit.

In this embodiment, another example of a configuration and an operation of the nonvolatile latch circuit which is an embodiment of the invention disclosed herein, which is different from the example in FIGS. 19A and 19B, will be described with reference to FIGS. 21A and 21B. FIG. 21A illustrates a configuration of a nonvolatile latch circuit 400. The configuration of the nonvolatile latch circuit 400 is similar to that in FIG. 19A. FIG. 21B illustrates an example of a timing chart of the nonvolatile latch circuit 400.

In the timing chart illustrated in FIG. 21B, in a period d after a power source voltage VDD has been supplied again, a control signal ST is supplied with a potential at which the transistor 402 is turned on. The timing of rising at which the control signal ST has a high-level potential may be any time as long as it is after the timing at which the control signal LD has fallen from the high-level potential. In addition, the timing at which the control signal ST falls to a low-level potential may be any time as long as it is during a period in which the potentials of the clock signal $\phi 1$ and the clock signal $\phi 2$ are the same as the potentials at the termination of the period a. In a period d, the control signal ST is supplied with a potential at which the transistor 402 is turned on, so that the potential of the node S can be refreshed.

In the timing chart in FIG. 21B, the timings other than the timing of the control signal ST are similar to those in FIG. 19B; therefore, description thereof is omitted.

With the use of the nonvolatile latch circuit according to this embodiment, and a transistor using an oxide semiconductor as a semiconductor material for forming a channel formation region, which serves as a switching element of a data holding portion, a nonvolatile latch circuit which has a wide operating temperature range and operates stably even at a high temperature and in which a logical state of storing data is not erased even after the power is turned off or a latch circuit provided with a data holding portion where a refresh period is sufficiently long can be realized. Since data writing is performed by switching of the transistor, the number of writes is not substantially limited. In addition, the writing voltage is almost equivalent to the threshold voltage of the transistor; thus, the transistor can operate at a low voltage. For example, the operation voltage can be set at 1 V or less. Further, since a charge accumulated in a capacitor of the data storing portion can be kept held without any change, the influence of variation is small and data can be read easily.

Various logic circuits can be provided by using the nonvolatile latch circuit. For example, the power consumption can be reduced by turning off the power of the unused block. In addition, since a logical state is stored even when the power is turned off, a system can be started when the power is turned on or terminated when the power is turned off, at high speed and low power.

This embodiment mode can be freely combined with any of the other embodiments.

[Embodiment 6]

In this embodiment, an example of a configuration of a logic circuit including a plurality of the nonvolatile latch circuits which are each an embodiment of the invention disclosed herein will be described with reference to FIG. 22.

Figure 22:
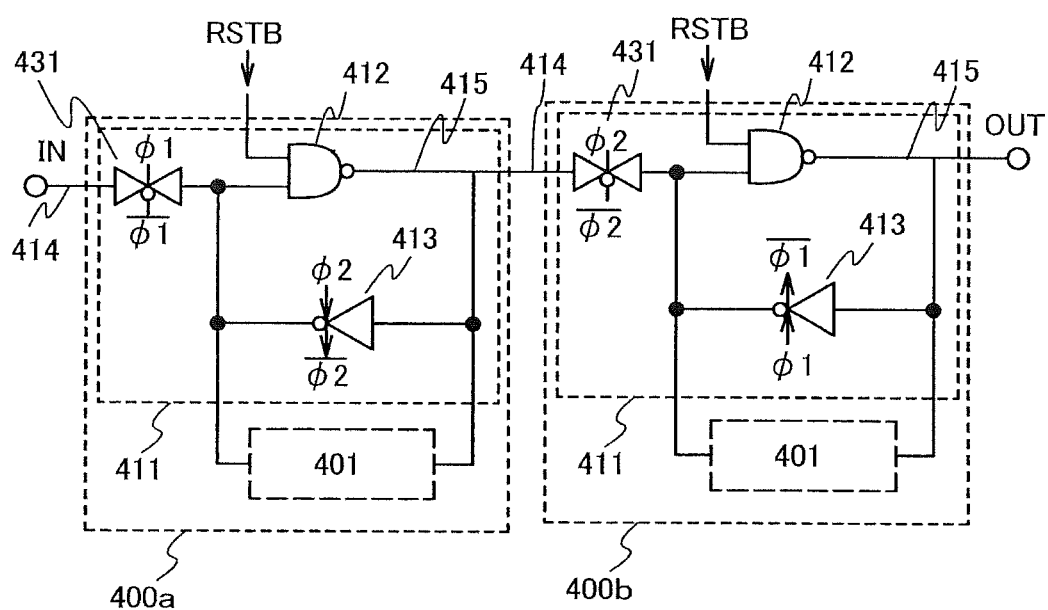
FIG. 22 illustrates an example of a configuration of a nonvolatile latch circuit.

FIG. 22 illustrates a configuration of a logic circuit including two nonvolatile latch circuits 400 each including a latch portion 411 and a data holding portion 401 for holding data of the latch portion.

The configuration of the data holding portion 401 is similar to that in FIG. 1A or FIG. 18A. The configuration of the latch portion 411 is an example in which a NAND is used for the first element and a clocked inverter is used for the second element in the configuration of the latch portion 411 of FIG. 1A or FIG. 18A.

The latch portion 411 includes a NAND 412 and a clocked inverter 413. The latch portion 411 has a loop structure in which an output of the NAND 412 is electrically connected to an input of the clocked inverter 413, and an output of the clocked inverter 413 is electrically connected to an input of the NAND 412. In addition, the latch portion 411 includes an analog switch 431.

One input of the NAND 412 is electrically connected to a wiring 414 supplied with an input signal of the latch circuit 400 via the analog switch 431. The output of the NAND 412 is electrically connected to a wiring 415 supplied with an output signal of the latch circuit 400. The other input of the NAND 412 is electrically connected to a wiring supplied with a signal RSTB.

The logic circuit in FIG. 22 includes a nonvolatile latch circuit 400a and a nonvolatile latch circuit 400b as the above nonvolatile latch circuits 400. The nonvolatile latch circuit 400a is electrically connected to the wiring 414 supplied with a potential of an input signal from a circuit of a previous stage. The wiring 415 supplied with a potential of an output signal of the nonvolatile latch circuit 400a is electrically connected to the wiring 414 supplied with a potential of an input signal of the nonvolatile latch circuit 400b. The nonvolatile latch circuit 400b is electrically connected to the wiring 415 supplied with a potential of an output signal of a circuit of a subsequent stage. In the nonvolatile latch circuit 400a, the analog switch 431 is supplied with a clock signal $\phi 1$ and an inverted signal of the clock signal $\phi 1$, and the clocked inverter 413 is supplied with a clock signal $\phi 2$ and an inverter signal of the clock signal $\phi 2$. In the nonvolatile latch circuit 400b, the analog switch 431 is supplied with the clock signal $\phi 2$ and the inverted signal of the clock signal $\phi 2$, and the clocked inverter 413 is supplied with the clock signal $\phi 1$ and the inverter signal of the clock signal $\phi 1$.

With the use of the nonvolatile latch circuit according to this embodiment, and a transistor using an oxide semiconductor as a semiconductor material for forming a channel formation region, which serves as a switching element of a data holding portion, a nonvolatile latch circuit which has a wide operating temperature range and operates stably even at a high temperature and in which a logical state of storing data is not erased even after the power is turned off or a latch circuit provided with a data holding portion where a refresh period is sufficiently long can be realized. Since data writing is performed by switching of the transistor, the number of writes is not substantially limited. In addition, the writing voltage is almost equivalent to the threshold voltage of the transistor; thus, the transistor can operate at a low voltage. For example, the operation voltage can be set at 1 V or less. Further, since a charge accumulated in a capacitor of the data storing portion can be kept held without any change, the influence of variation is small and data can be read easily.

Various logic circuits can be provided by using the nonvolatile latch circuit. For example, the power consumption can be reduced by turning off the power of the unused block. In addition, since a logical state is stored even when the power is turned off, a system can be started when the power is turned on or terminated when the power is turned off, at high speed and low power.

This embodiment mode can be freely combined with any of the other embodiments.

[Embodiment 7]

In this embodiment, examples of the electronic device on which a semiconductor device using the nonvolatile latch circuit according to any of the above embodiments is mounted will be described with reference to FIGS. 23A to 23F. The electronic device on which the semiconductor device using the nonvolatile latch circuit according to any of the above embodiments is mounted has excellent characteristics which cannot be seen in the conventional technology. Therefore, it is possible to provide an electronic device having a novel structure with the semiconductor device using the nonvolatile latch circuit. Note that the semiconductor device using the nonvolatile latch circuit according to any of the above embodiments is integrated and mounted on a circuit board or the like to be mounted on an electronic device.

Figure 23A:
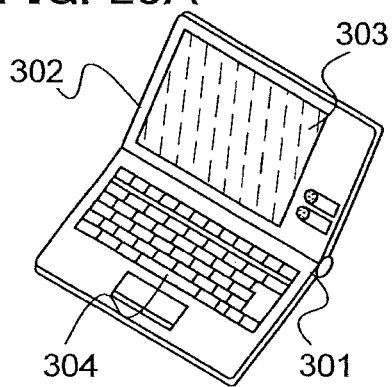
FIGS. 23A to 23F illustrate examples of a semiconductor device using a nonvolatile latch circuit.

FIG. 23A illustrates a laptop personal computer including the semiconductor device using the nonvolatile latch circuit according to any of the above embodiments. The laptop personal computer includes a main body 301, a housing 302, a display portion 303, a keyboard 304, and the like. A laptop personal computer with excellent performance can be provided by applying the semiconductor device according to the invention disclosed herein to a laptop personal computer.

Figure 23D:
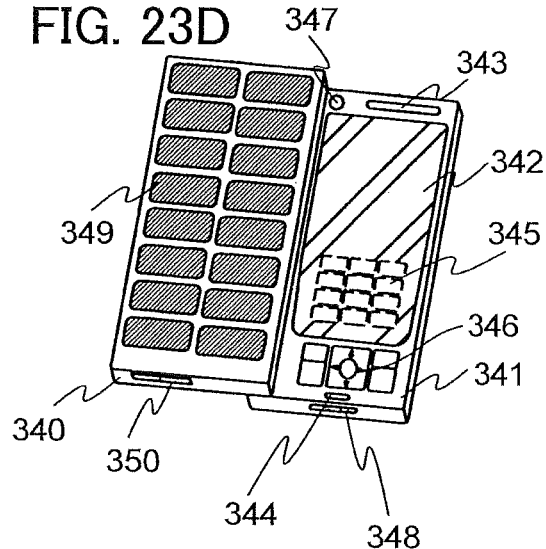
Figure 23B:
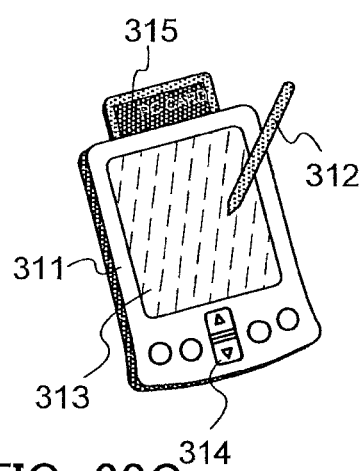

FIG. 23B illustrates a portable digital assistant (PDA) including the semiconductor device using the nonvolatile latch circuit according to any of the above embodiments. A main body 311 includes a display portion 313, an external interface 315, operation keys 314, and the like. Further, a stylus 312 is provided as an accessory for operation. A portable digital assistant (PDA) with excellent performance can be provided by applying the semiconductor device according to the invention disclosed herein to a portable digital assistant (PDA).

Figure 23E:
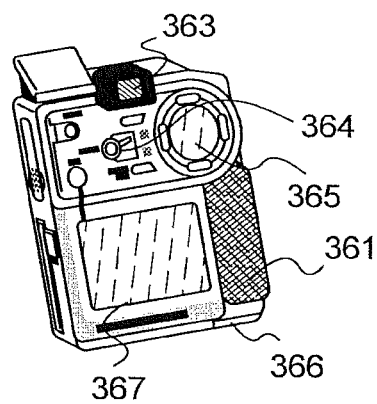
Figure 23C:
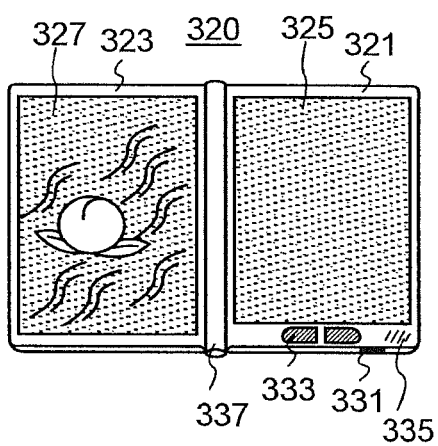

FIG. 23C illustrates an e-book reader 320 as an example of electronic paper including the semiconductor device using the nonvolatile latch circuit according to any of the above embodiments. The e-book reader 320 includes two housings: a housing 321 and a housing 323. The housing 321 is combined with the housing 323 by a hinge 337, so that the e-book reader 320 can be opened and closed with the hinge 337 used as an axis. Such a structure allows the e-book reader 320 to be used as paper books.

The housing 321 includes a display portion 325, and the housing 323 includes a display portion 327. The display portion 325 and the display portion 327 can display a continuous image or different images. The structure for displaying different images allows text to be displayed on the right display portion (the display portion 325 in FIG. 23C) and images to be displayed on the left display portion (the display portion 327 in FIG. 23C).

FIG. 23C illustrates an example of the case where the housing 321 includes an operating portion and the like. For example, the housing 321 includes a power button 331, operation keys 333, a speaker 335, and the like. The operation keys 333 allow pages to be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. The e-book reader 320 can also serve as an electronic dictionary.

In addition, the e-book reader 320 may have a structure capable of transmitting and receiving data wirelessly. Through wireless communication, desired book data or the like can be purchased and downloaded from an electronic book server.

Note that electronic paper can be used in any field as long as data is displayed. For example, electronic paper can be applied to posters, advertisement in vehicles such as trains, and a variety of cards such as credit cards, as well as e-book readers. Electronic paper with excellent performance can be provided by applying the semiconductor device according to the invention disclosed herein to electronic paper.

FIG. 23D illustrates a cellular phone including the semiconductor device using the nonvolatile latch circuit according to any of the above embodiments. The cellular phone includes two housings: a housing 340 and a housing 341. The housing 341 includes a display panel 342, a speaker 343, a microphone 344, a pointing device 346, a camera lens 347, an external connection terminal 348, and the like. The housing 340 includes a solar cell 349 for charging the cellular phone, an external memory slot 350, and the like. An antenna is built in the housing 341.

The display panel 342 includes a touch panel. A plurality of operation keys 345 which are displayed as an image are shown by dashed lines in FIG. 23D. Note that the cellular phone includes a booster circuit for increasing a voltage outputted from the solar cell 349 to a voltage needed for each circuit. In addition to the above structure, a noncontact IC chip, a small recording device, or the like may be built in the cellular phone.

The display orientation of the display panel 342 changes as appropriate in accordance with the application mode. Further, the camera lens 347 is provided on the same surface as the display panel 342, so that the cellular phone can be used as a video phone. The speaker 343 and the microphone 344 can be used for videophone calls, recording, and playing sound, etc. as well as voice calls. Moreover, the housings 340 and 341 which are unfolded as in FIG. 23D can overlap with each other by sliding. Thus, the cellular phone can be in a suitable size for portable use.

The external connection terminal 348 is connectable to an AC adaptor and a variety of cables such as a USB cable, which enables charging of the cellular phone and data communication. Moreover, a larger amount of data can be saved and moved by inserting a recording medium to the external memory slot 350. In addition to the above functions, an infrared communication function, a television reception function, or the like may be provided. A cellular phone with excellent performance can be provided by applying the semiconductor device according to the invention disclosed herein to a cellular phone.

FIG. 23E illustrates a digital camera including the semiconductor device using the nonvolatile latch circuit according to any of the above embodiments. The digital camera includes a main body 361, a display portion A 367, an eyepiece portion 363, an operation switch 364, a display portion B 365, a battery 366, and the like. A digital camera with excellent performance can be provided by applying the semiconductor device according to the invention disclosed herein to a digital camera.

Figure 23F:
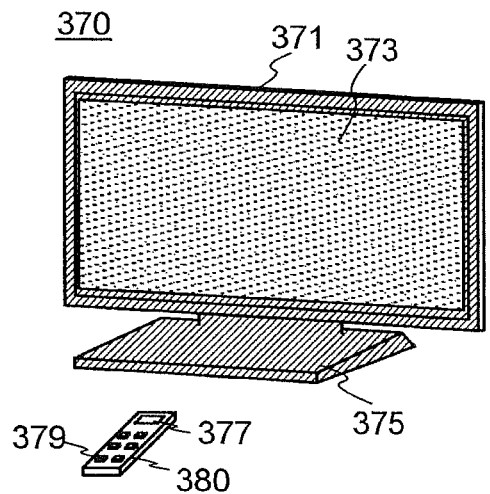

FIG. 23F illustrates a television set including the semiconductor device using the nonvolatile latch circuit according to any of the above embodiments. A television set 370 includes a housing 371 provided with a display portion 373. Images can be displayed on the display portion 373. Here, the housing 371 is supported by a stand 375.

The television set 370 can operate by an operation switch included in the housing 371 or by a remote controller 380 separately provided. Channels and volume can be controlled by operation keys 379 included in the remote controller 380, and images displayed on the display portion 373 can thus be controlled. Further, the remote controller 380 can be provided with a display portion 377 for displaying data outputted from the remote controller 380.

Note that the television set 370 preferably includes a receiver, a modem, and the like. With the receiver, a general television broadcast can be received. Furthermore, when the television set 370 is connected to a communication network by wired or wireless connection via the modem, one-way (from a transmitter to a receiver) or two-way (between a transmitter and a receiver, between receivers, or the like) data communication can be performed. A television set with excellent performance can be provided by applying the semiconductor device according to the invention disclosed herein to a television set.

The structures, methods, and the like described in this embodiment can be combined as appropriate with any of the structures, methods, and the like described in the other embodiments.

EXAMPLE 1

In this example, the results of evaluating the operation of the nonvolatile latch circuit which is an embodiment of the invention disclosed herein are shown.

Figure 24:
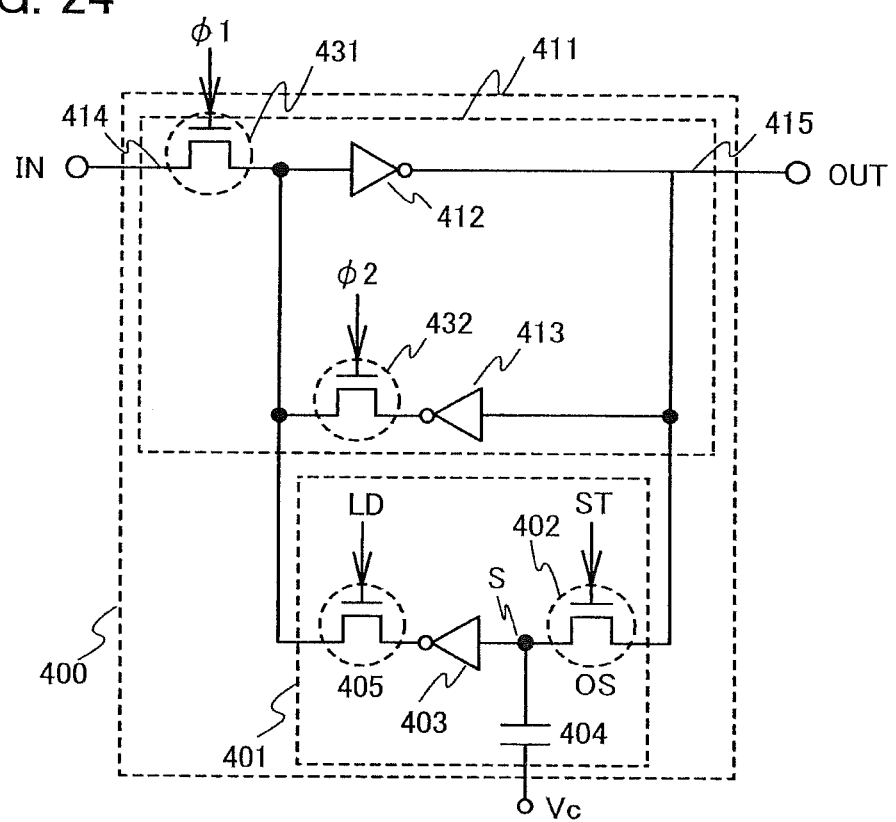
FIG. 24 illustrates an example of a configuration of a nonvolatile latch circuit.

The configuration of a nonvolatile latch circuit used for the evaluation is illustrated in FIG. 24. A nonvolatile latch circuit 400 in FIG. 24 includes a latch portion 411 and a data holding portion 401 for holding data of the latch portion.

The latch portion 411 includes an inverter 412, an inverter 413, a switch 431 including a transistor, and a switch 432 including a transistor.

The data holding portion 401 includes a transistor 402 using an oxide semiconductor as a semiconductor material for forming a channel formation region, a capacitor 404, an inverter 403, and a switch 405 including a transistor. Note that a node S shows potentials of one of electrodes of the capacitor 404 and an input terminal of the inverter 403.

Figure 6D:
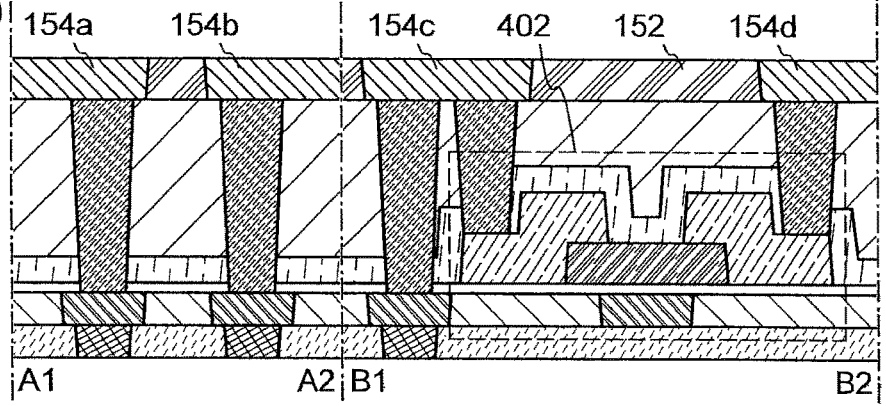

The transistor 402 was formed in accordance with the manufacturing method of FIGS. 5A to 5G and FIGS. 6A to 6D, and a transistor having a structure similar to that of FIG. 6D was used. The transistor 402 is a transistor using a highly purified oxide semiconductor, whose channel length L is 3 μm and channel width W is 5 μm.

The inverter 412, the inverter 413, the inverter 403, the switch 431 including a transistor, the switch 432 including a transistor, and the switch 405 including a transistor were each formed with a transistor using silicon.

A wiring 414 is supplied with a potential of an input signal IN from a circuit of a previous stage. A circuit of a subsequent stage is supplied with a potential of a wiring 415 as an output signal OUT. The switch 431 is supplied with a potential of a clock signal φ1. The switch 432 is supplied with a potential of a clock signal φ2. A gate of the transistor 402 is supplied with a potential of a control signal ST. The switch 405 is supplied with a potential of a control signal LD.

Figure 25A:
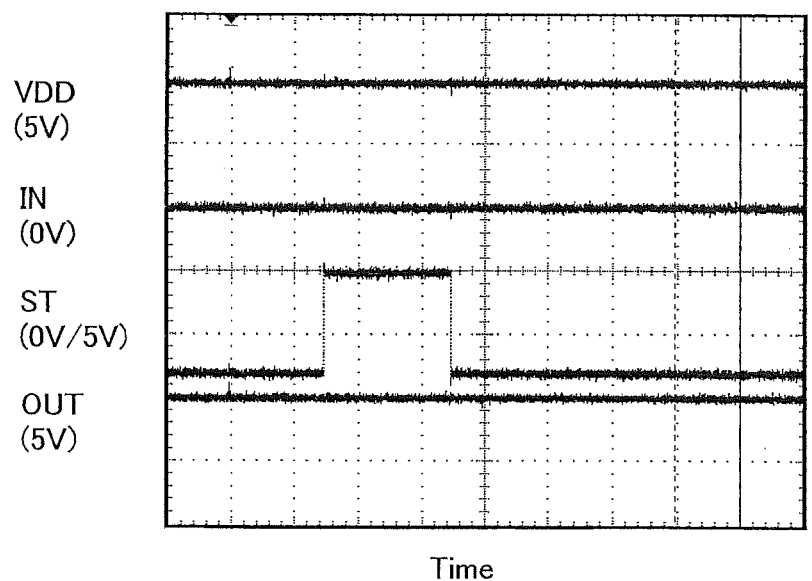
FIGS. 25A and 25B show an example of results of evaluating a nonvolatile latch circuit.
Figure 25B:
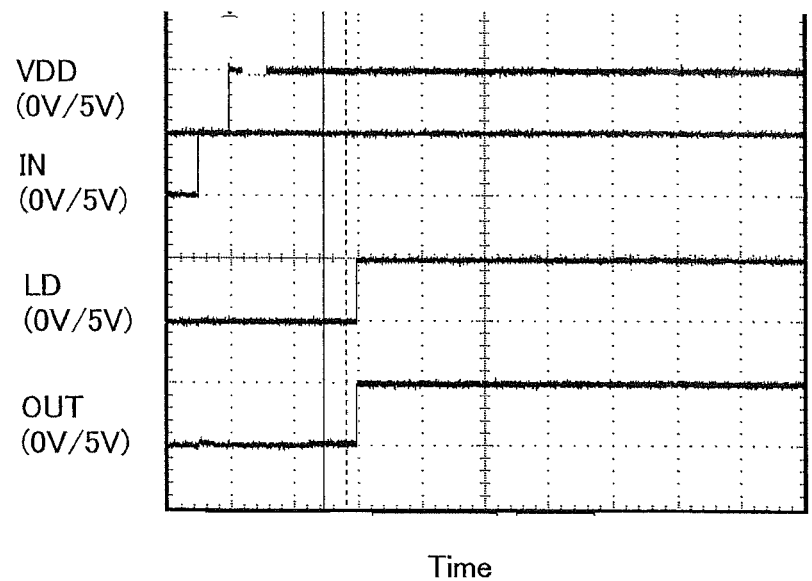

FIGS. 25A and 25B show evaluation results of the nonvolatile latch circuit 400. FIG. 25A shows the results of measuring potentials of a power source voltage VDD, an input signal IN, a control signal ST, and an output signal OUT with an oscilloscope at the writing operation. FIG. 25B shows the results of measuring potentials of a power source voltage VDD, an input signal IN, a control signal LD, and an output signal OUT with an oscilloscope at the reading operation. Note that in the evaluation of the nonvolatile latch circuit 400, at the power source supply, the power source voltage VDD was set at 5 V and the power source voltage VSS was set at 0 V.

First, the potential of the output signal OUT was written into the node S and held therein (see FIG. 25A). At the writing, the potential of the output signal OUT was set at 5 V, and the potential of the input signal IN was set at 0 V. The transistor 402 was turned on by supplying the control signal ST with a potential at which the transistor 402 was turned on (here, a potential of 5 V), and then the node S was supplied with the potential of the output signal OUT (here, a potential of 5 V) (this operation corresponds to writing). A period in which the transistor 402 was turned on was set at 200 microseconds.

After that, the transistor 402 was turned off by supplying the control signal ST with a potential at which the transistor 402 was turned off (here, a potential of 0 V), and then the potential of the node S was made in a floating state (holding).

During the writing and holding operations, the control signal LD was supplied with a potential at which the switch 405 was turned off (here, a potential of 0 V).

Note that during the writing and holding operations, the potentials of the signal φ2 and the signal φ1 were held at potentials prior to the writing operation (here, the signal φ2 was held at a low-level potential (0 V) and the signal φ1 was held at a high-level potential (5 V)).

Next, supply of the power was stopped (also referred to as turning off the power), and the nonvolatile latch circuit 400 was left at normal temperature for 10 minutes. At the stop of supply of the power (also referred to as a non-operation period), the potential of the power source voltage VDD was lowered. During this time, the potentials of the control signal ST and the control signal LD were each held at a potential of 0 V.

After that, supply of the power was started again (also referred to as turning on the power), and the potential of the power source voltage VDD was set at 5 V.

Next, an operation of reading the potential of the node S was performed (see FIG. 25B). At the reading, the potentials of the signal φ2 and the signal φ1 were each set at a low level (0 V), and the switch 432 and the switch 431 were turned off. In this state, the control signal LD was supplied with a potential at which the switch 405 is turned on (here, a potential of 5 V), and the switch 405 was turned on. When the switch 405 was turned on, a potential of 5 V was outputted as the output signal OUT (reading).

The potential of the output signal OUT corresponds to the potential of the node S which was outputted via the inverter 403 and the inverter 412. Therefore, according to FIG. 25B, it was confirmed that the potential which was written into the node S before the supply of the power had stopped was held without any change even after the supply of the power was stopped and thus the potential was outputted as the potential of the output signal OUT. That is, it was confirmed that, immediately after the supply of the power was started again, the nonvolatile latch circuit 400 was able to restore the logical state to the logical state prior to the stop of the power supply.

The present application is based on Japanese Patent Application serial No. 2009-265738 filed with the Japan Patent Office on Nov. 20, 2009, the entire contents of which are hereby incorporated by reference.

EXPLANATION OF REFERENCE

100: substrate, 102: protective layer, 104: semiconductor region, 106: element isolation insulating layer, 108a: gate insulating layer, 110a: gate electrode, 112: insulating layer, 114: impurity region, 116: channel formation region, 118: sidewall insulating layer, 120: high-concentration impurity region, 122: metal layer, 124: metal compound region, 126: interlayer insulating layer, 128: interlayer insulating layer, 130a: drain electrode, 130b: drain electrode, 130c: electrode, 132: insulating layer, 134: conductive layer, 136a: electrode, 136b: electrode, 136c: electrode, 136d: gate electrode, 138: gate insulating layer, 140: oxide semiconductor layer, 142a: drain electrode, 142b: drain electrode, 144: protective insulating layer, 146: interlayer insulating layer, 148: conductive layer, 150a: electrode, 150b: electrode, 150c: electrode, 150d: electrode, 150e: electrode, 152: insulating layer, 154a: electrode, 154b: electrode, 15c: electrode, 154d: electrode, 301: main body, 302: housing, 303: display portion, 304: keyboard, 311: main body, 312: stylus, 313: display portion, 314: operation keys, 315: external interface, 320: e-book reader, 321: housing, 323: housing, 325: display portion, 327: display portion, 331: power button, 333: operation keys, 335: speaker, 337: hinge, 340: housing, 341: housing, 342: display panel, 343: speaker, 344: microphone, 345: operation keys, 346: pointing device, 347: camera lens, 348: external connection terminal, 349: solar cell, 350: external memory slot, 361: main body, 363: eyepiece portion, 364: operation switch, 365: display portion B, 366: battery, 367: display portion A, 370: television set, 371: housing, 373: display portion, 375: stand, 377: display portion, 379: operation keys, 380: remote controller, 400: latch circuit, 400a: latch circuit, 400b: latch circuit, 401: data holding portion, 402: transistor, 403: inverter, 404: capacitor, 405: switch, 411: latch portion, 412: first element, 413: second element, 414: wiring, 415: wiring, 420: transistor, 421: transistor, 431: switch, 432: switch, 501: n-channel transistor, 502: n-channel transistor, 503: p-channel transistor, 504: p-channel transistor, 505: p-channel transistor, 506: p-channel transistor.

The invention claimed is:

1. A circuit comprising:
a first portion comprising a first logic gate and a second logic gate, wherein an output of the first logic gate is electrically connected to an input of the second logic gate and an output of the second logic gate is electrically connected to an input of the first logic gate; and
a second portion for holding data of the first portion, the second portion comprising:
a first switch electrically connected to the input of the first logic gate and the output of the second logic gate of the first portion through a first wiring;
a second switch electrically connected to a first terminal of the first switch, the output of the first logic gate, and the input of the second logic gate; and
a capacitor, a first electrode of the capacitor electrically connected to the first terminal of the first switch and a first terminal of the second switch, wherein the second switch includes an oxide semiconductor layer.

2. The circuit according to claim 1, wherein the second portion further comprises an inverter electrically connected to the first switch, the second switch, and the capacitor.

3. The circuit according to claim 1, wherein a second terminal of the first switch is electrically connected to the first wiring.

4. The circuit according to claim 1, wherein a second terminal of the second switch is electrically connected to the output of the first logic gate and the input of the second logic gate through a second wiring.

5. The circuit according to claim 1, wherein the oxide semiconductor layer comprises indium, gallium, and zinc.

6. The circuit according to claim 1, wherein the first logic gate is a first inverter, and the second logic gate is a second inverter.

7. A semiconductor device comprising the circuit according to claim 1 and a display.

8. A circuit comprising:
a first portion comprising a first logic gate and a second logic gate, wherein an output of the first logic gate is electrically connected to an input of the second logic gate and an output of the second logic gate is electrically connected to an input of the first logic gate; and
a second portion for holding data of the first portion, the second portion comprising:
a switch electrically connected to the input of the first logic gate and the output of the second logic gate of the first portion through a first wiring;
a transistor electrically connected to a first terminal of the switch, the output of the first logic gate, and the input of the second logic gate; and
a capacitor, a first electrode of the capacitor electrically connected to the first terminal of the switch and one of a source and a drain of the transistor,
wherein a channel formation region of the transistor includes an oxide semiconductor layer.

9. The circuit according to claim 8, wherein the second portion further comprises an inverter electrically connected to the switch, the transistor, and the capacitor.

10. The circuit according to claim 8, wherein the transistor is configured to hold the data in the capacitor.

11. The circuit according to claim 8, wherein the oxide semiconductor layer comprises indium, gallium, and zinc.

12. The circuit according to claim 8, wherein the first logic gate is a first inverter, and the second logic gate is a second inverter.

13. The circuit according to claim 8, wherein an off-current per 1 μm of a channel width of the transistor is less than or equal to $1 \times 10^{-17}$ A.

14. The circuit according to claim 8,
wherein the other of the source and the drain of the transistor is electrically connected to the output of the first logic gate and the input of the second logic gate through a second wiring.

15. A circuit comprising:
a first portion comprising a first logic gate and a second logic gate, wherein an output of the first logic gate is electrically connected to an input of the second logic gate and an output of the second logic gate is electrically connected to an input of the first logic gate; and
a second portion for holding data of the first portion, the second portion comprising:

a first transistor electrically connected to the input of the first logic gate and the output of the second logic gate of the first portion through a first wiring;

a second transistor electrically connected to one of a source and a drain of the first transistor, the output of the first logic gate, and the input of the second logic gate; and a capacitor, a first electrode of the capacitor electrically connected to the one of the source and the drain of the first transistor and one of a source and a drain of the second transistor, wherein a channel formation region of the second transistor includes an oxide semiconductor layer.

16. The circuit according to claim 15, wherein the second portion further comprises an inverter electrically connected to the first transistor, the second transistor, and the capacitor.

17. The circuit according to claim 15, wherein the second transistor is configured to hold the data in the capacitor.

18. The circuit according to claim 15, wherein the oxide semiconductor layer comprises indium, gallium, and zinc.

19. The circuit according to claim 15, wherein the first logic gate is a first inverter, and the second logic gate is a second inverter.

20. The circuit according to claim 15, wherein the other of the source and the drain of the second transistor is electrically connected to the output of the first logic gate and the input of the second logic gate through a second wiring.

\* \* \* \* \*